US011532570B2

(12) United States Patent
Mizuno et al.

(10) Patent No.: US 11,532,570 B2
(45) Date of Patent: Dec. 20, 2022

(54) THREE-DIMENSIONAL MEMORY DEVICE CONTAINING BRIDGES FOR ENHANCED STRUCTURAL SUPPORT AND METHODS OF FORMING THE SAME

(71) Applicant: SANDISK TECHNOLOGIES LLC, Addison, TX (US)

(72) Inventors: Genta Mizuno, Yokkaichi (JP); Kenzo Iizuka, Yokkaichi (JP); Satoshi Shimizu, Yokkaichi (JP); Keisuke Izumi, Yokkaichi (JP); Tatsuya Hinoue, Yokkaichi (JP); Yujin Terasawa, Yokkaichi (JP); Seiji Shimabukuro, Yokkaichi (JP); Ryousuke Itou, Yokkaichi (JP); Yanli Zhang, San Jose, CA (US); Johann Alsmeier, San Jose, CA (US); Yusuke Yoshida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/174,064

(22) Filed: Feb. 11, 2021

(65) Prior Publication Data
US 2022/0254733 A1 Aug. 11, 2022

(51) Int. Cl.
*H01L 27/11556* (2017.01)
*H01L 23/00* (2006.01)
(Continued)

(52) U.S. Cl.
CPC ........ *H01L 23/562* (2013.01); *H01L 23/5226* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 5,915,167 A | 6/1999 | Leedy |
| 9,543,318 B1 | 1/2017 | Lu et al. |

(Continued)

OTHER PUBLICATIONS

Notification of Transmittal of the International Search Report and the Written Opinion of the International Searching Authority for International Patent Application No. PCT/US2021/037270, dated Nov. 9, 2021, 9 pages.

(Continued)

*Primary Examiner* — Sarah K Salerno
(74) *Attorney, Agent, or Firm* — The Marbury Law Group PLLC

(57) ABSTRACT

A three-dimensional memory device includes a first word-line region including a first alternating stack of first word lines and continuous insulating layers, first memory stack structures vertically extending through the first alternating stack, a second word-line region comprising a second alternating stack of second word lines and the continuous insulating layers, second memory stack structures vertically extending through the second alternating stack, plural dielectric separator structures located between the first word-line region and the second word-line region, and at least one bridge region located between the plural dielectric separator structures and between the between the first word-line region and the second word-line region. The continuous insulating layers extend through the at least one bridge region between the first alternating stack in the first word-line region and the second alternating stack in the second word-line region.

16 Claims, 72 Drawing Sheets

(51) Int. Cl.
*H01L 27/11582* (2017.01)
*H01L 23/522* (2006.01)

(56) References Cited

U.S. PATENT DOCUMENTS

| | | | |
|---|---|---|---|
| 9,679,906 | B2 | 6/2017 | Lu et al. |
| 10,115,681 | B1 | 10/2018 | Ariyoshi |
| 10,672,780 | B1 | 6/2020 | Kawamura et al. |
| 10,861,873 | B2 | 12/2020 | Kim et al. |
| 10,879,264 | B1 | 12/2020 | Otsu et al. |
| 10,903,237 | B1 | 1/2021 | Hosoda et al. |
| 2015/0001460 | A1 | 1/2015 | Kim et al. |
| 2017/0047334 | A1 | 2/2017 | Lu et al. |
| 2018/0261671 | A1 | 9/2018 | Matsumoto et al. |
| 2019/0006418 | A1 | 1/2019 | Sel et al. |
| 2019/0378855 | A1* | 12/2019 | Kim .................. H01L 27/11519 |

OTHER PUBLICATIONS

Yoshida, Y. et al., "Three-Dimensional Memory Device Containing Bridges for Enhanced Structural Support and Methods of Forming the Same," U.S. Appl. No. 17/174,094, filed Feb. 11, 2021.

USPTO Office Communication, Notice of Allowance and Fee(s) Due for U.S. Appl. No. 17/174,094, dated Mar. 7, 2022, 17 pages.

Endoh et al., "Novel Ultra High Density Memory with a Stacked-Surrounding Gate Transistor (S-SGT) Structured Cell," IEDM Proc. (2001) 33-36.

U.S. Appl. No. 16/547,971, filed Aug. 22, 2019, SanDisk Technologies LLC.

U.S. Appl. No. 16/675,459, filed Nov. 6, 2019, SanDisk Technologies LLC.

U.S. Appl. No. 16/782,307, filed Feb. 5, 2020, SanDisk Technologies LLC.

U.S. Appl. No. 16/827,990, filed Mar. 24, 2020, SanDisk Technologies LLC.

U.S. Appl. No. 16/849,600, filed Apr. 15, 2020, SanDisk Technologies LLC.

U.S. Appl. No. 16/849,664, filed Apr. 15, 2020, SanDisk Technologies LLC.

U.S. Appl. No. 16/876,370, filed May 18, 2020, SanDisk Technologies LLC.

U.S. Appl. No. 16/881,346, filed May 22, 2020, SanDisk Technologies LLC.

U.S. Appl. No. 16/881,401, filed May 22, 2020, SanDisk Technologies LLC.

U.S. Appl. No. 16/921,146, filed Jul. 6, 2020, SanDisk Technologies LLC.

U.S. Appl. No. 17/036,070, filed Sep. 29, 2020, SanDisk Technologies LLC.

U.S. Appl. No. 17/039,160, filed Sep. 30, 2020, SanDisk Technologies LLC.

U.S. Appl. No. 17/090,420, filed Nov. 5, 2020, SanDisk Technologies LLC.

U.S. Appl. No. 17/116,093, filed Sep. 30, 2020, SanDisk Technologies LLC.

U.S. Appl. No. 17/134,938, filed Dec. 28, 2020, SanDisk Technologies LLC.

* cited by examiner

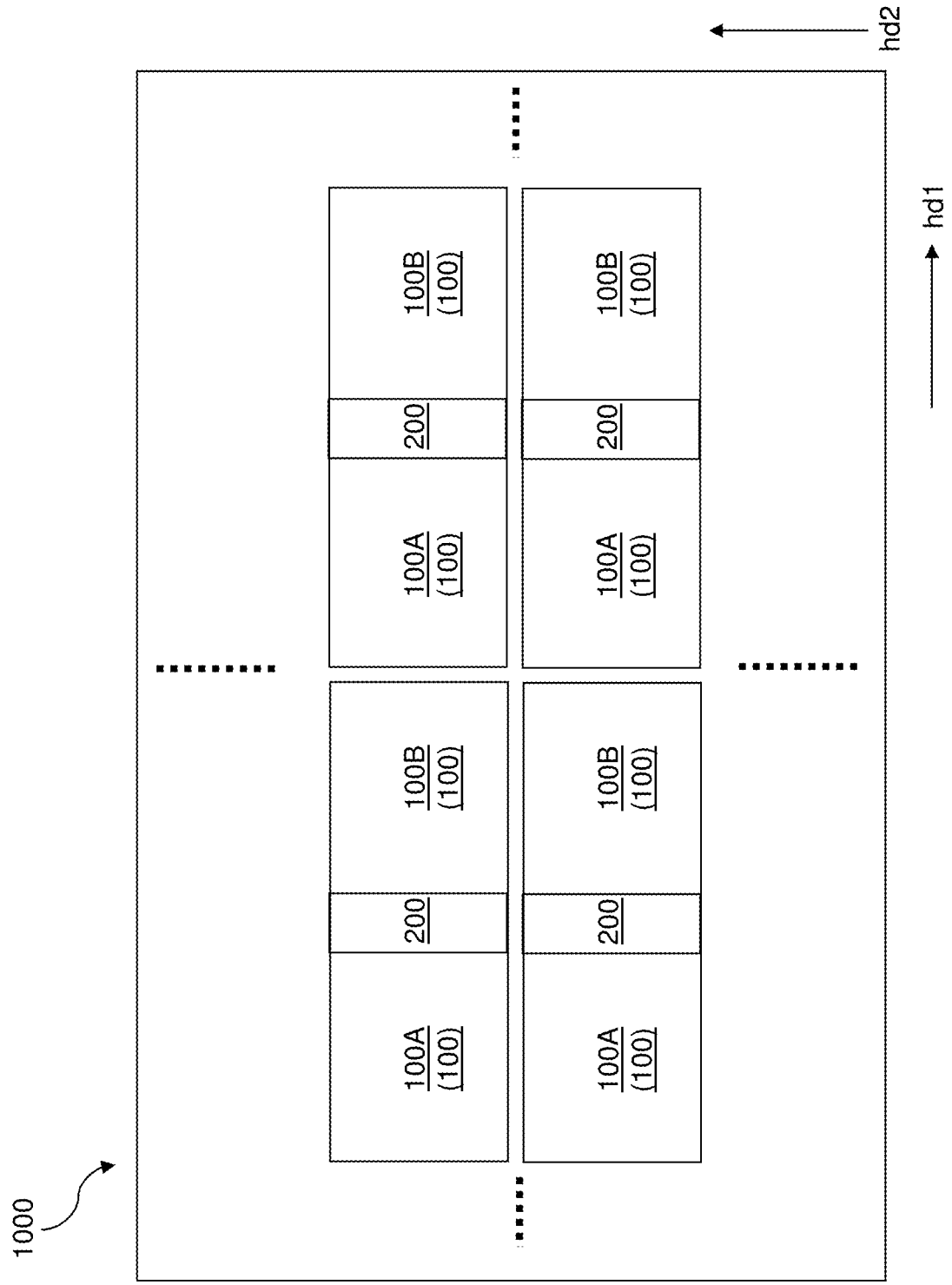

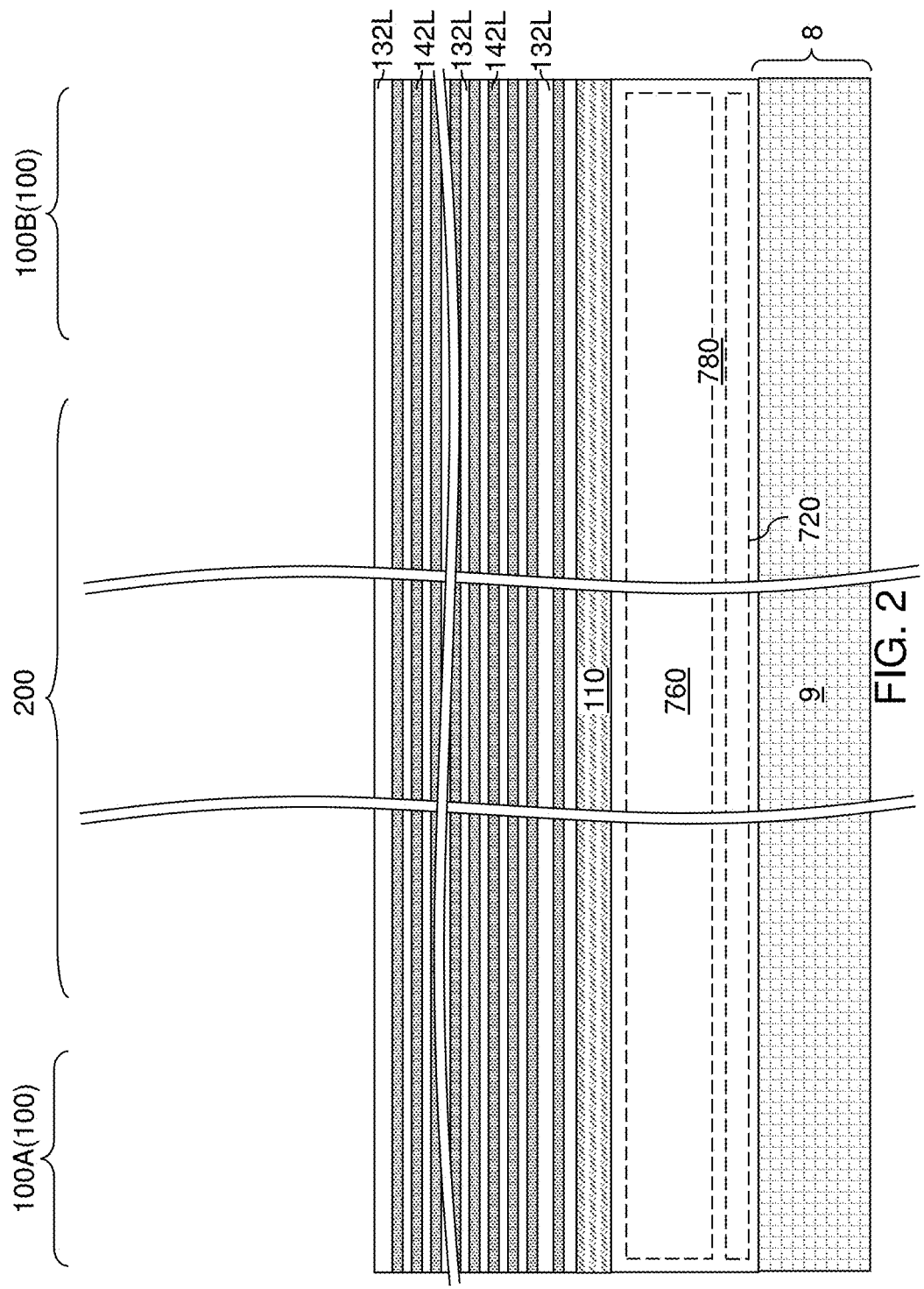

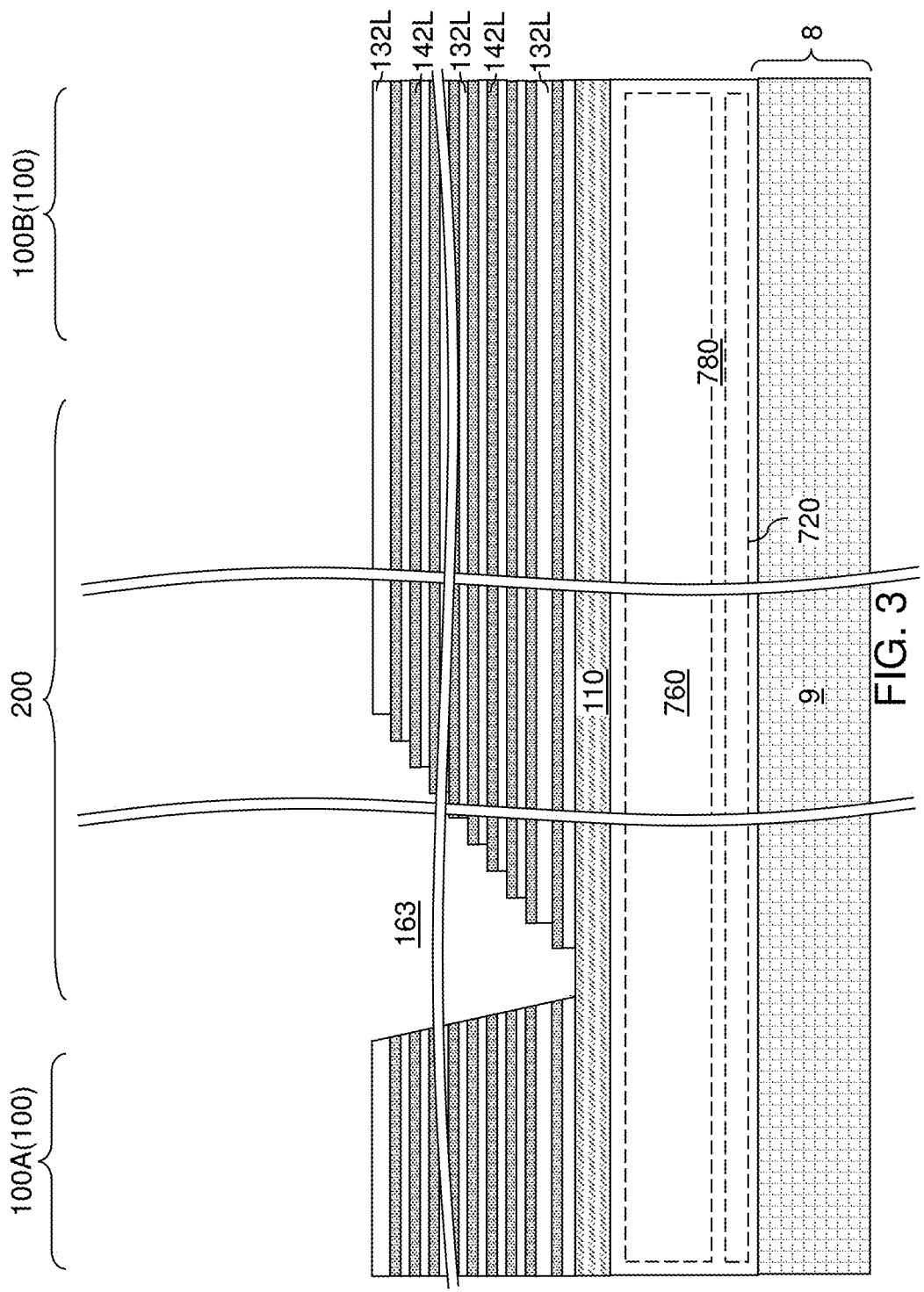

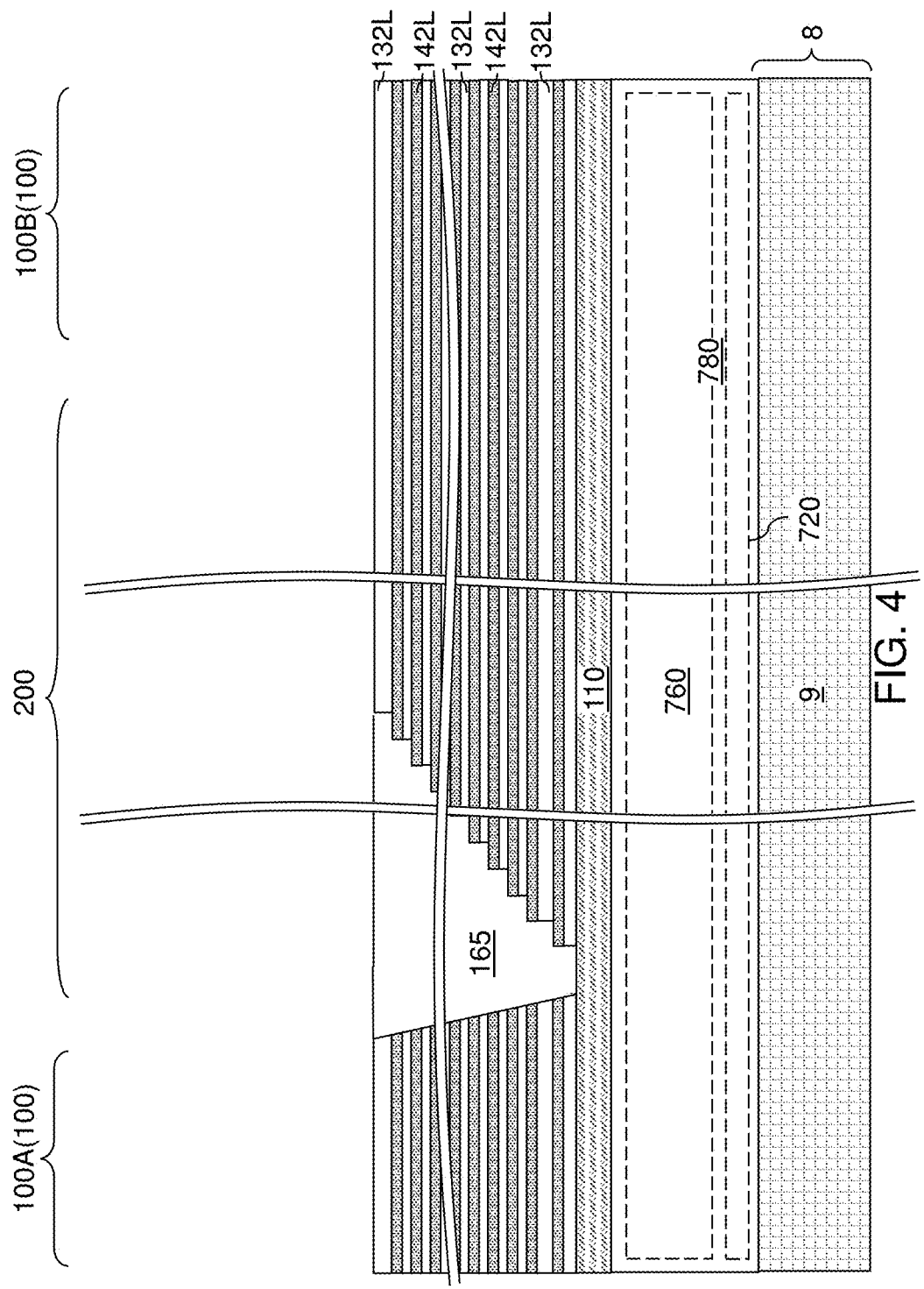

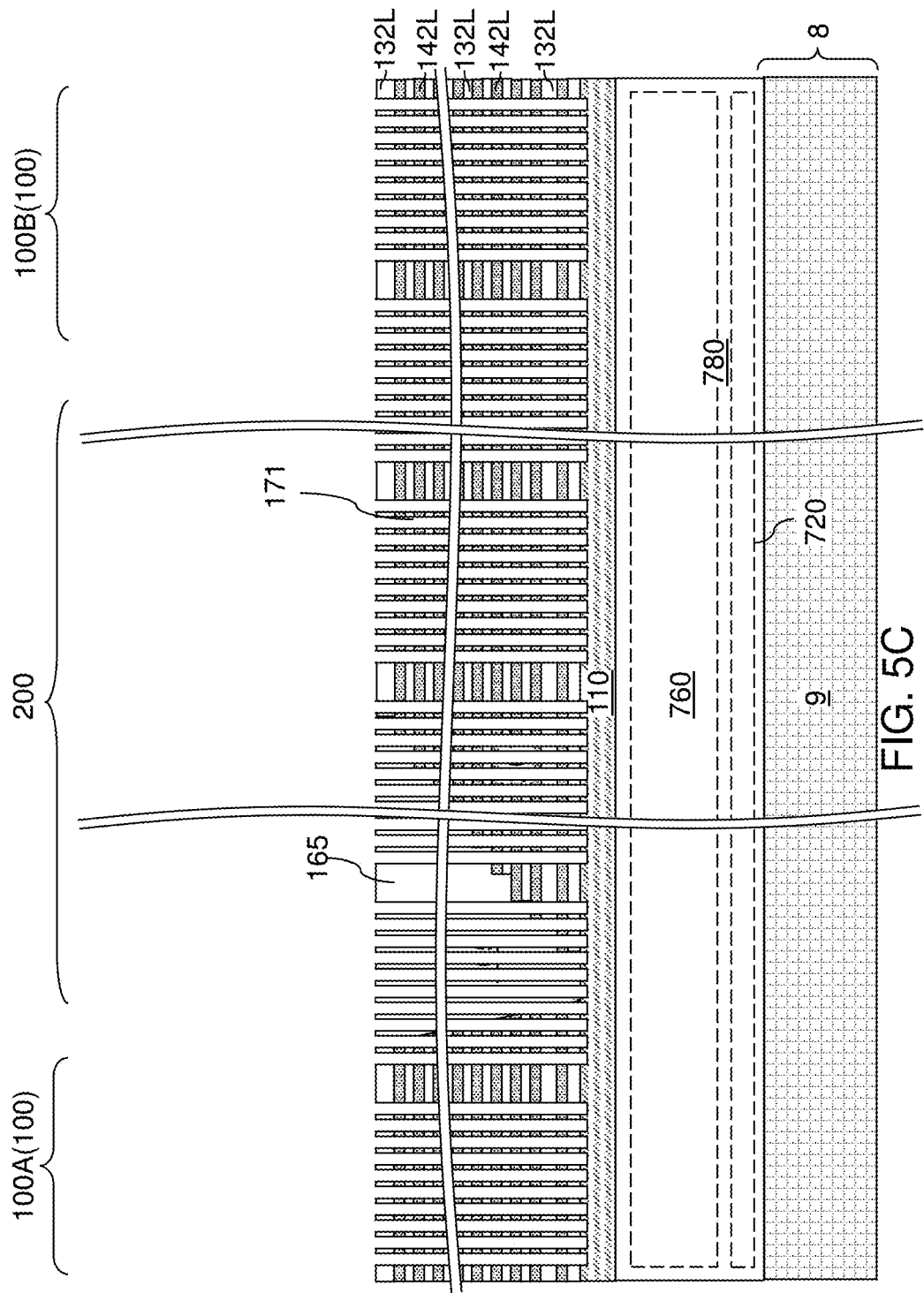

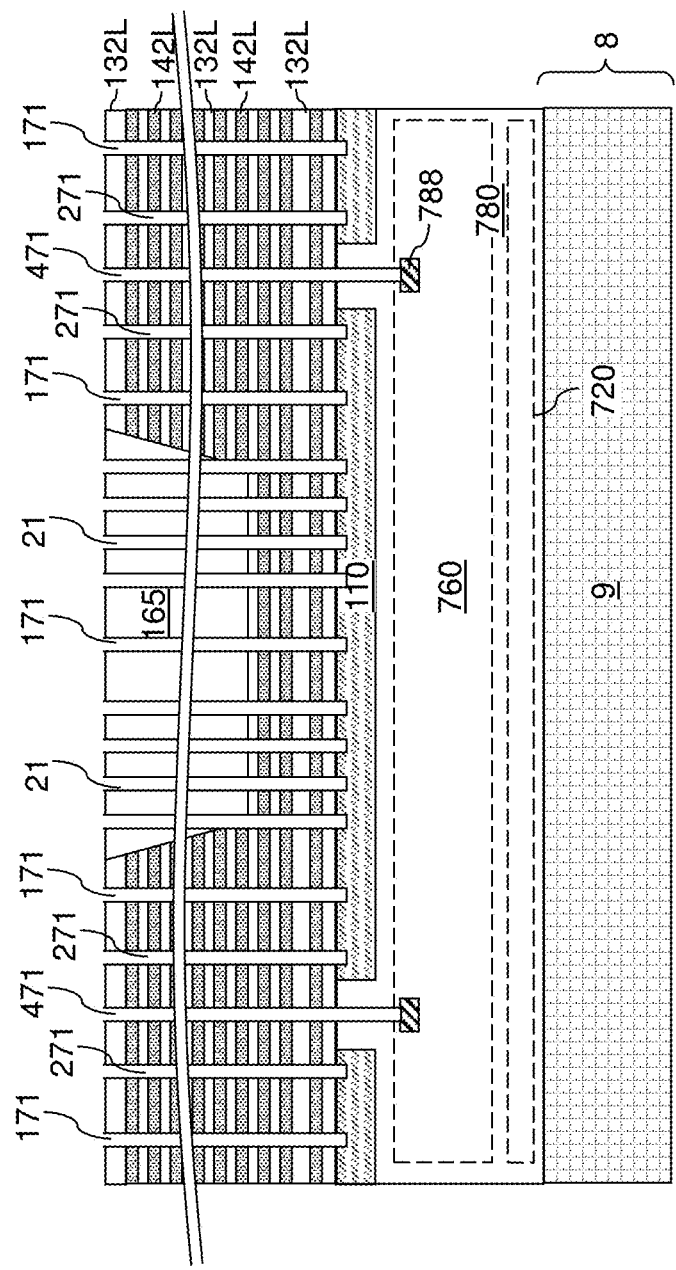

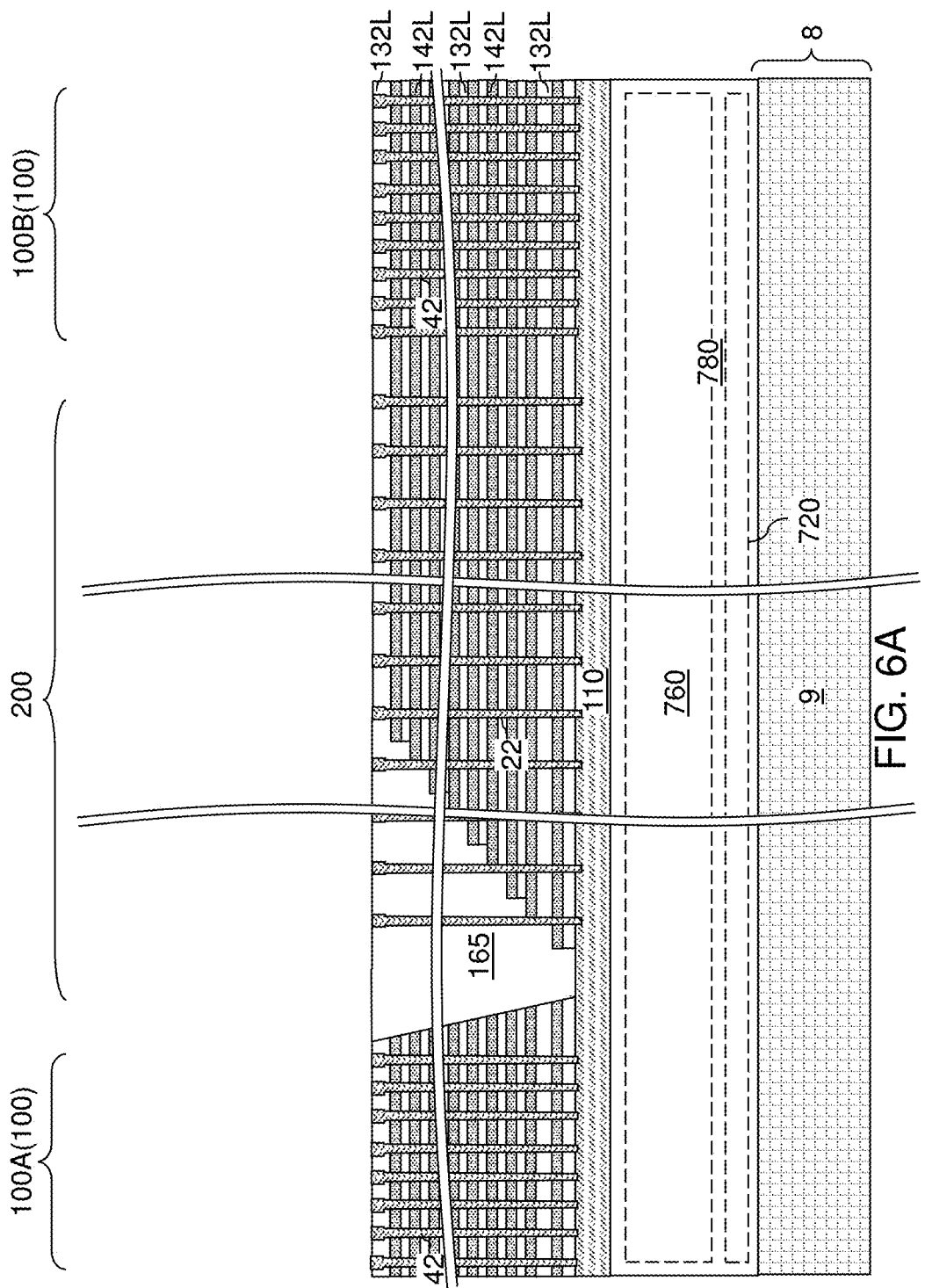

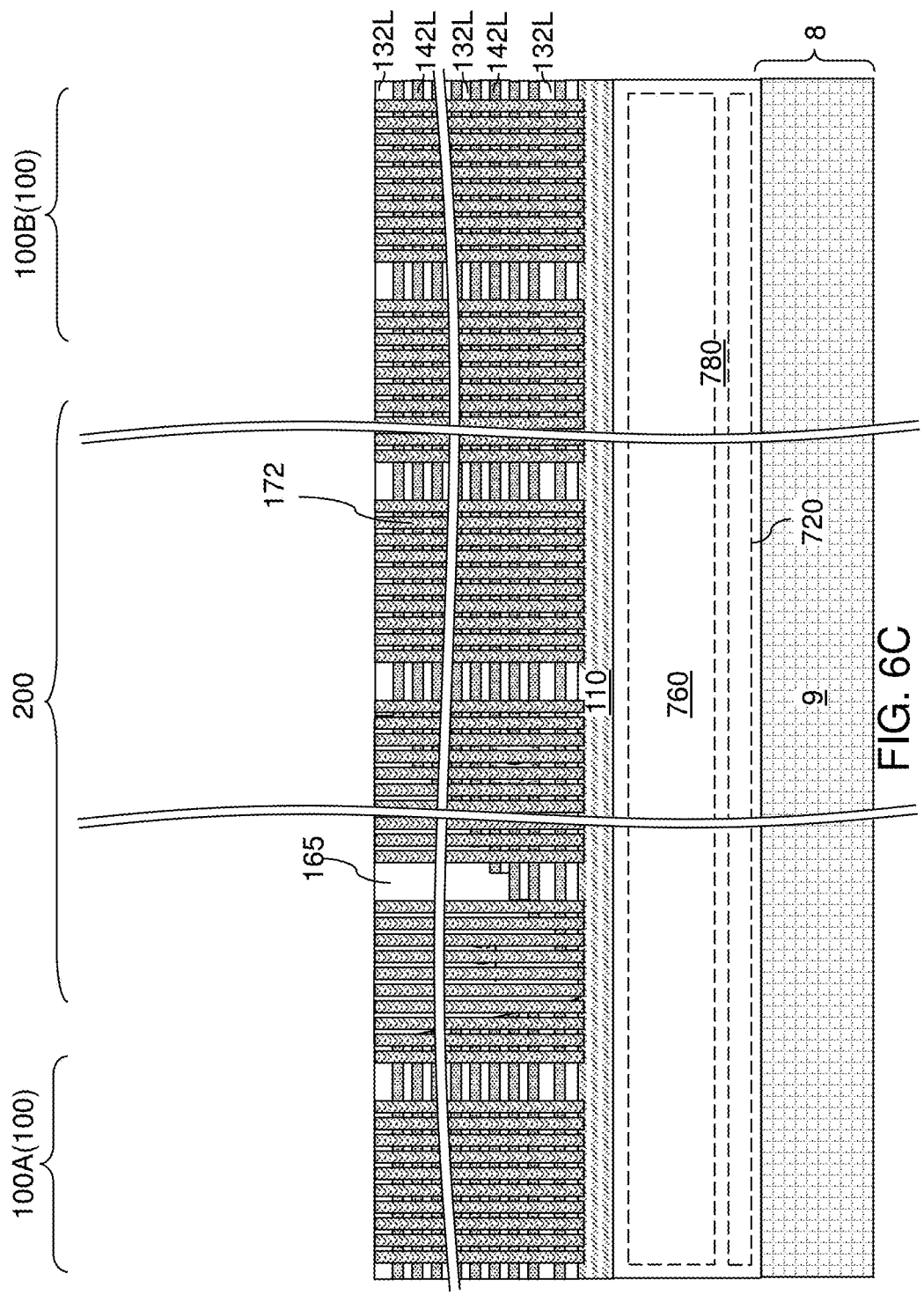

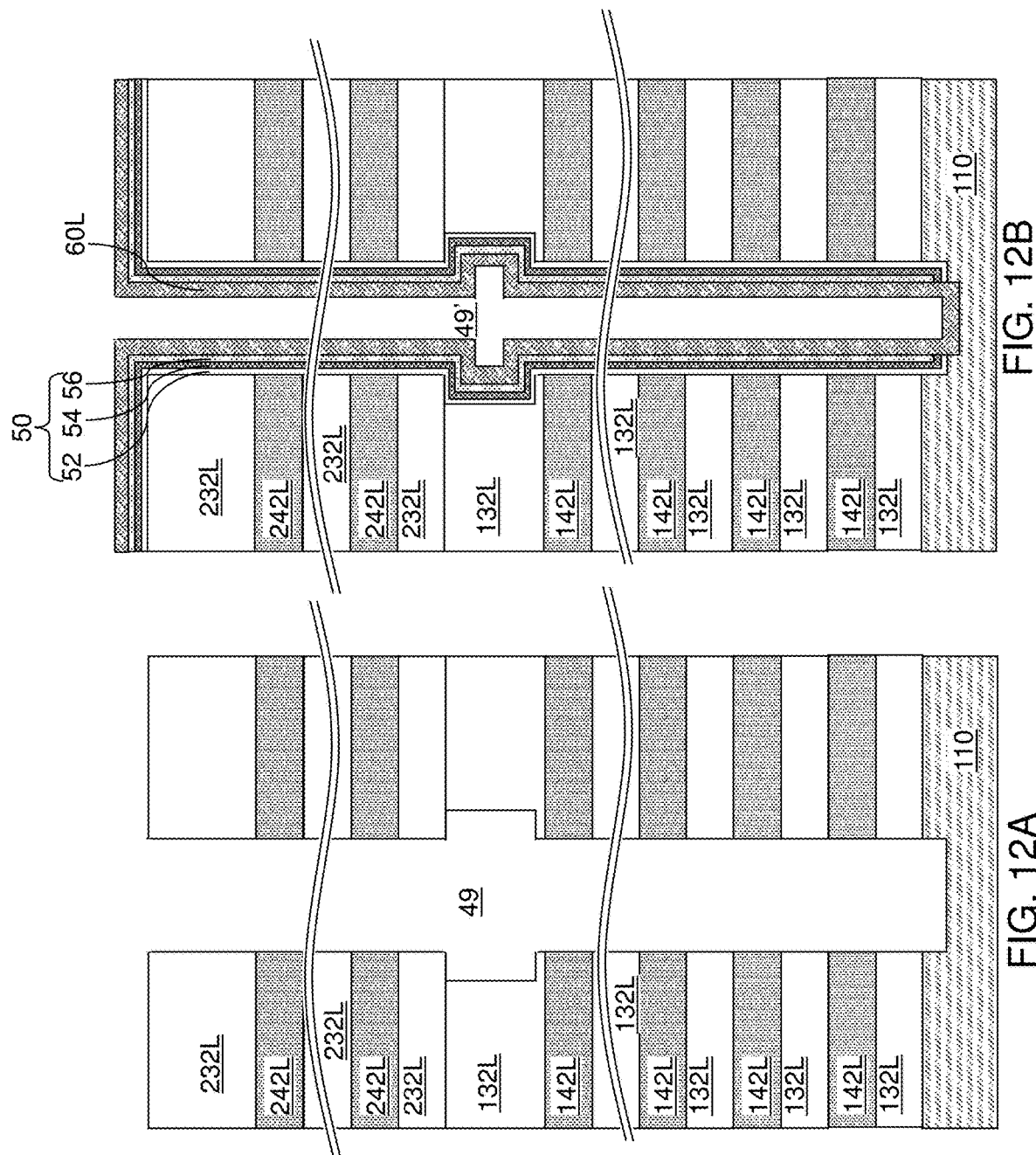

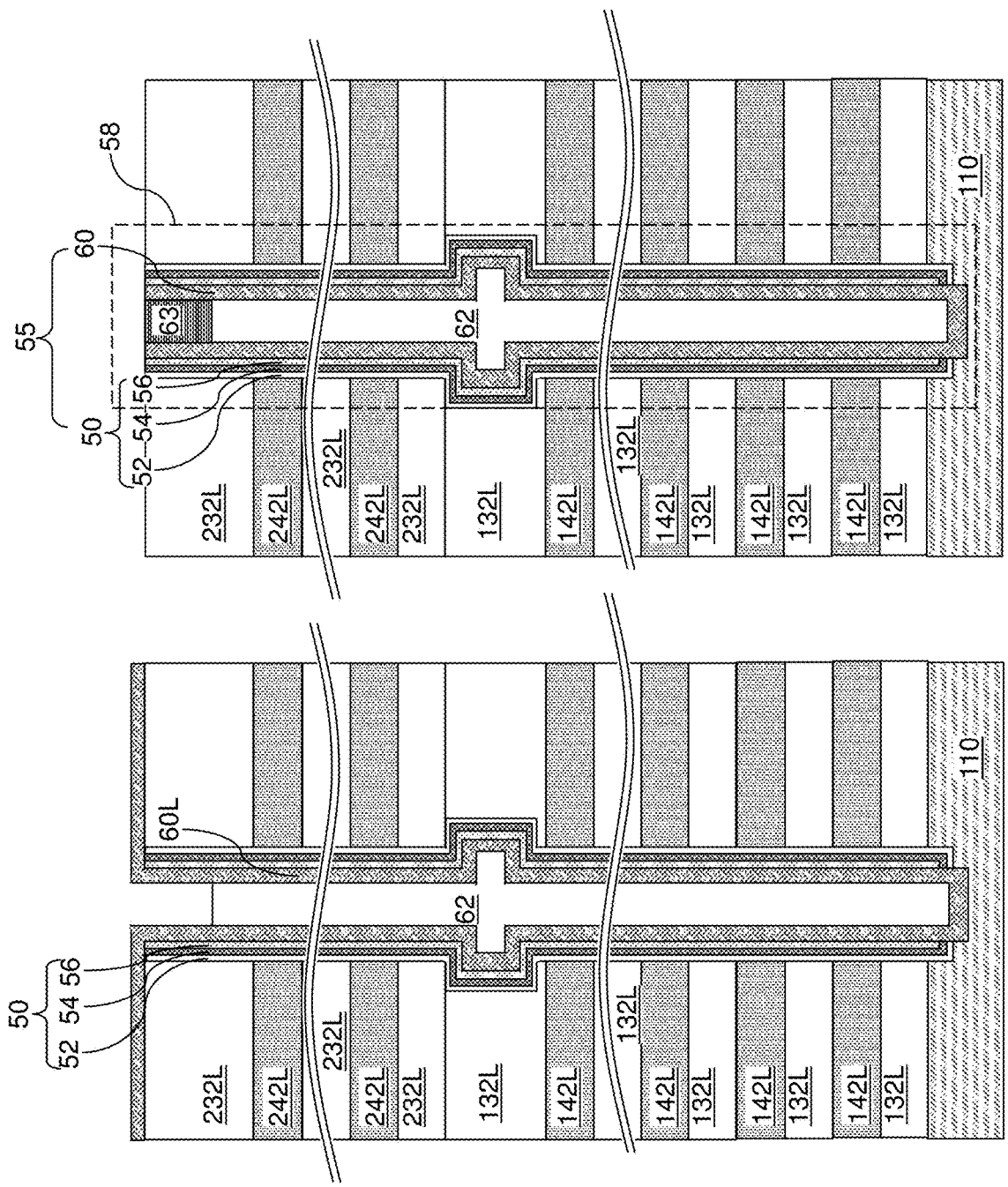

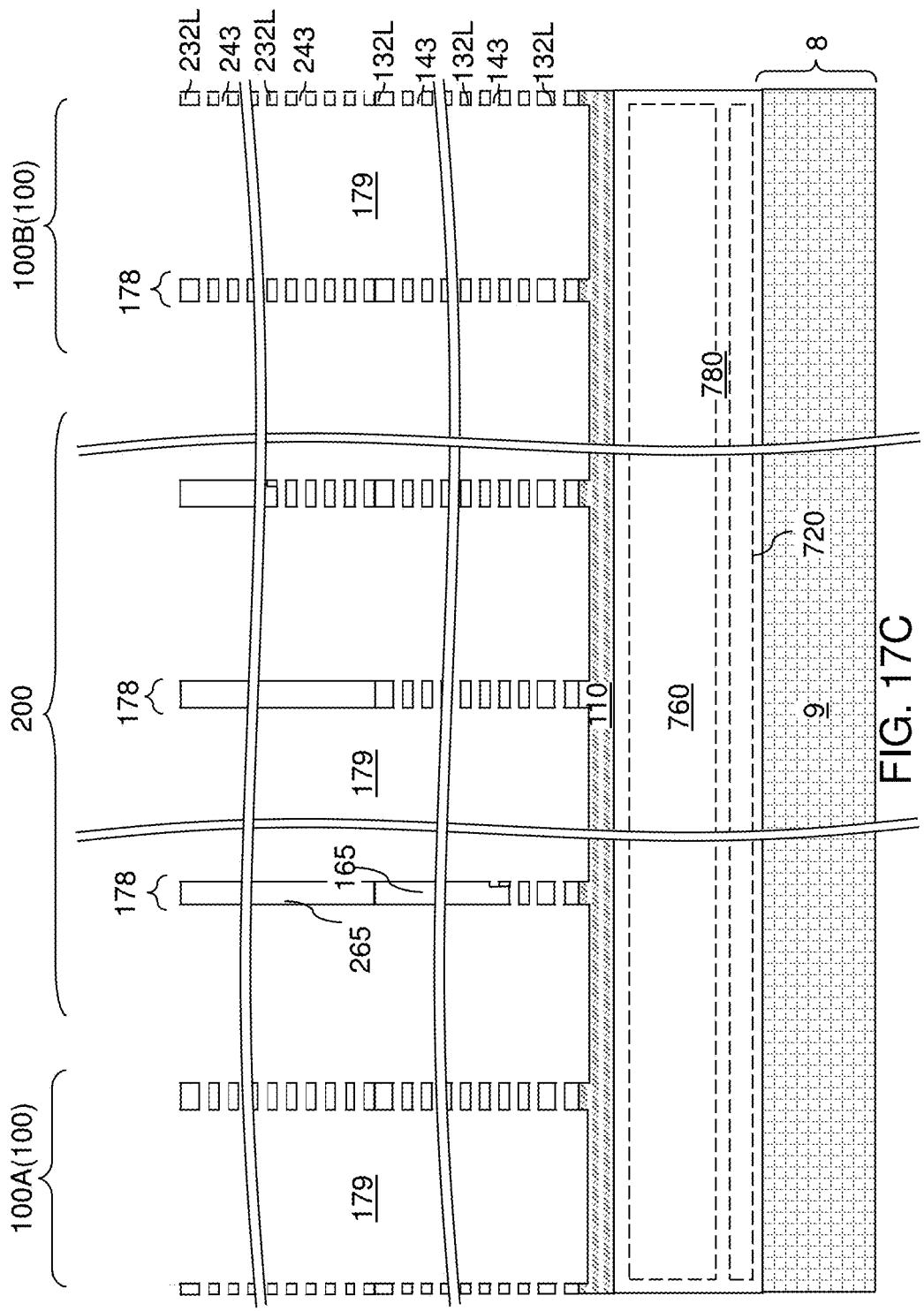

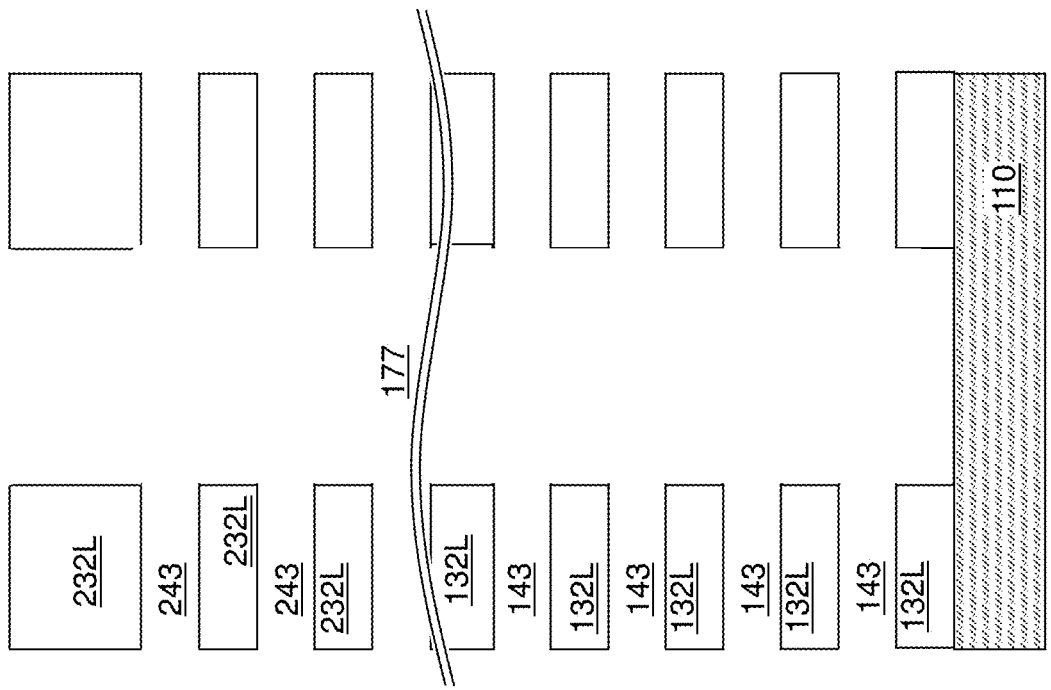
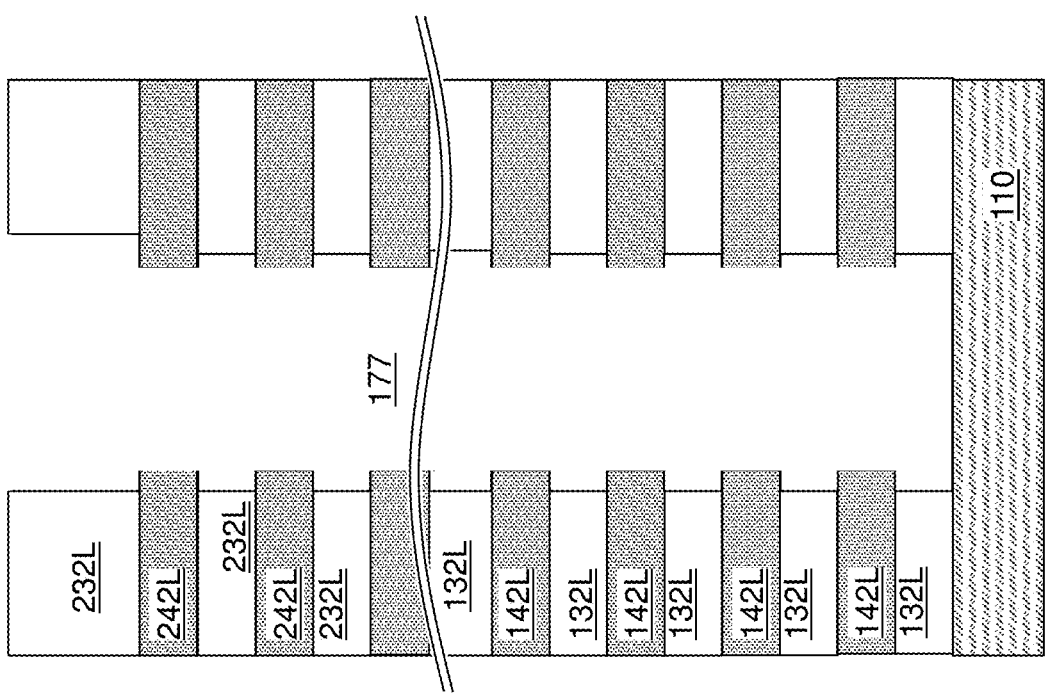

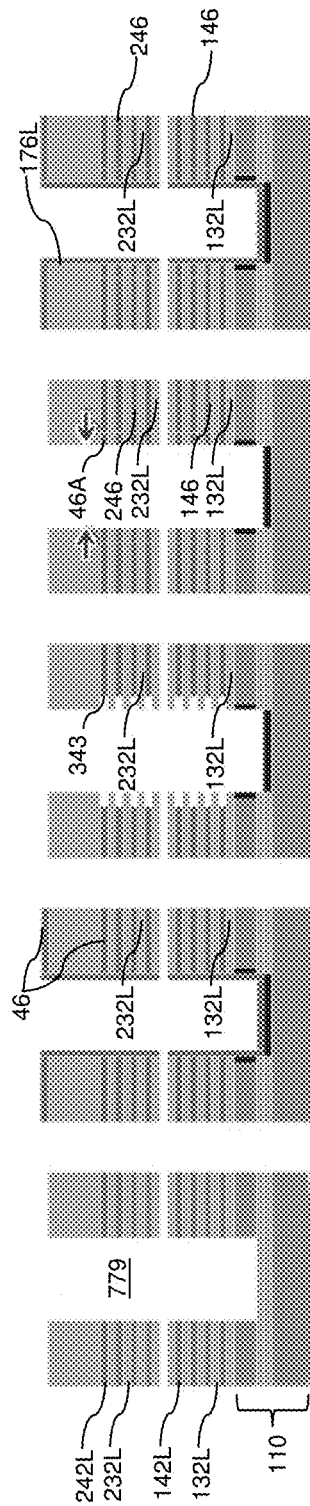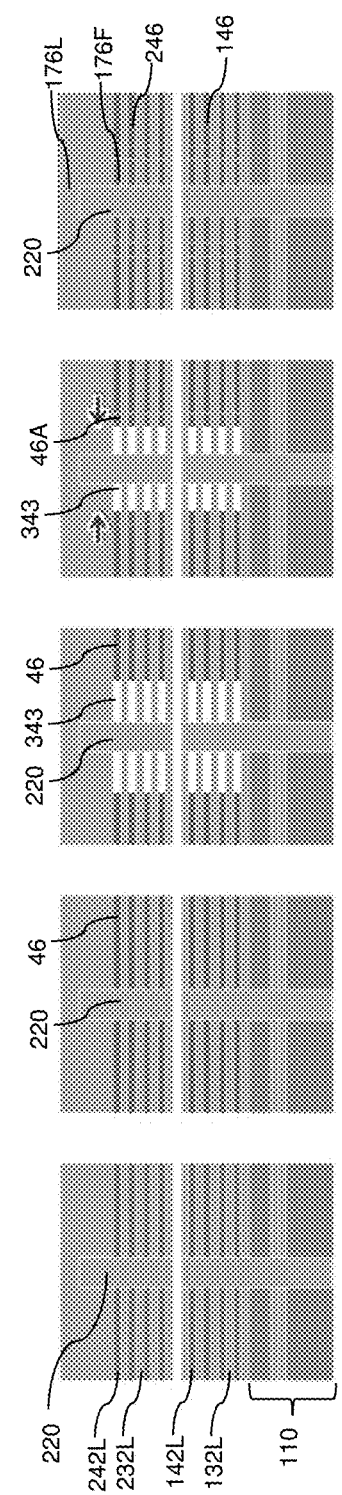

THREE-DIMENSIONAL MEMORY DEVICE CONTAINING BRIDGES FOR ENHANCED STRUCTURAL SUPPORT AND METHODS OF FORMING THE SAME

FIELD

The present disclosure relates generally to the field of semiconductor devices, and particularly to three-dimensional memory devices containing bridges which provide enhanced structural support for preventing stack collapse during a replacement process and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device includes a first word-line region including a first alternating stack of first word lines and continuous insulating layers, first memory stack structures vertically extending through the first alternating stack, a second word-line region comprising a second alternating stack of second word lines and the continuous insulating layers, second memory stack structures vertically extending through the second alternating stack, plural dielectric separator structures located between the first word-line region and the second word-line region, and at least one bridge region located between the plural dielectric separator structures and between the between the first word-line region and the second word-line region. The continuous insulating layers extend through the at least one bridge region between the first alternating stack in the first word-line region and the second alternating stack in the second word-line region.

According to another aspect of the present disclosure, a dielectric pillar structure may extend through the at least one bridge region.

According to another aspect of the present disclosure, a method of forming a memory device comprises forming a vertically alternating sequence of unit layer stacks over a substrate, wherein each of the unit layer stacks comprises a continuous insulating layer and a continuous sacrificial material layer, forming openings through the vertically alternating sequence, wherein the openings comprise discrete backside openings that are arranged in rows extending along a first horizontal direction and memory openings located between rows of the discrete backside openings, forming memory opening fill structures in the memory openings, laterally expanding and merging the discrete backside openings at least a at levels of the continuous insulating layers to form a plurality of backside trenches that are laterally spaced apart along the first horizontal direction by at least one bridge region, forming backside recesses by introducing into the backside trenches an etchant that etches the continuous sacrificial material layers selective to the continuous insulating layers, and depositing at least one electrically conductive material in the backside recesses to form electrically conductive layers in the backside recesses.

According to another aspect of the present disclosure, a method of forming a memory device comprises forming a vertically alternating sequence of unit layer stacks over a substrate, wherein each of the unit layer stacks comprises a continuous insulating layer and a continuous sacrificial material layer, forming openings through the vertically alternating sequence, wherein the openings comprise laterally alternating sequences of backside trenches and backside openings extending through bridge regions that are arranged in rows extending along a first horizontal direction, and the openings further comprise memory openings located between a respective neighboring pair of the laterally alternating sequences, forming dielectric pillar structures in the backside openings, forming memory opening fill structures in the memory openings, forming backside recesses by introducing into the backside trenches an etchant that etches the continuous sacrificial material layers selective to the continuous insulating layers, depositing at least one electrically conductive material in the backside recesses, and laterally recessing the at least one electrically conductive material around the backside trenches by performing a lateral recess etch process, wherein remaining portions of the at least one electrically conductive material comprise electrically conductive layers.

BRIEF DESCRIPTION OF THE DRAWINGS

FIG. 1 is a plan view of an exemplary semiconductor die including multiple three-dimensional memory array regions according to the first embodiment of the present disclosure.

FIG. 2 is a vertical cross-sectional view of a first exemplary structure after formation of optional semiconductor devices, optional lower level dielectric layers, optional lower metal interconnect structures, a semiconductor material layer, and a first vertically alternating sequence of first continuous insulating layers and first continuous sacrificial material layers according to the first embodiment of the present disclosure.

FIG. 3 is a vertical cross-sectional view of the first exemplary structure after formation of first stepped surfaces in the inter-array region according to the first embodiment of the present disclosure.

FIG. 4 is a vertical cross-sectional view of the first exemplary structure after formation of first-tier retro-stepped dielectric material portions according to the first embodiment of the present disclosure.

FIG. 5C is a vertical cross-sectional view of the first exemplary structure along the vertical plane C-C' of FIG. 5B.

FIG. 5D is a vertical cross-sectional view of the first exemplary structure along the vertical plane D-D' of FIG. 5B.

FIG. 6A is a vertical cross-sectional view of the first exemplary structure after formation of sacrificial first-tier opening fill structures according to the first embodiment of the present disclosure.

FIG. 6C is a vertical cross-sectional view of the first exemplary structure along the vertical plane C-C' of FIG. 6B.

FIGS. 12A-12D illustrate sequential vertical cross-sectional views of a memory opening during formation of a memory opening fill structure according to the first embodiment of the present disclosure.

FIG. 17C is a vertical cross-sectional view of the first exemplary structure along the vertical plane C-C' of FIG. 17B.

FIGS. 26A and 26B are vertical cross-sectional views of a third exemplary structure during the steps of forming the third exemplary structure according to the third embodiment of the present disclosure.

FIGS. 30A, 31A, 32A, 33A and 34A are vertical cross-sectional views of the fourth exemplary structure along the vertical plane A-A' of FIG. 29 during the steps of forming the fourth exemplary structure according to the fourth embodiment of the present disclosure.

FIGS. 30B, 31B, 32B, 33B and 34B are vertical cross-sectional views of the fourth exemplary structure along the vertical plane B-B' of FIG. 29 during the steps shown in respective FIGS. 30A, 31A, 32A, 33A and 34A of forming the fourth exemplary structure according to the fourth embodiment of the present disclosure.

DETAILED DESCRIPTION

Figure 5A:
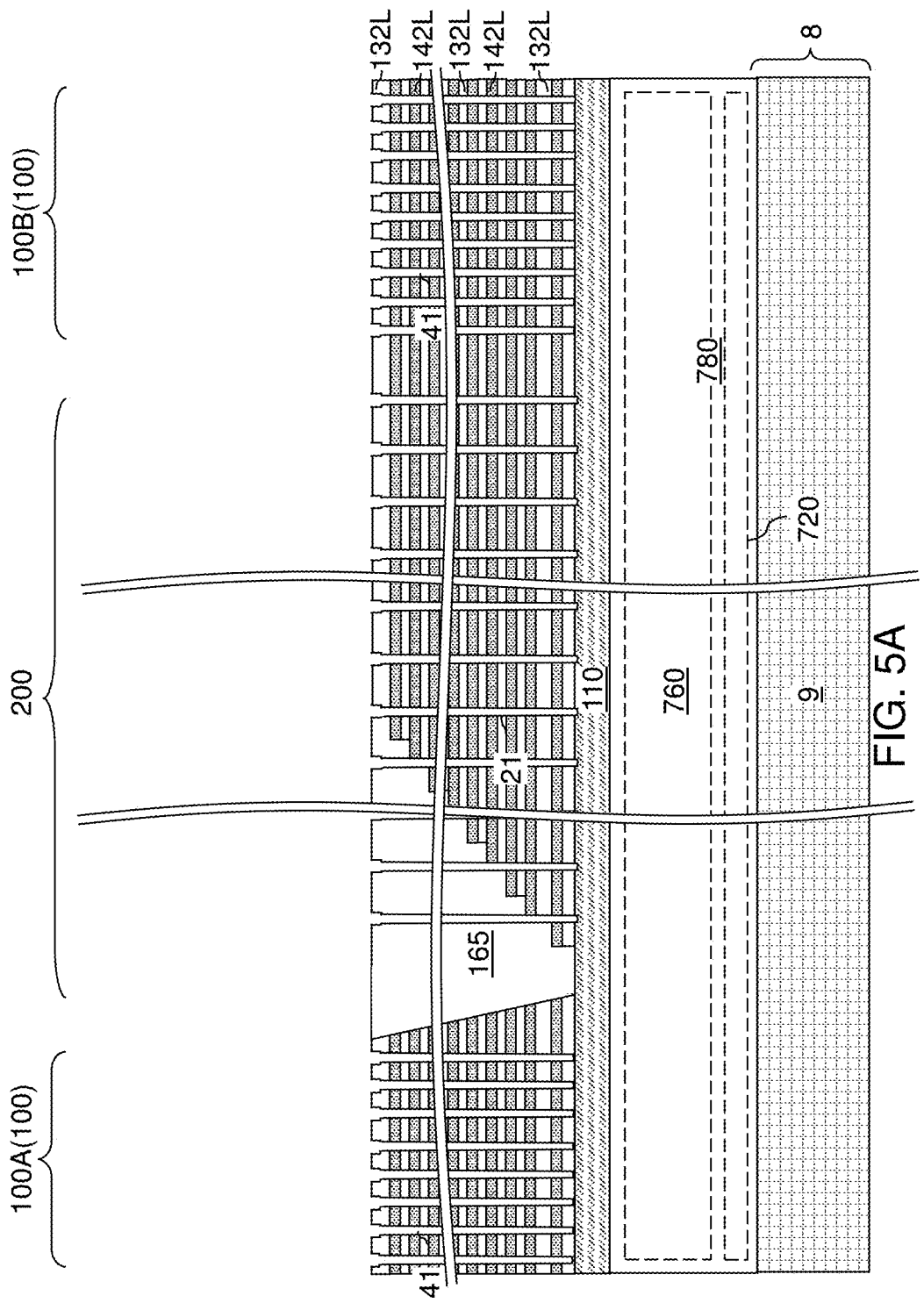
FIG. 5A is a vertical cross-sectional view of the first exemplary structure after formation of first-tier openings according to the first embodiment of the present disclosure.
Figure 5B:
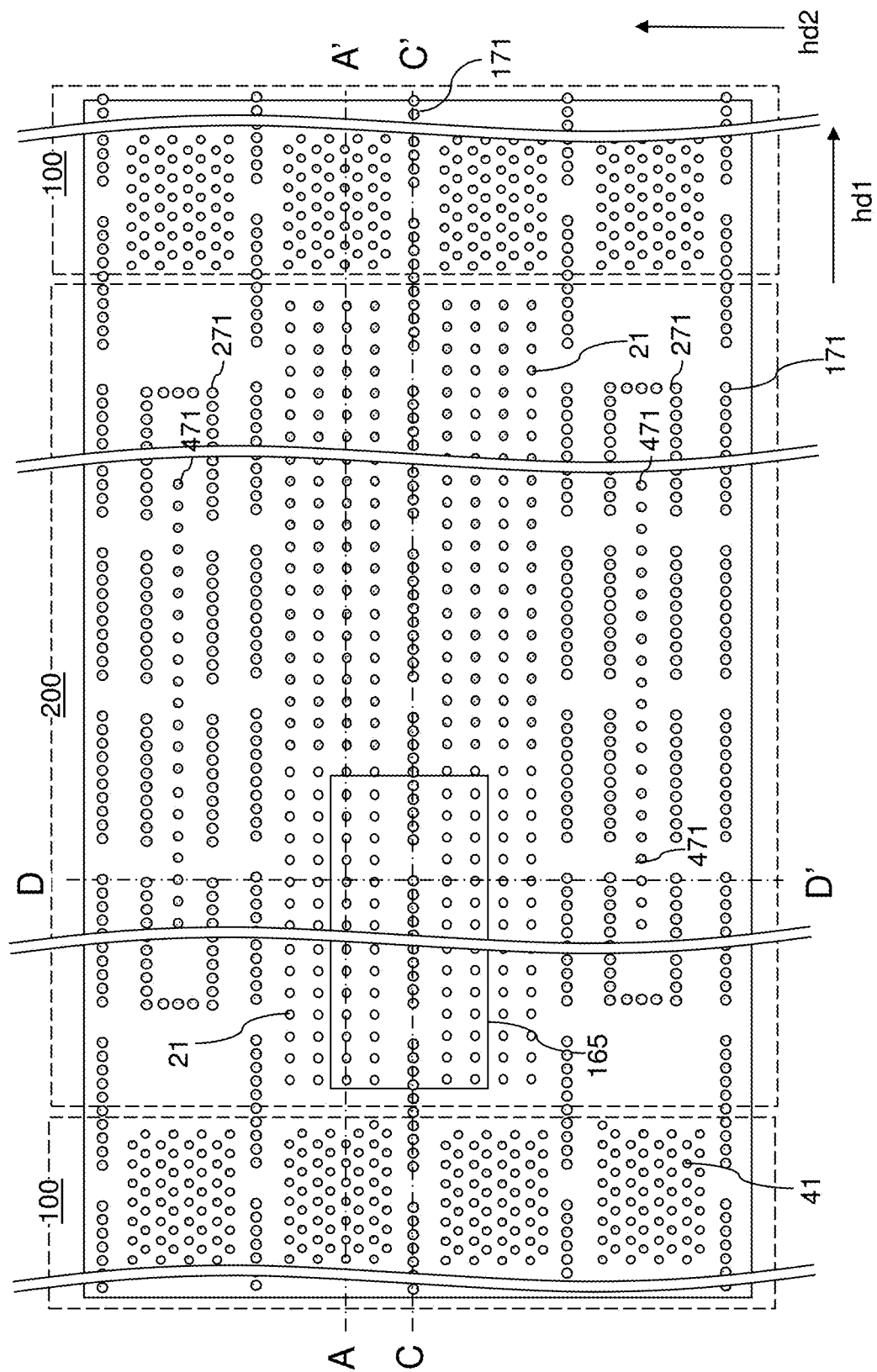
FIG. 5B is a top-down view of the first exemplary structure of FIG. 5A. The vertical plane A-A' is the plane of the vertical cross-sectional view of FIG. 5A.
Figure 6B:
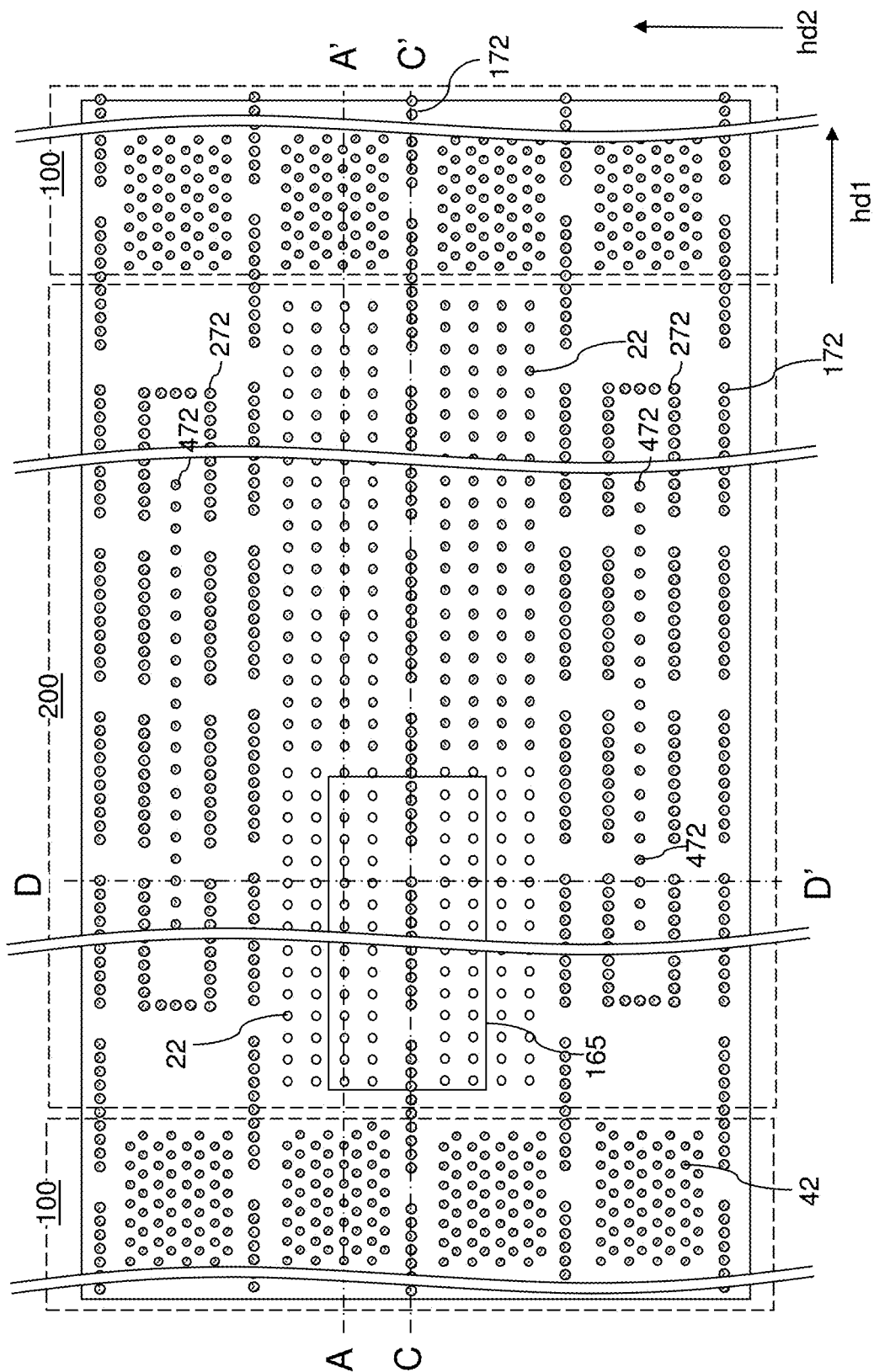
FIG. 6B is a top-down view of the first exemplary structure of FIG. 6A. The vertical plane A-A' is the plane of the vertical cross-sectional view of FIG. 6A.
Figure 6D:
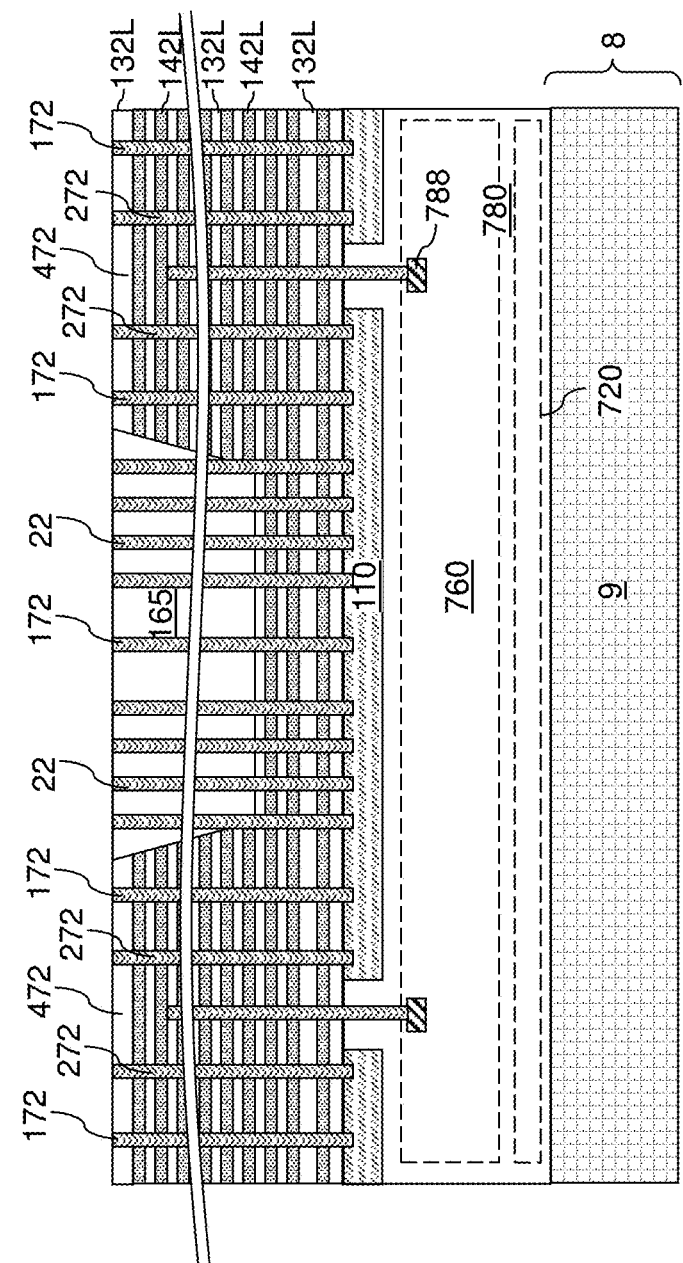
FIG. 6D is a vertical cross-sectional view of the first exemplary structure along the vertical plane D-D' of FIG. 6B.

As discussed above, the embodiments of the present disclosure are directed to three-dimensional memory devices containing bridges which provide enhanced structural support for preventing stack collapse during a replacement process and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary semiconductor die 1000 including multiple three-dimensional memory array regions and multiple inter-array regions is illustrated. The exemplary semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Referring to FIG. 2, a first exemplary structure for formation of the exemplary semiconductor die 1000 is illustrated in a vertical cross sectional view. Semiconductor devices 720 can be formed on a substrate semiconductor layer 9, which is provided at least within an upper portion of a substrate 8. Lower level dielectric layers 760 embedding lower-level metal interconnect structures 780 (schematically represented by a dotted area) can be formed over the substrate semiconductor layer 9. A semiconductor material layer 110 and a first vertically alternating sequence of first continuous insulating layers 132L and first continuous sacrificial material layers 142L can be formed thereabove.

The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Referring to FIG. 3, first stepped surfaces can be formed within the inter-array region 200 simultaneously. A hard mask layer (not shown) such as a metallic or dielectric mask material layer can be formed over the first vertically alternating sequence, and can be patterned to form multiple rectangular openings. The areas of openings within the hard mask layer correspond to areas in which first stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd2, and may be alternately staggered along the first horizontal direction hd1. Thus, upon sequentially numbering the rectangular openings along the second horizontal direction hd2, every odd-numbered rectangular openings through the hard mask layer can be formed as a first one-dimensional array arranged along the second horizontal direction hd2 aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the first vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective first stepped surfaces that is most proximal to one of the memory array regions 100.

The first stepped surfaces can be formed within the rectangular openings in the hard mask layer by iteratively performing a set of layer patterning processing steps as many times as the total number of first continuous sacrificial material layers 142L within the first vertically alternating sequence less 1. The set of layer patterning processing steps comprises an anisotropic etch process that etches unmasked portions of a pair of a first continuous insulating layer 132L and a first continuous sacrificial material layer 142L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the first vertically alternating sequence (132L, 142L), for example, by an isotropic etch process (such as a wet etch process).

A first stepped cavity 163 can be formed within each area of the rectangular opening in the hard mask layer. Each first stepped cavity 163 can include a cliff region in which a tapered sidewall of the first vertically alternating sequence vertically extends from the bottommost layer of the first vertically alternating sequence (132L, 142L) to the topmost layer of the first vertically alternating sequence (132L, 142L). Each first stepped cavity 163 has respective first stepped surfaces as stepped bottom surfaces. Each first stepped cavity 163 has a pair of stepped sidewalls that laterally extend along the first horizontal direction hd1. Each stepped sidewall of the first stepped cavity adjoins the first stepped surfaces at the bottom edge, and extends to the top surface of the topmost layer of the first vertically alternating sequence (132L, 142L).

The array of first staircase regions can be arranged along the second horizontal direction hd2 with an alternating lateral offsets along the first horizontal direction hd1 to provide a staggered configuration for the first staircase regions. In other words, upon sequentially numerically labeling the first staircase regions with positive integers starting with 1 along the second horizontal direction hd2, every odd-numbered first staircase region may be closer to the first memory array region 100A than to the second memory array region 100B, and every even-numbered first staircase region may be closer to the second memory array region 100B than to the first memory array region 100A.

Referring to FIG. 4, a first dielectric fill material (such as undoped silicate glass (i.e., silicon oxide) or a doped silicate glass) can be deposited in each first stepped cavity 163. The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first stepped cavity constitutes a first-tier retro-stepped dielectric material portion 165.

Referring to FIGS. 5A-5D, various first-tier openings may be formed through the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently, i.e., during the first isotropic etch process.

The various first-tier openings may include first-tier memory openings 41 formed in the memory array regions 100, first-tier support openings 21 formed in the inter-array region 200 as clusters, first-tier backside openings 171 that are formed in rows that are arranged along the first horizontal direction (e.g., word line direction) hd1, first-tier moat-region openings 271, and first-tier connection openings 471. Each cluster of first-tier memory openings 41 may be formed as a two-dimensional array of first-tier memory openings 41. The first-tier support openings 21 are openings that are formed in the inter-array region 200, and are subsequently employed to form support pillar structures. A subset of the first-tier support openings 21 may be formed through a respective horizontal surface of the first stepped surfaces. First-tier backside openings 171 within each row of first-tier backside openings 171 can be arranged along the first horizontal direction hd1 between neighboring clusters of first-tier memory openings 41. In one embodiment, each row of first-tier backside openings 171 can laterally extend from a distal end of a first memory array region 100A, through an inter-array region 200, and to a distal end of a second memory array region 100B. The first-tier moat-region openings 271 can be formed in the inter-array region 200 in a manner that at least partially surrounds a respective area. The first-tier moat-region openings 271 may, or may not, vertically extend through a retro-stepped dielectric material portion 165. The first-tier connection openings 471 are formed within a respective area that is at least partially laterally surrounded by a respective set of first-tier moat-region openings 271. In one embodiment, the first-tier connection openings 471 can be formed within a respective area of openings through the semiconductor material layer 110, and can vertically extend down to a top surface of a respective one of landing-pad-level metal interconnect structures 788, which are a subset of the lower-level metal interconnect structures 780 embedded within the lower-level dielectric material layers 760. Optionally, an etch stop layer (not shown) may be located above the semiconductor material layer 110 to prevent over etching the first-tier backside openings 171 too far into the semiconductor material layer 110.

In one embodiment, the first-tier memory openings 41, the first-tier support openings 21, the first-tier backside openings 171, the first-tier moat-region openings 271, and the first-tier connection openings 471 can have a respective circular or elliptical horizontal cross-sectional shape. Alternatively, the first-tier backside openings 171 can have a respective rectangular or rounded rectangular horizontal cross-sectional shape. The maximum lateral dimension (such as a diameter or a major axis) of each of the first-tier memory openings 41, the first-tier support openings 21, the first-tier backside openings 171, the first-tier moat-region openings 271, and the first-tier connection openings 471 may be in a range from 30 nm to 300 nm, such as from 60 nm to 150 nm, although lesser and greater dimensions may also be employed. The nearest-neighbor distance within a row of first-tier backside openings 171 can be in a range from 10% to 200%, such as from 20% to 100% of the maximum lateral dimension (such as a diameter) of each first-tier backside opening 171. Optionally, the first-tier backside opening 171 may have a larger maximum lateral dimension than the first-tier memory openings 41 and the first-tier support openings 21.

Generally, the first-tier backside openings 171 can be arranged in rows extending along the first horizontal direction hd1, and the first-tier memory openings 41 are located between rows of the discrete first-tier backside openings 171. The first-tier memory openings 41, the first-tier support openings 21, and the discrete first-tier backside openings 171, the first-tier moat-region openings 271, and the first-tier connection openings 471 may be formed simultaneously by anisotropically etching unmasked portions of the first vertically alternating sequence (132L, 142L).

Referring to FIGS. 6A-6D, a sacrificial first-tier fill material is deposited concurrently deposited in each of the first-tier openings (41, 21, 171, 271, 471). The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be deposited by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be deposited by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial first-tier fill material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch process, chemical mechanical planarization (CMP), or a combination thereof. The top surface of the topmost first continuous insulating layer 132L may be used as an etch stop layer or a planarization stop layer.

Portions of the sacrificial first-tier fill material that remain in the first-tier memory openings 41 comprise sacrificial first-tier memory opening fill structures 42. Portions of the sacrificial first-tier fill material that remain in the first-tier support openings 21 comprise sacrificial first-tier support opening fill structures 22. Portions of the sacrificial first-tier fill material that remain in the discrete first-tier backside openings 171 comprise sacrificial first-tier backside opening fill structures 172. Portions of the sacrificial first-tier fill material that remain in the first-tier moat-region openings 271 comprise sacrificial first-tier moat opening fill structures 272. Portions of the sacrificial first-tier fill material that remain in the first-tier connection openings 471 comprise sacrificial first-tier connection opening fill structures 472.

Figure 7:
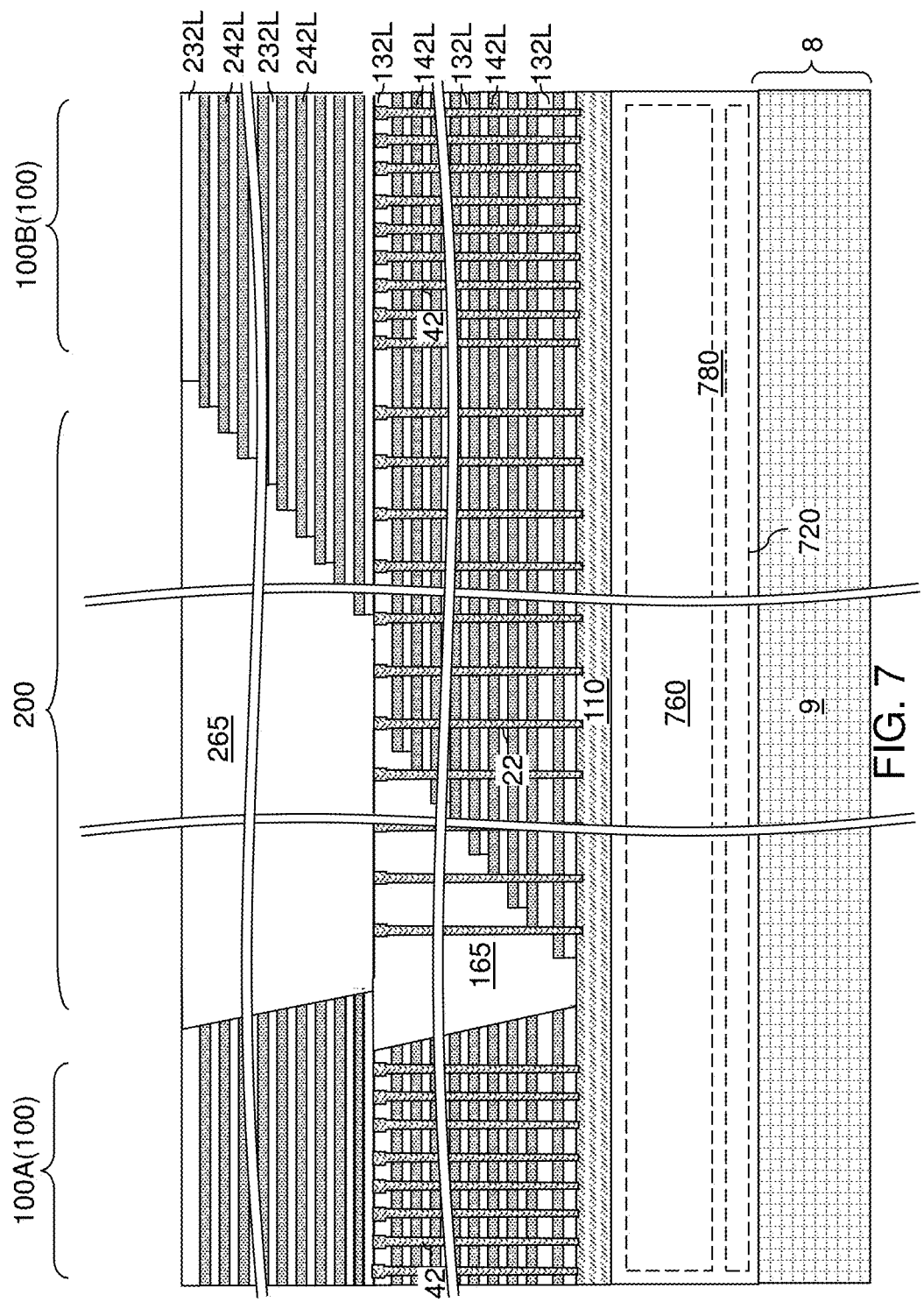
FIG. 7 is a vertical cross-sectional view of the first exemplary structure after formation of a second vertically alternating sequence of second continuous insulating layers and second continuous sacrificial material layers, second stepped surfaces, and second-tier retro-stepped dielectric material portions according to the first embodiment of the present disclosure.
Figure 8A:
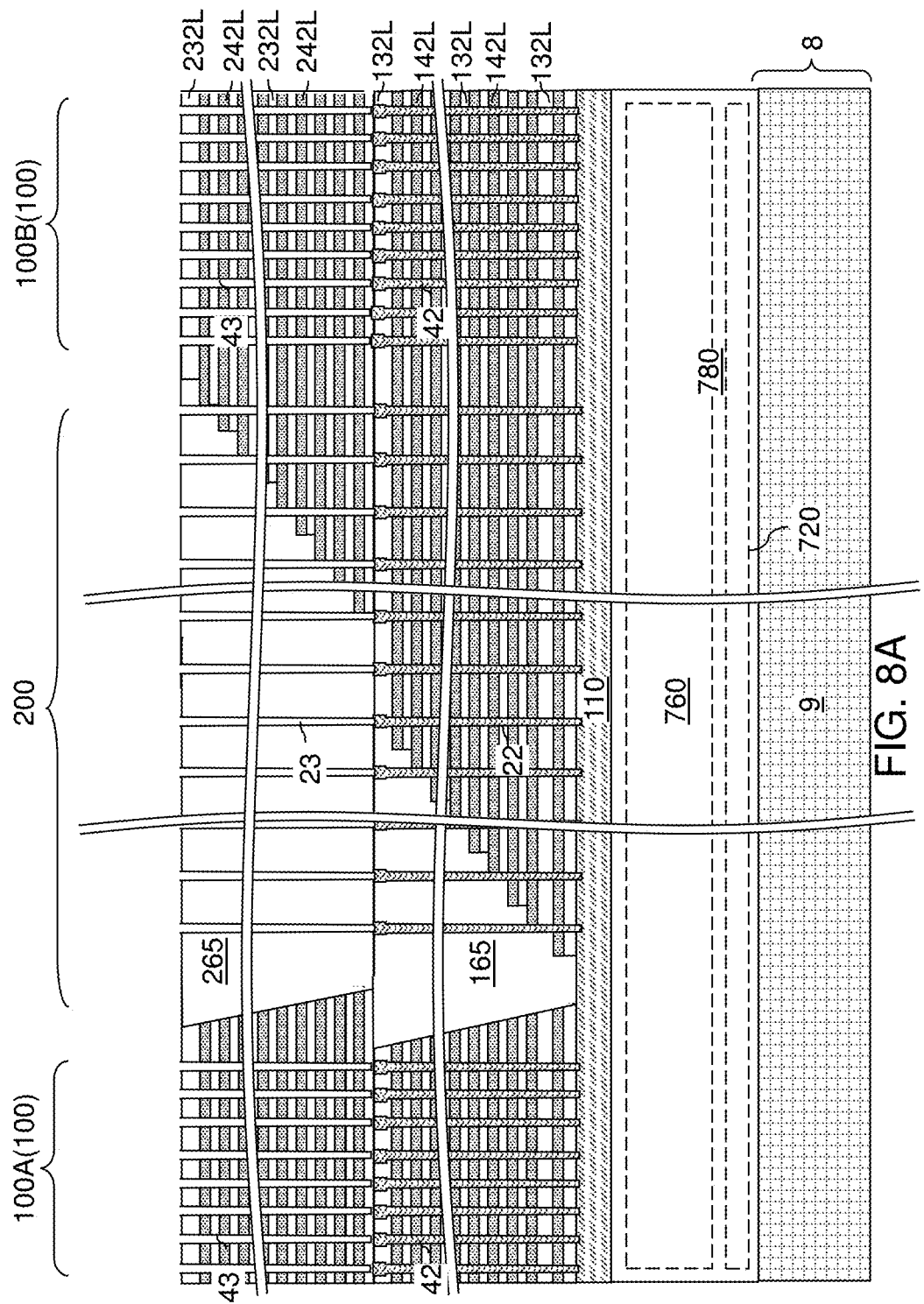
FIG. 8A is a vertical cross-sectional view of the first exemplary structure after formation of second-tier openings according to the first embodiment of the present disclosure.
Figure 8B:
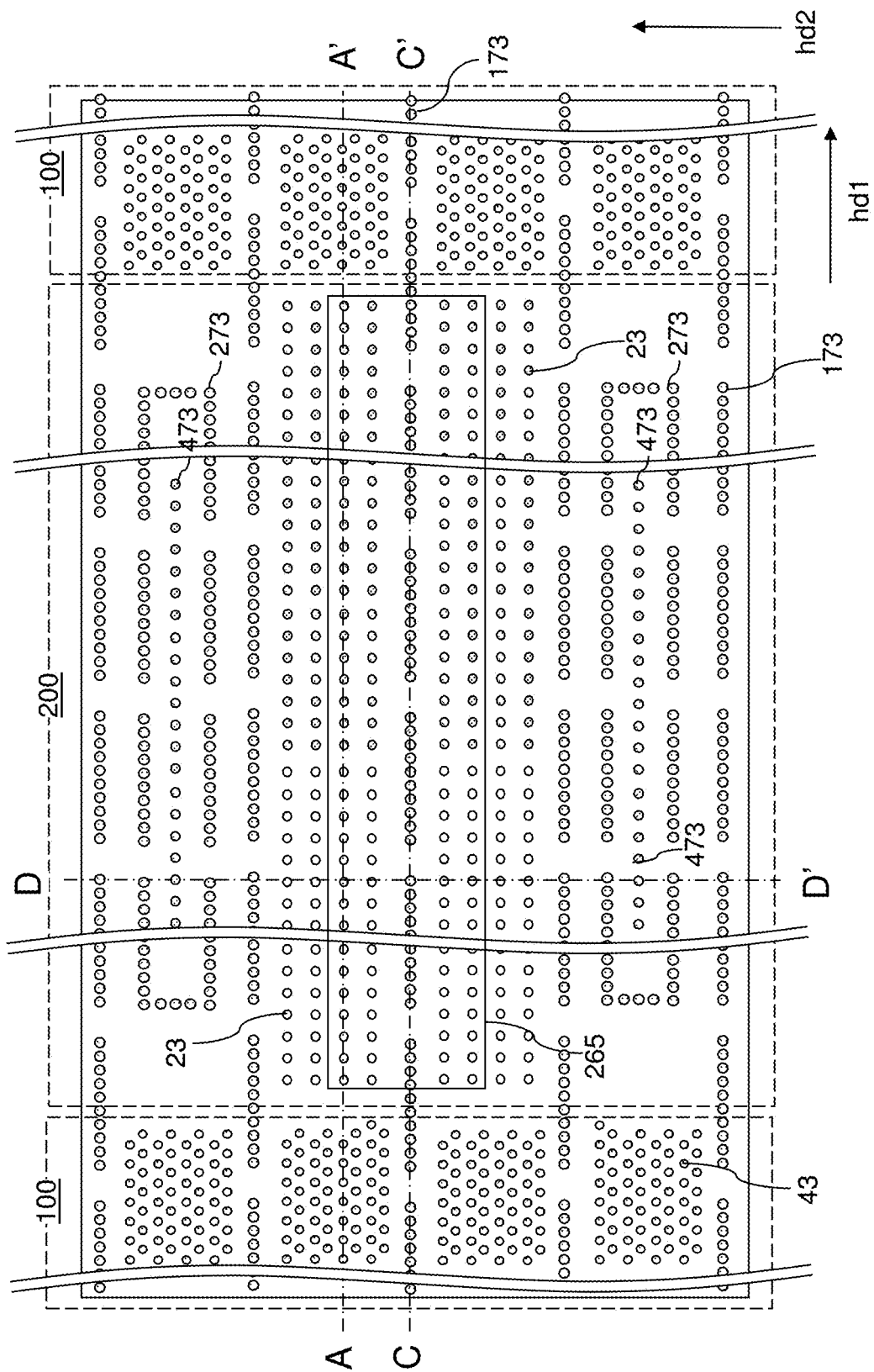
FIG. 8B is a top-down view of the first exemplary structure of FIG. 8A. The vertical plane A-A' is the plane of the vertical cross-sectional view of FIG. 8A.
Figure 8C:
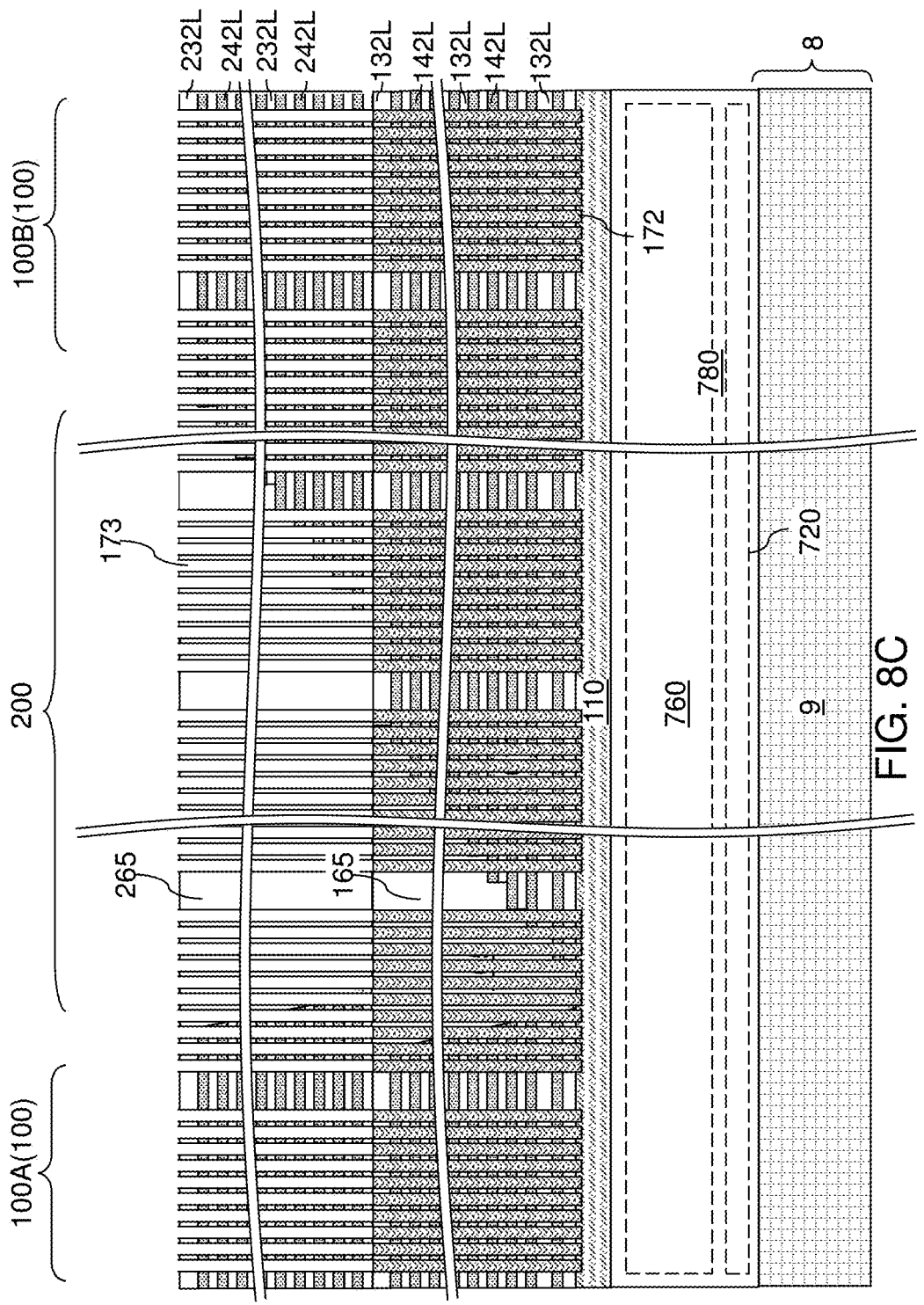
FIG. 8C is a vertical cross-sectional view of the first exemplary structure along the vertical plane C-C' of FIG. 8B.
Figure 8D:
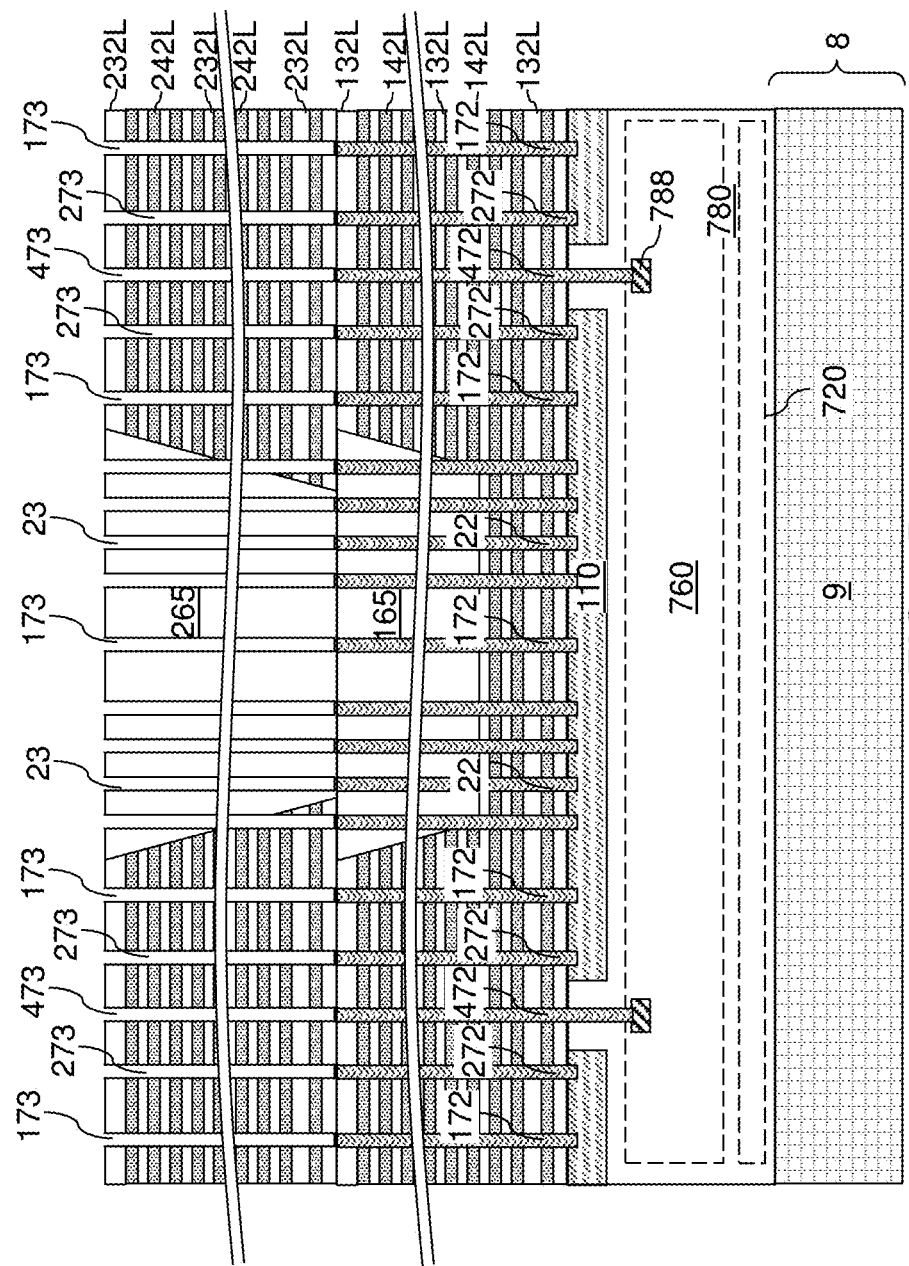
FIG. 8D is a vertical cross-sectional view of the first exemplary structure along the vertical plane D-D' of FIG. 8B.
Figure 9A:
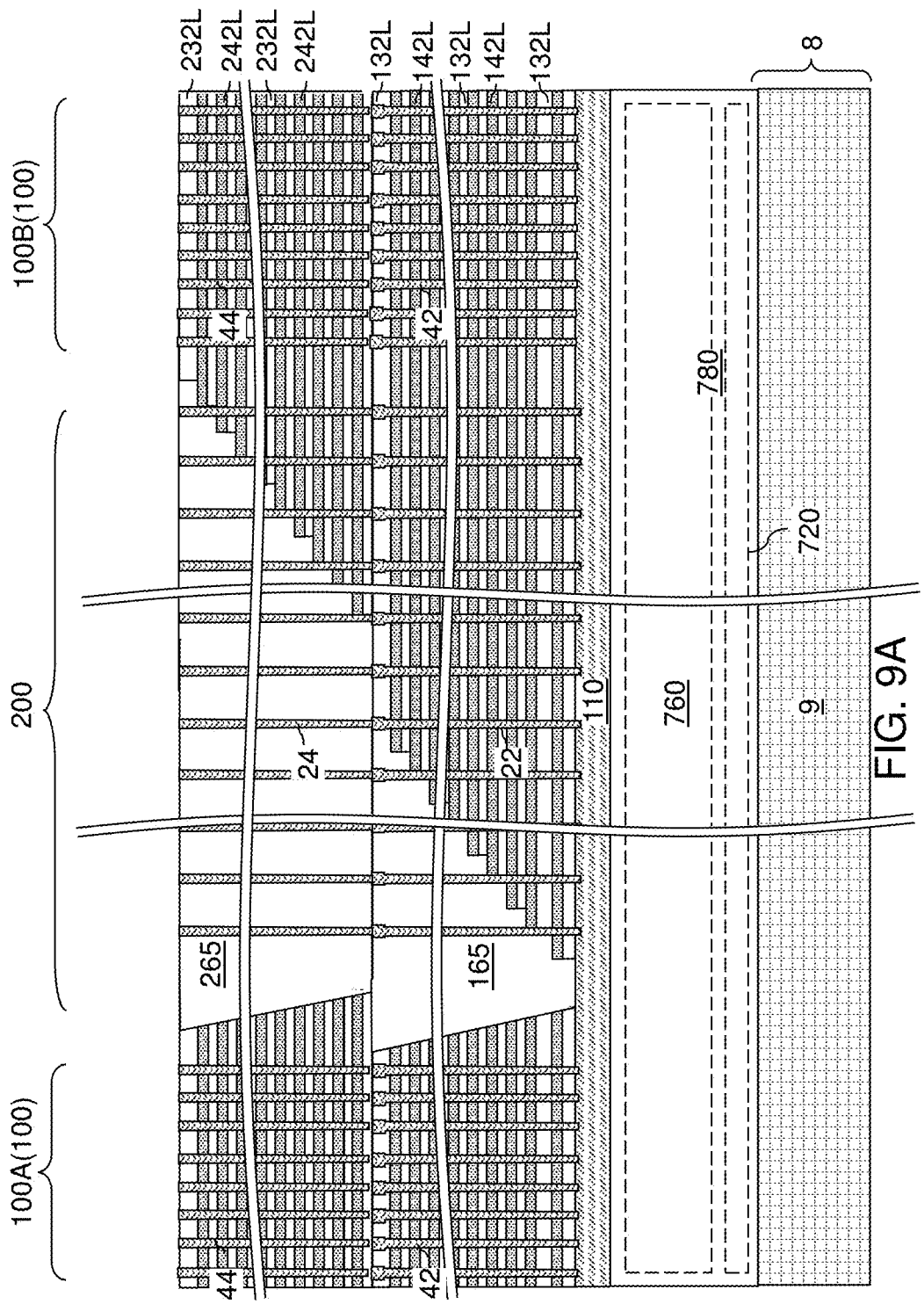
FIG. 9A is a vertical cross-sectional view of the first exemplary structure after formation of sacrificial second-tier opening fill structures according to the first embodiment of the present disclosure.
Figure 9B:
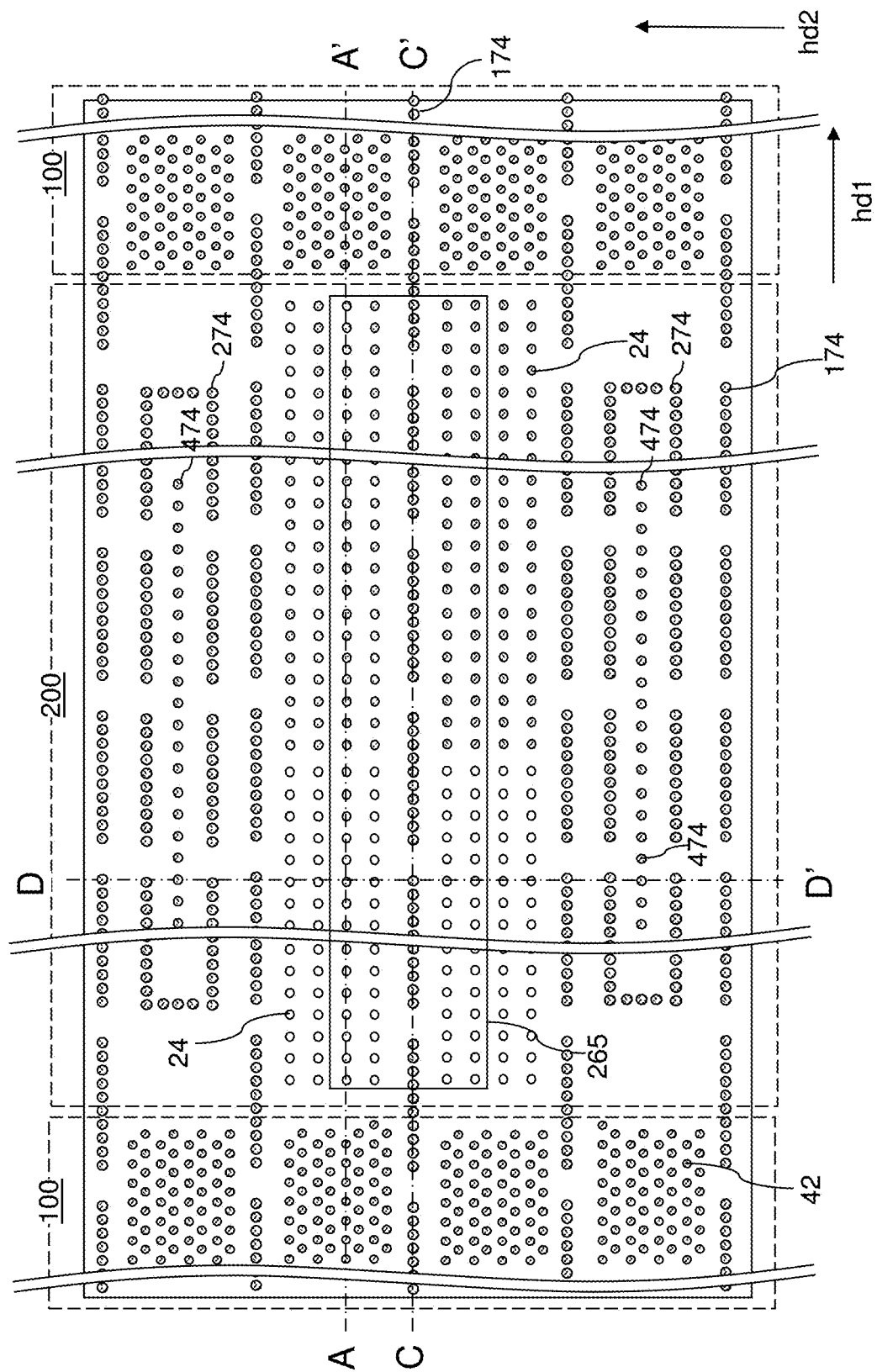
FIG. 9B is a top-down view of the first exemplary structure of FIG. 9A. The vertical plane A-A' is the plane of the vertical cross-sectional view of FIG. 9A.
Figure 9C:
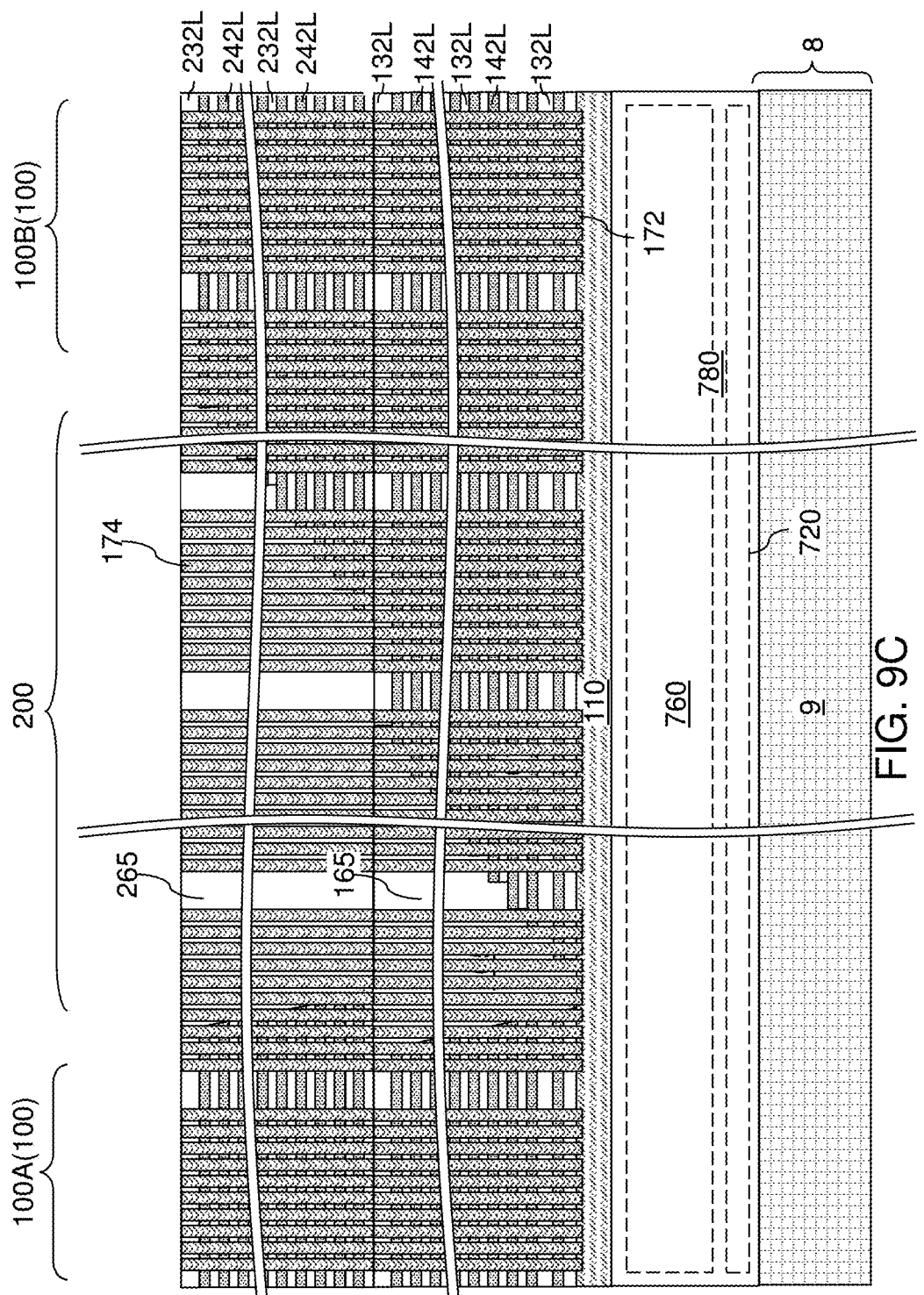
FIG. 9C is a vertical cross-sectional view of the first exemplary structure along the vertical plane C-C' of FIG. 9B.
Figure 9D:
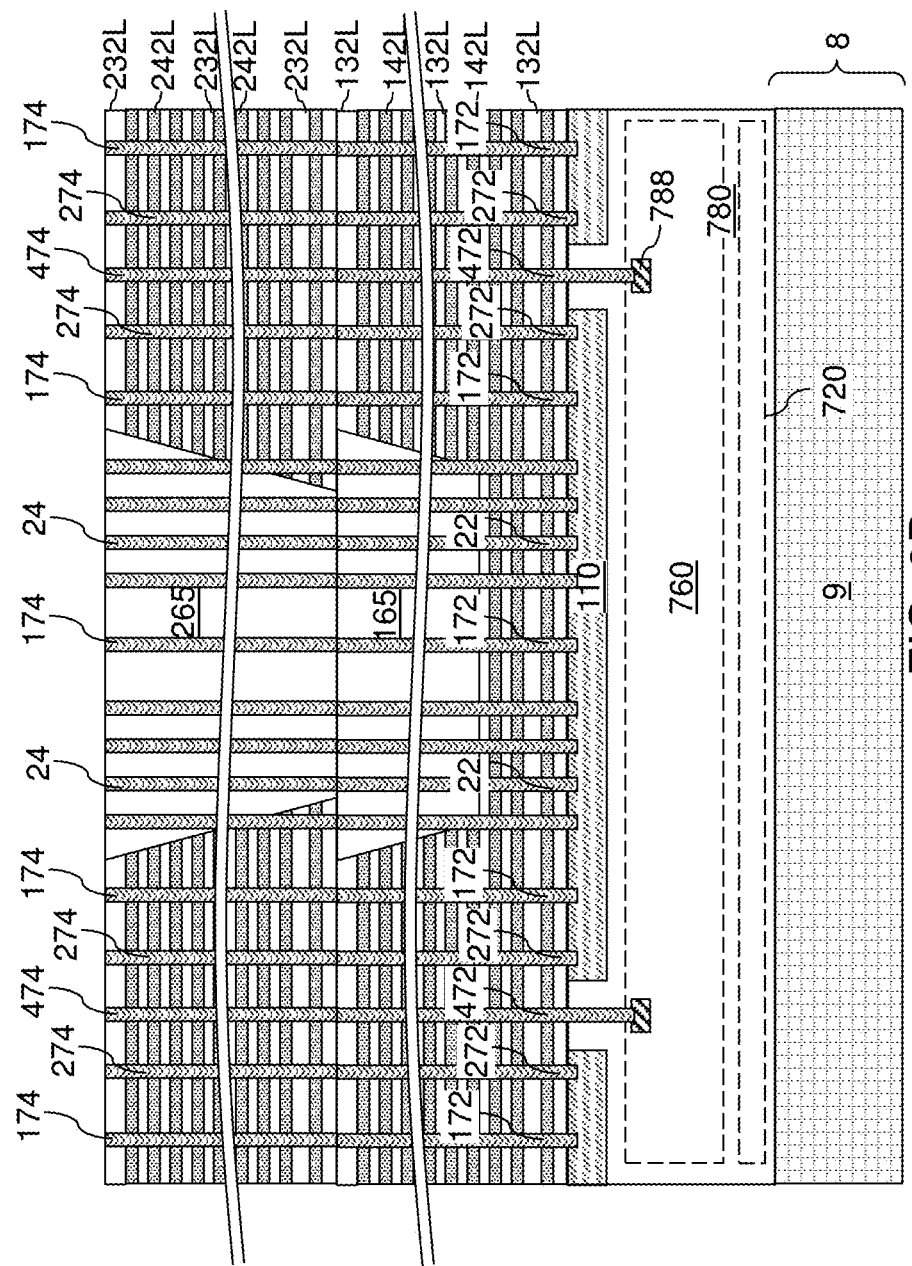
FIG. 9D is a vertical cross-sectional view of the first exemplary structure along the vertical plane D-D' of FIG. 9B.
Figure 10A:
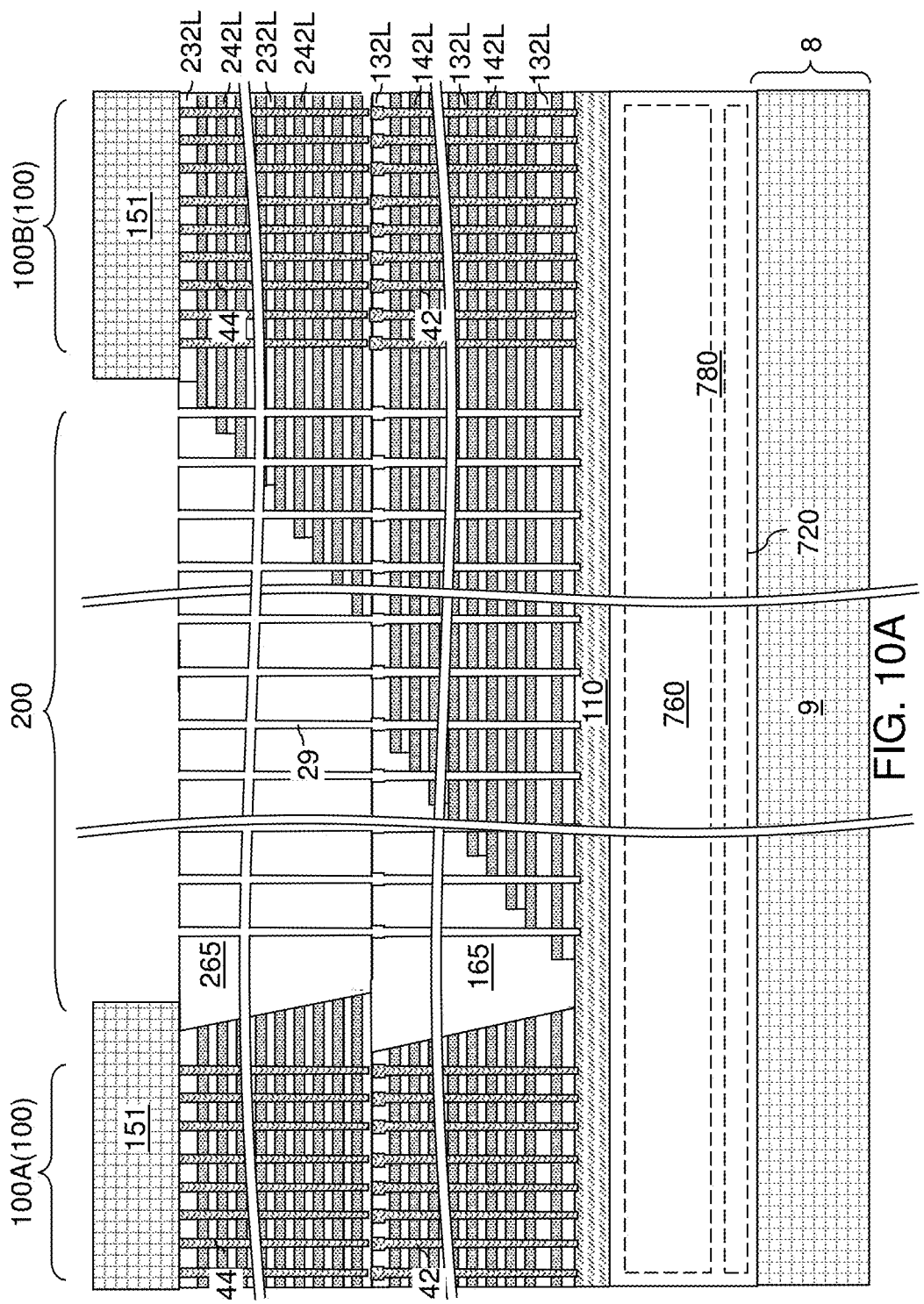
FIG. 10A is a vertical cross-sectional view of the first exemplary structure after formation of inter-tier support openings according to the first embodiment of the present disclosure.
Figure 10B:
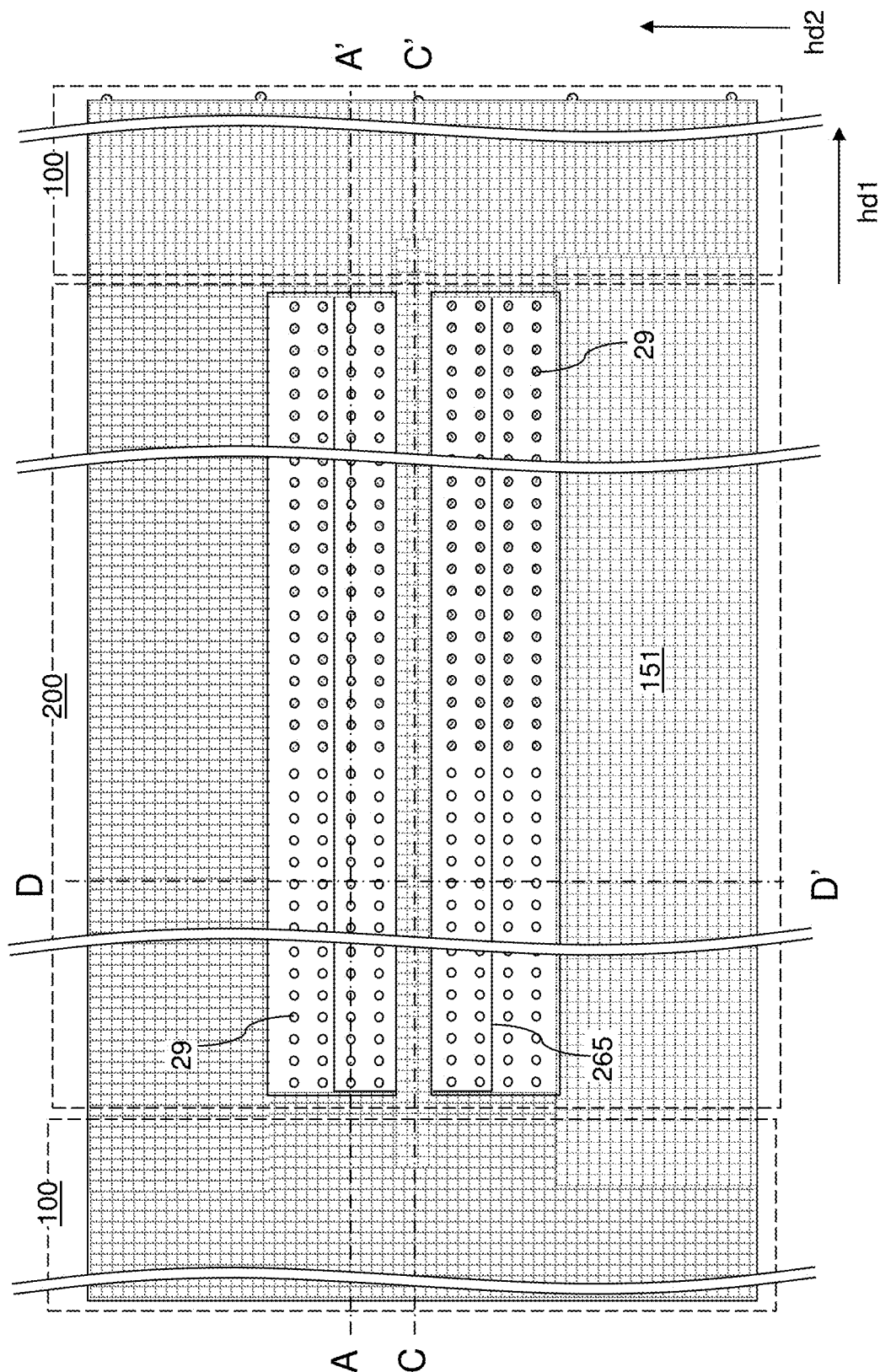
FIG. 10B is a top-down view of the first exemplary structure of FIG. 10A. The vertical plane A-A' is the plane of the vertical cross-sectional view of FIG. 10A.
Figure 10C:
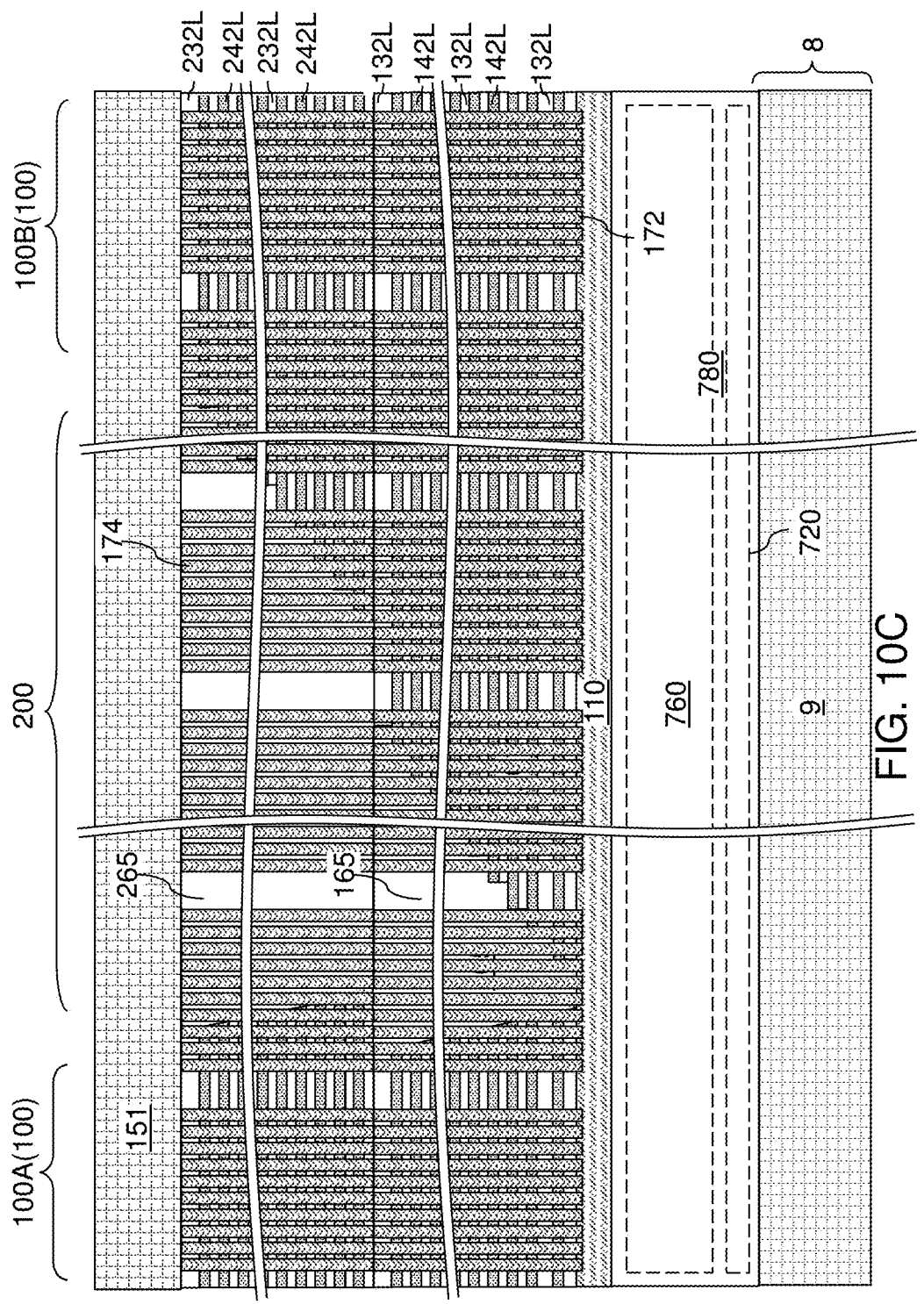
FIG. 10C is a vertical cross-sectional view of the first exemplary structure along the vertical plane C-C' of FIG. 10B.
Figure 10D:
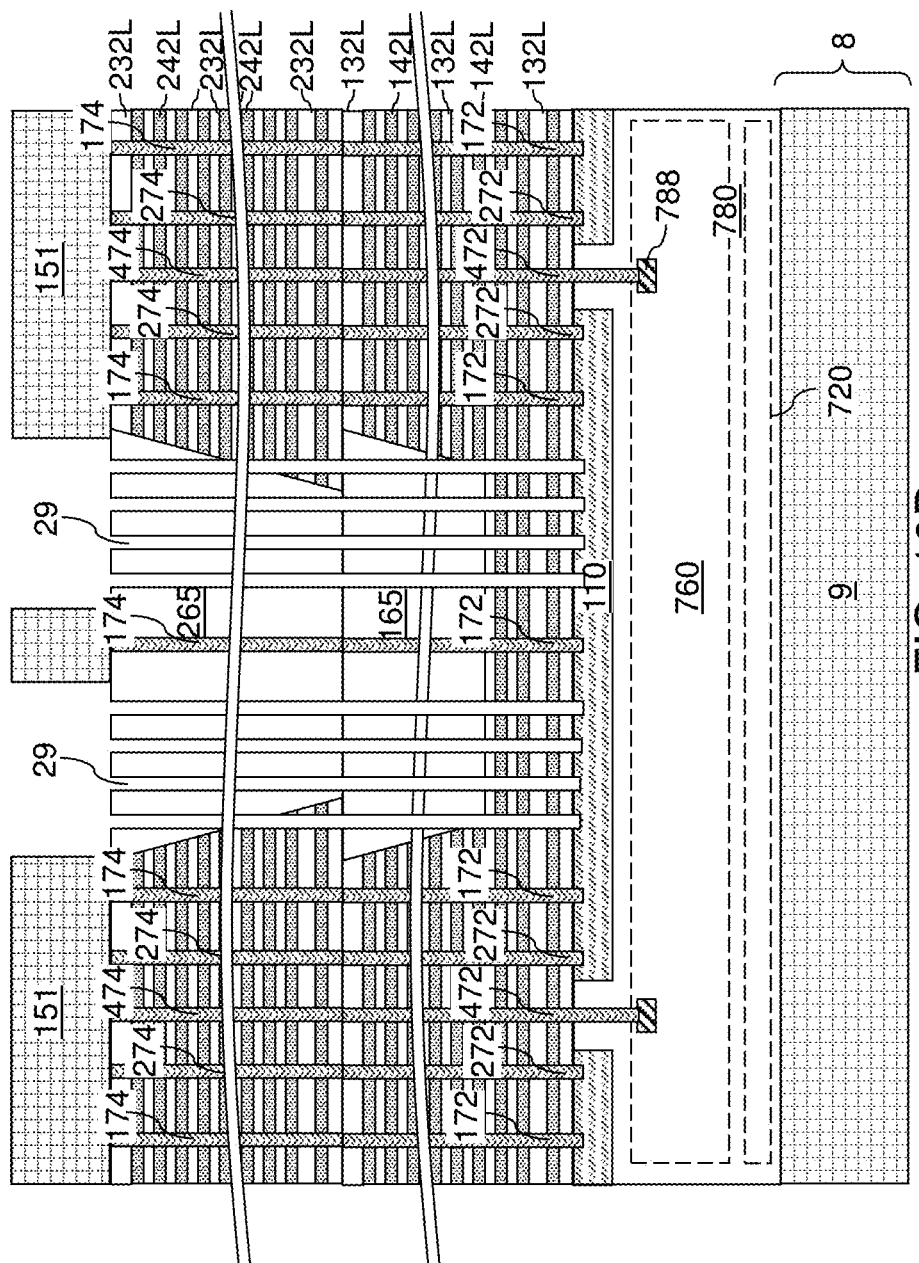
FIG. 10D is a vertical cross-sectional view of the first exemplary structure along the vertical plane D-D' of FIG. 10B.
Figure 11A:
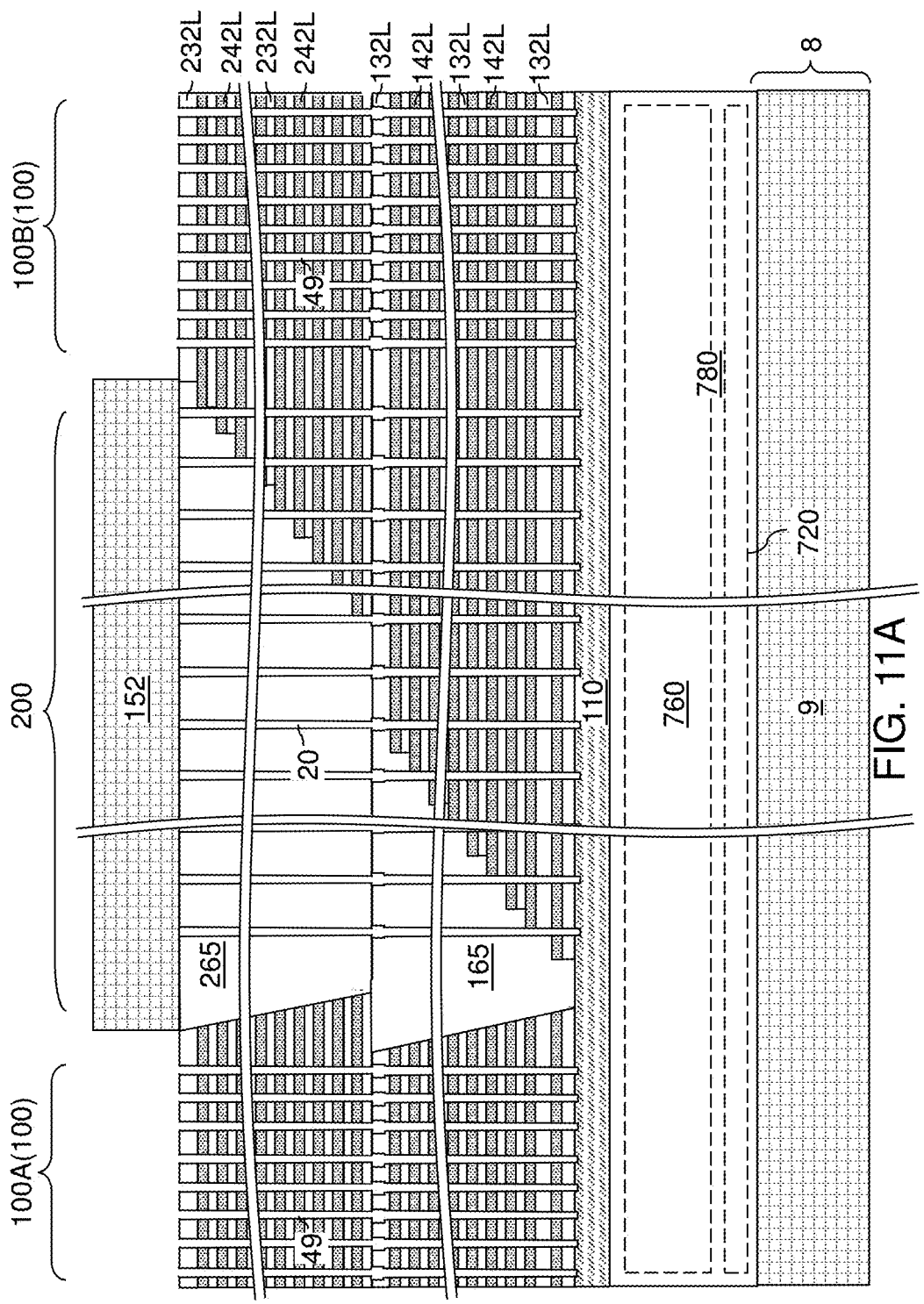
FIG. 11A is a vertical cross-sectional view of the first exemplary structure after formation of support pillar structures and inter-tier memory openings according to the first embodiment of the present disclosure.
Figure 11B:
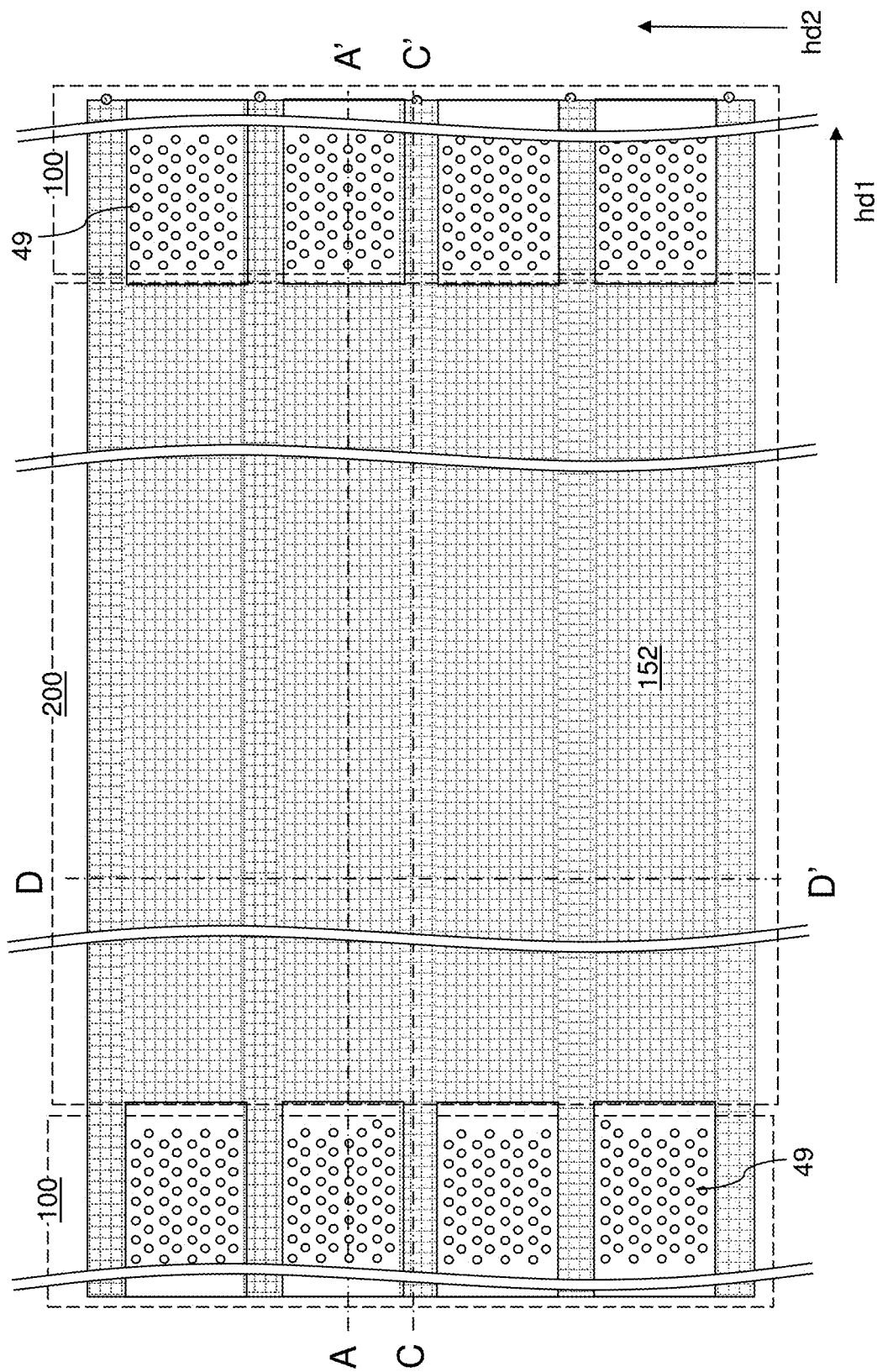
FIG. 11B is a top-down view of the first exemplary structure of FIG. 11A. The vertical plane A-A' is the plane of the vertical cross-sectional view of FIG. 11A.
Figure 11C:
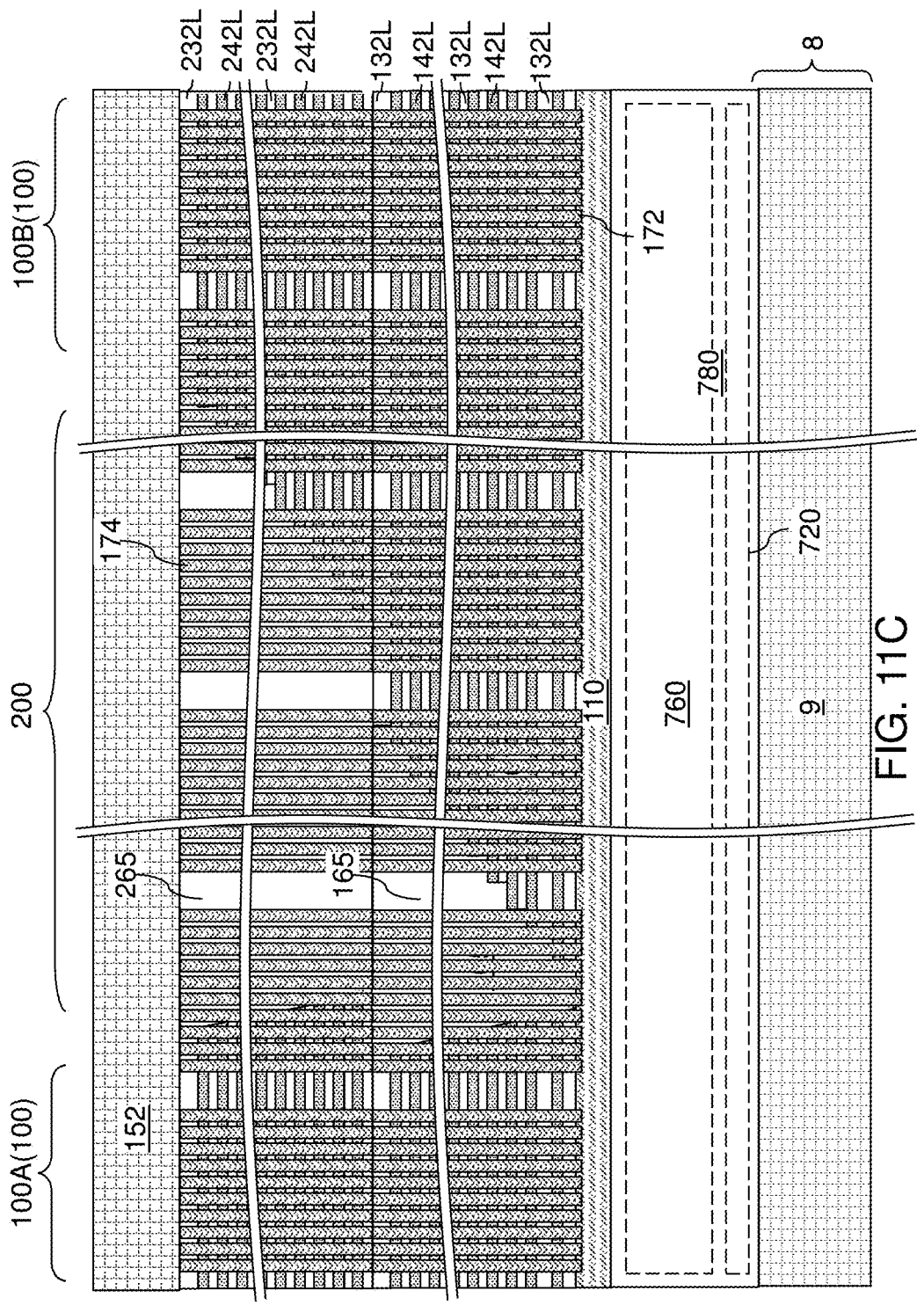
FIG. 11C is a vertical cross-sectional view of the first exemplary structure along the vertical plane C-C' of FIG. 11B.
Figure 11D:
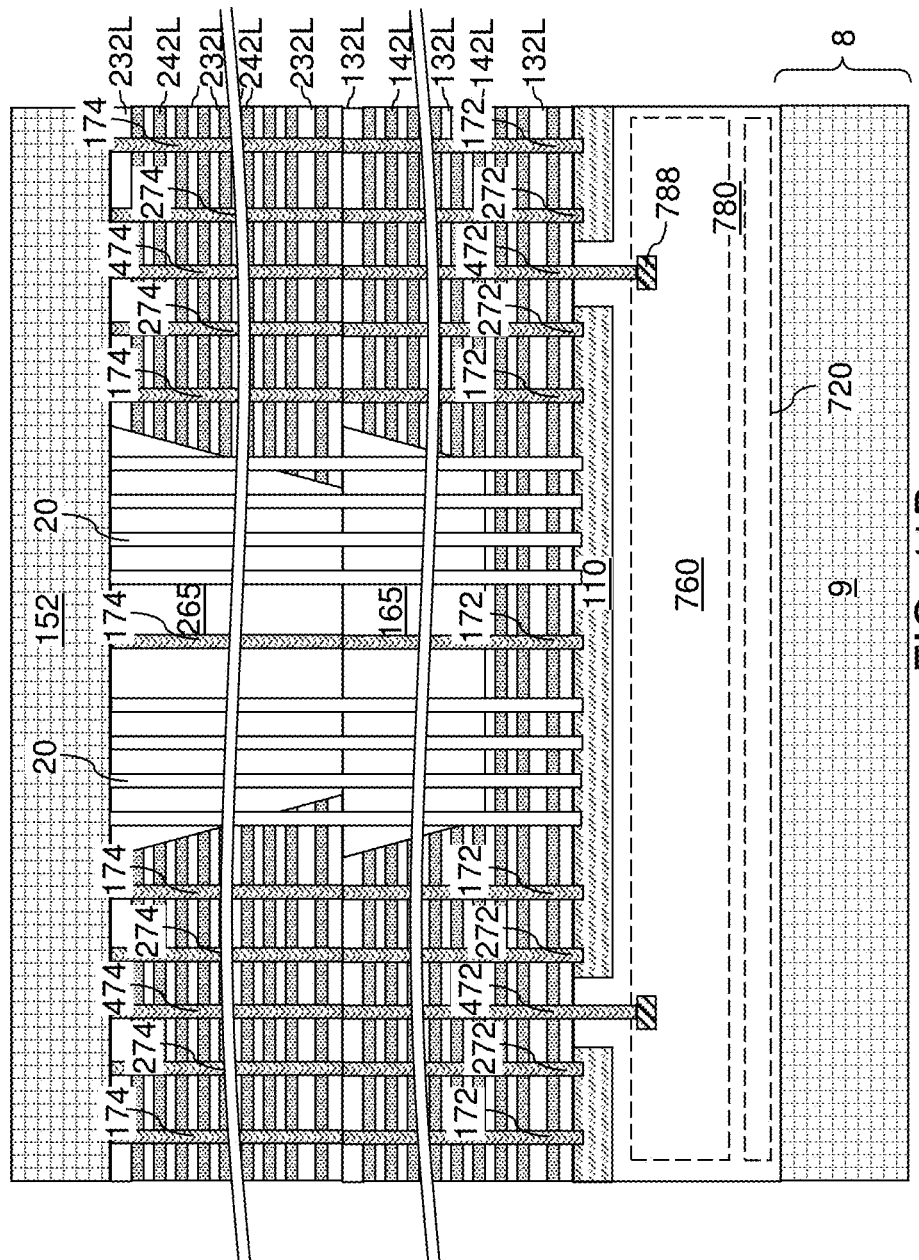
FIG. 11D is a vertical cross-sectional view of the first exemplary structure along the vertical plane D-D' of FIG. 11B.
Figure 13A:
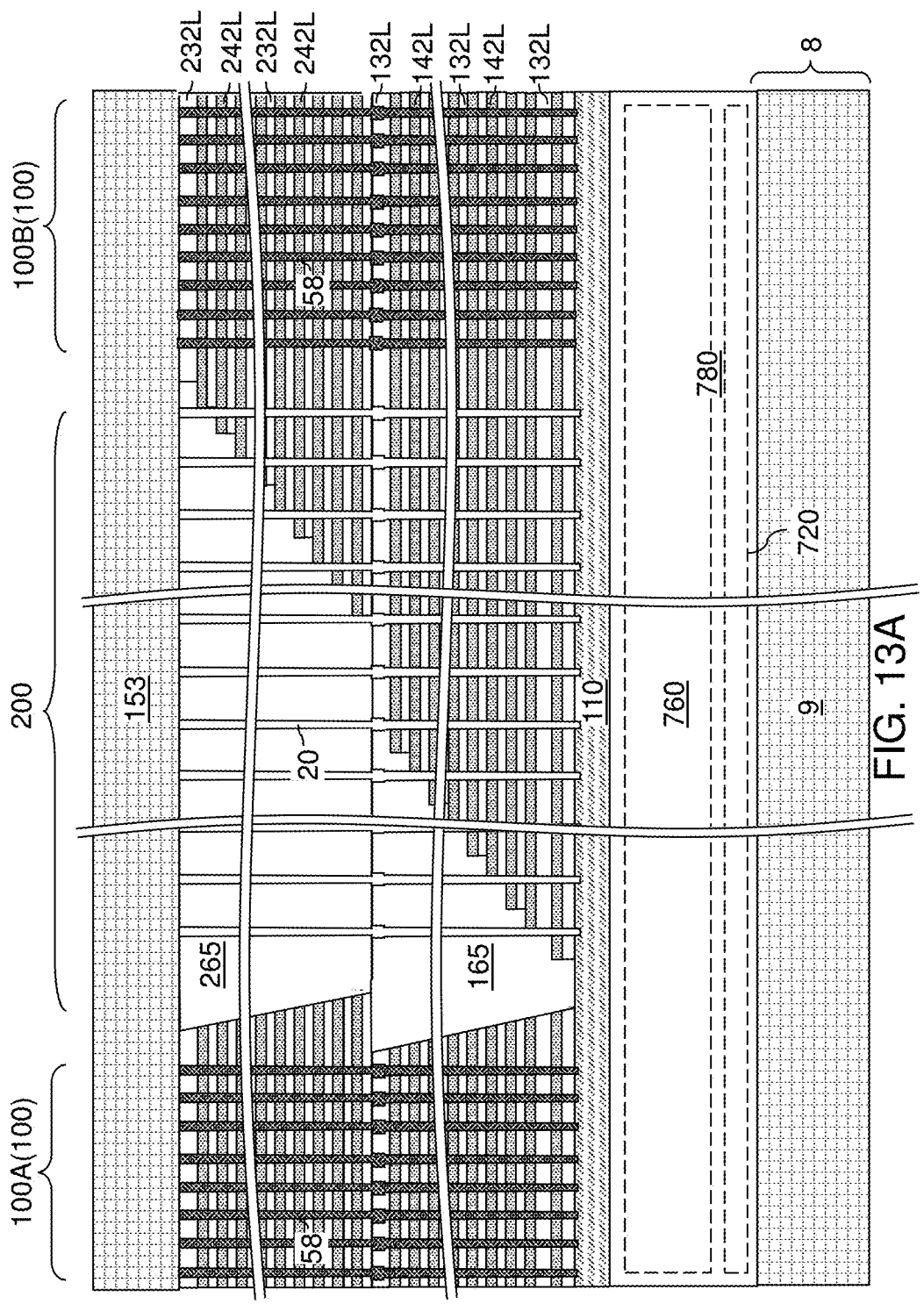
FIG. 13A is a vertical cross-sectional view of the first exemplary structure after formation of inter-tier backside openings and inter-tier moat-region openings according to the first embodiment of the present disclosure.
Figure 13B:
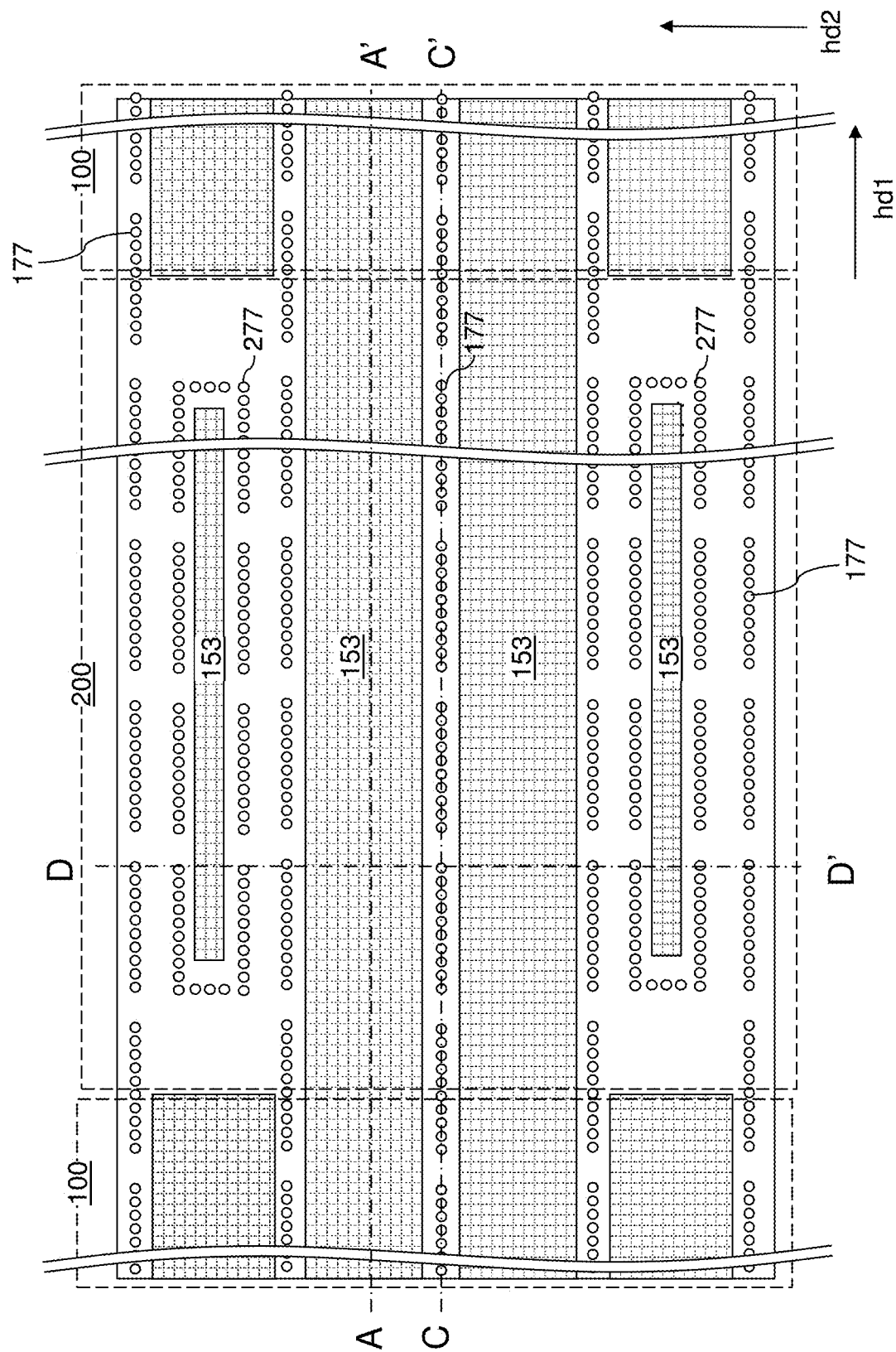
FIG. 13B is a top-down view of the first exemplary structure of FIG. 13A. The vertical plane A-A' is the plane of the vertical cross-sectional view of FIG. 13A.
Figure 13C:
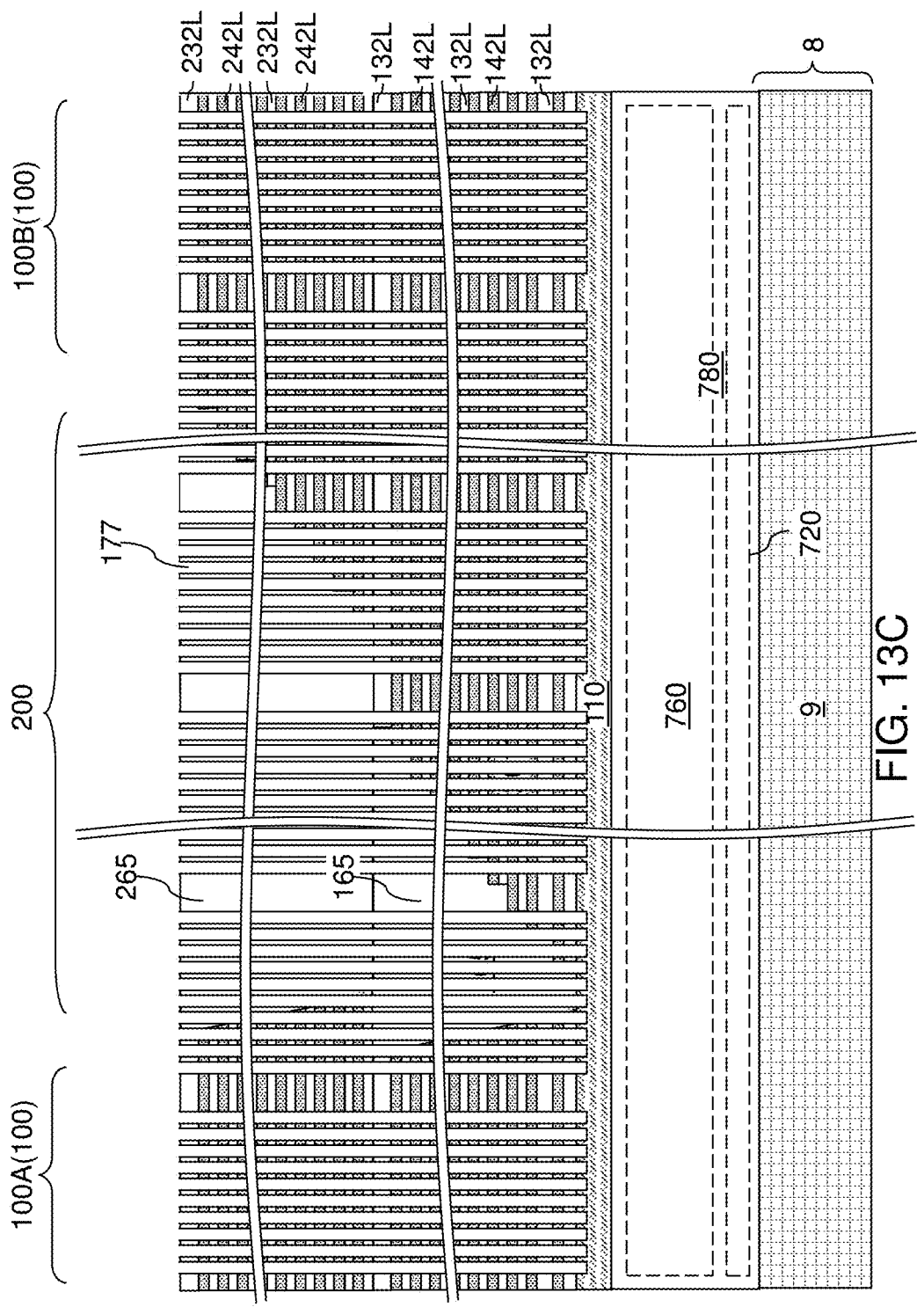
FIG. 13C is a vertical cross-sectional view of the first exemplary structure along the vertical plane C-C' of FIG. 13B.
Figure 13D:
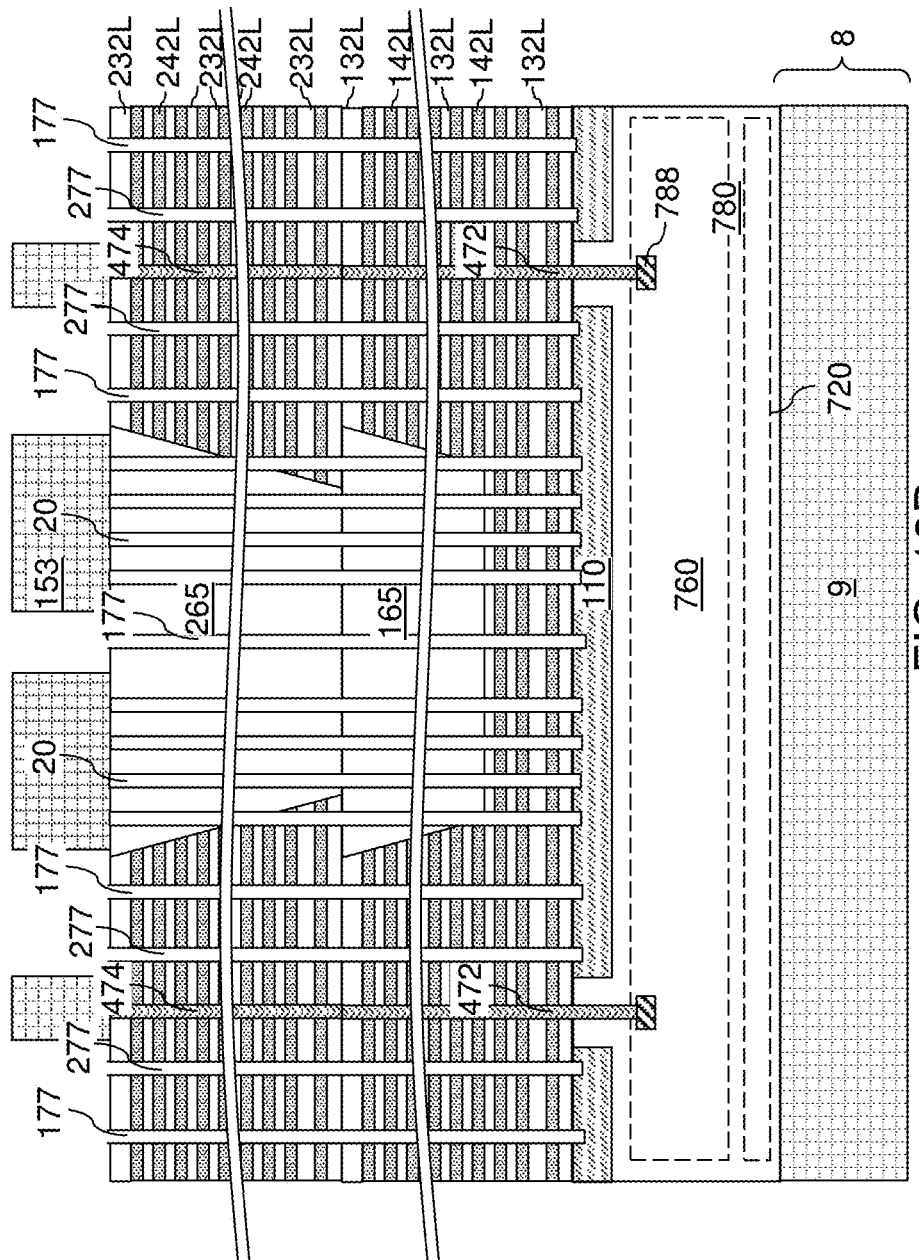
FIG. 13D is a vertical cross-sectional view of the first exemplary structure along the vertical plane D-D' of FIG. 13B.
Figure 14A:
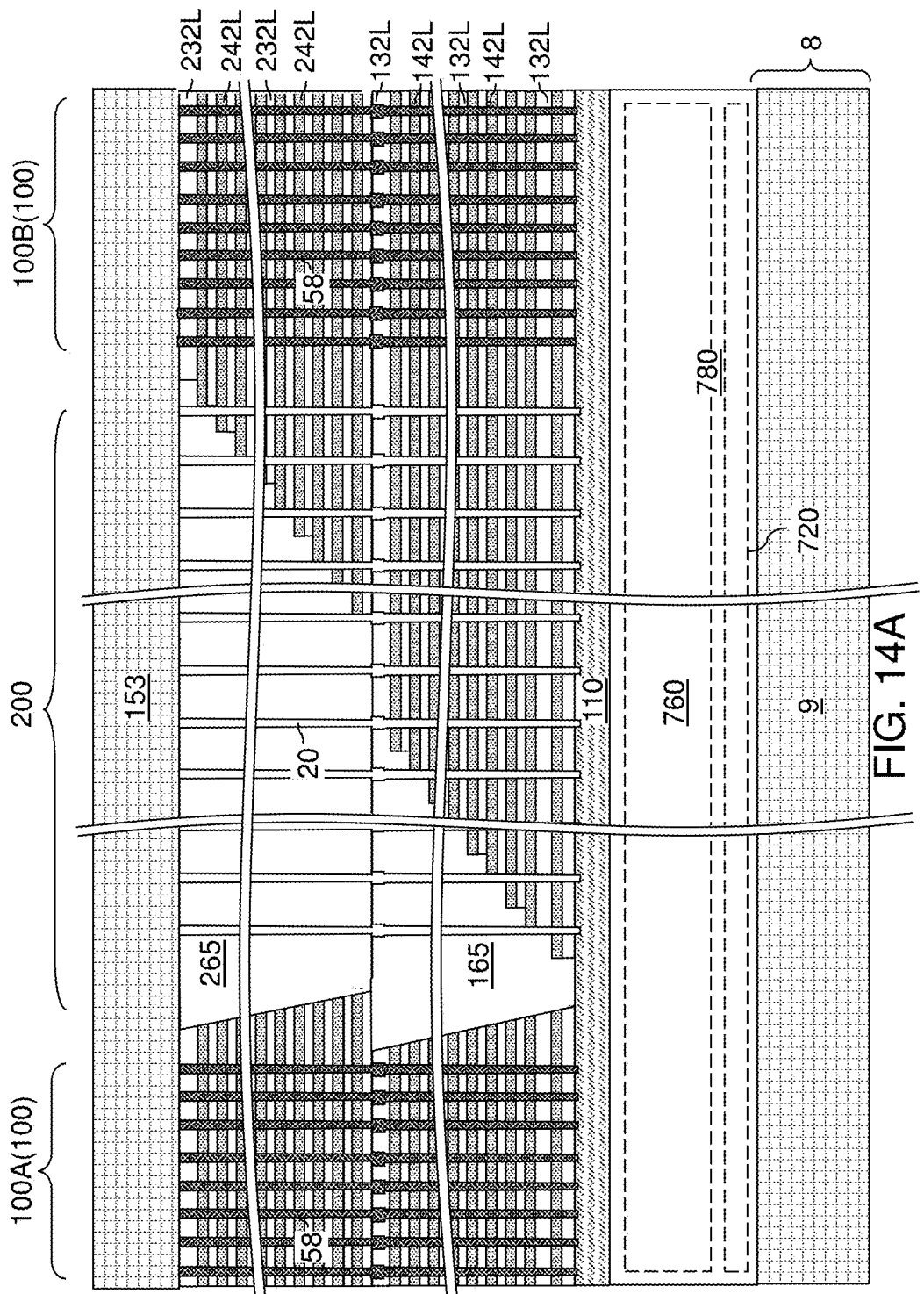
FIG. 14A is a vertical cross-sectional view of the first exemplary structure after formation of backside trenches and moat trenches according to the first embodiment of the present disclosure.
Figure 14B:
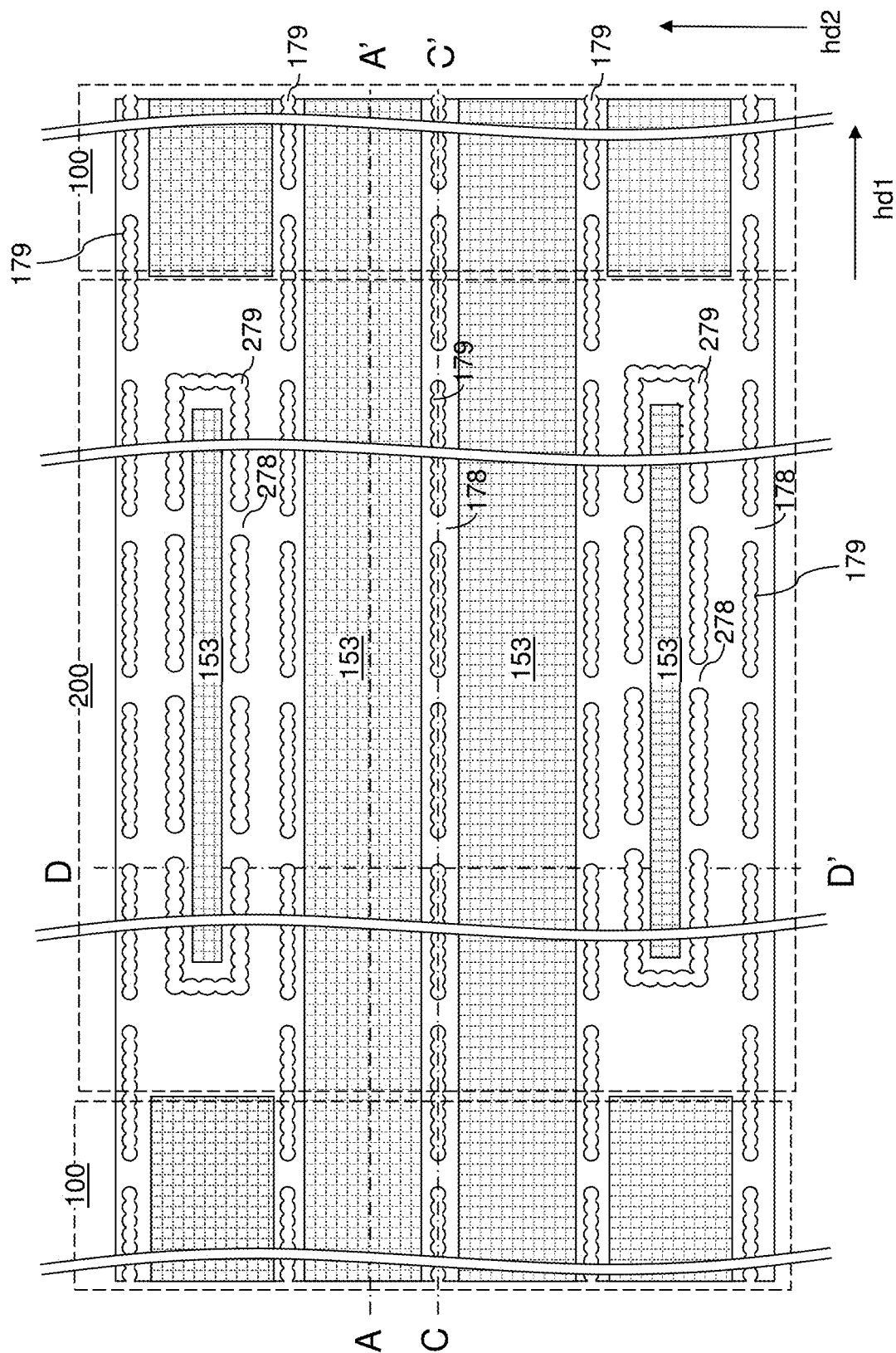
FIG. 14B is a top-down view of the first exemplary structure of FIG. 14A. The vertical plane A-A' is the plane of the vertical cross-sectional view of FIG. 14A.
Figure 14C:
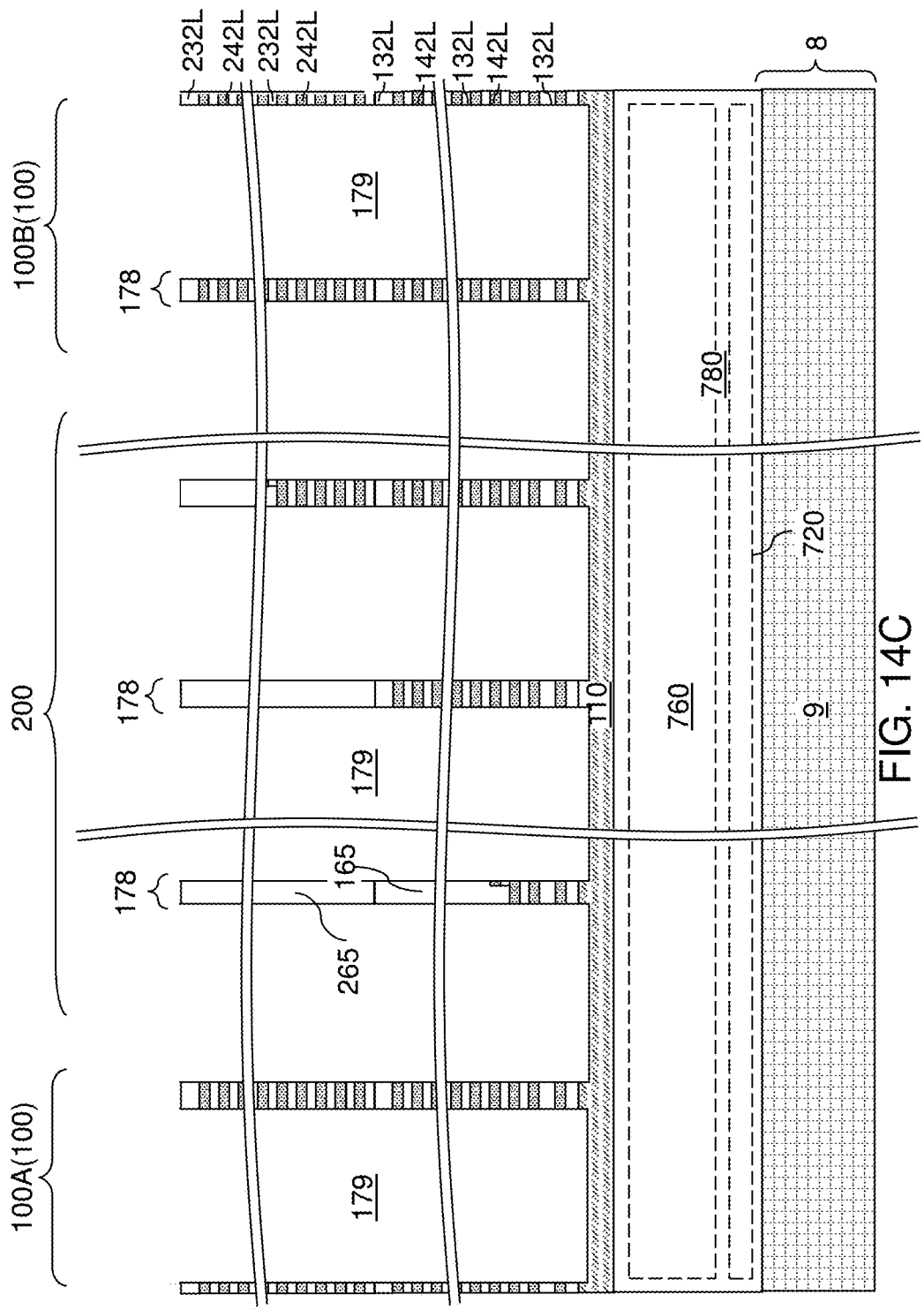
FIG. 14C is a vertical cross-sectional view of the first exemplary structure along the vertical plane C-C' of FIG. 14B.
Figure 14D:
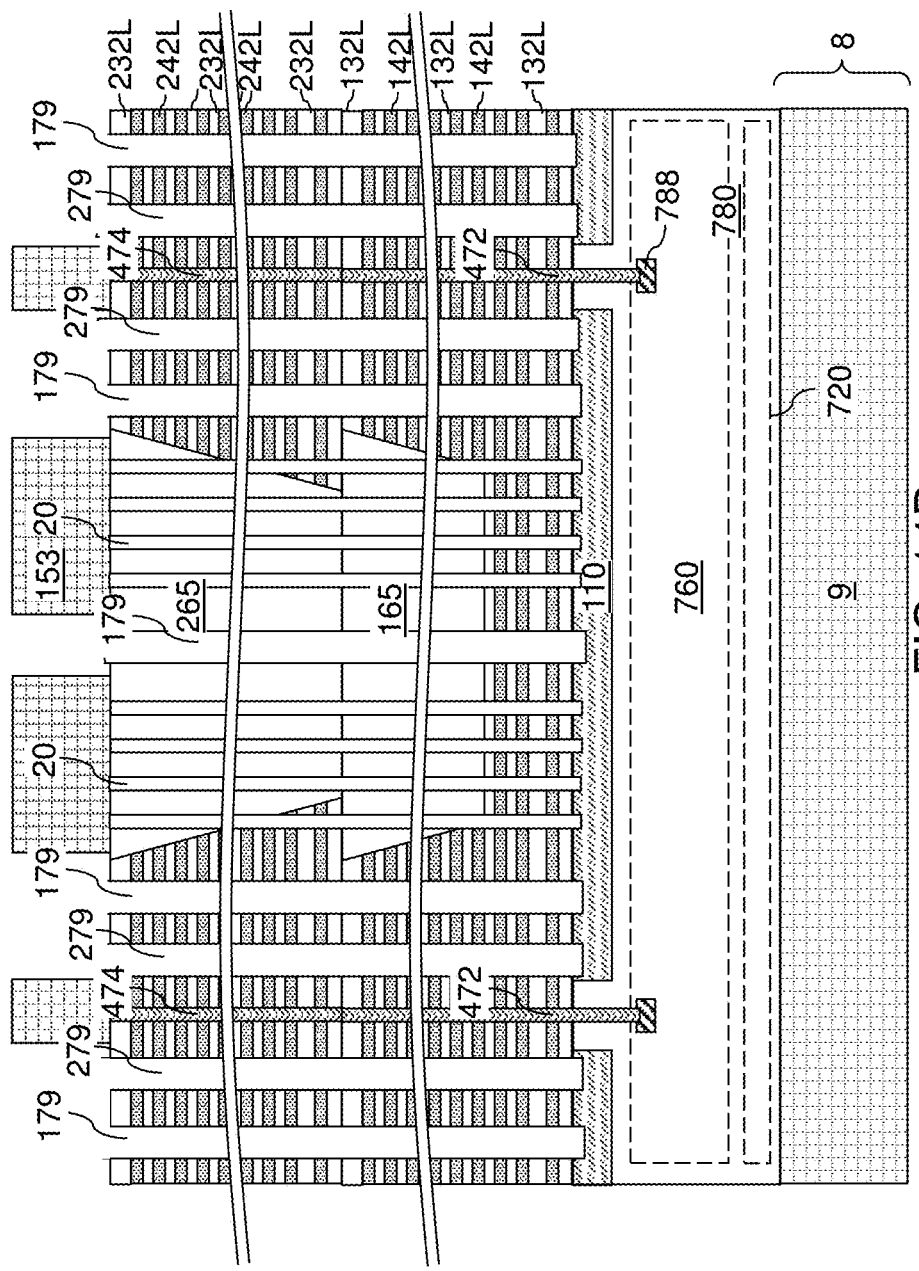
FIG. 14D is a vertical cross-sectional view of the first exemplary structure along the vertical plane D-D' of FIG. 14B.
Figure 15A:
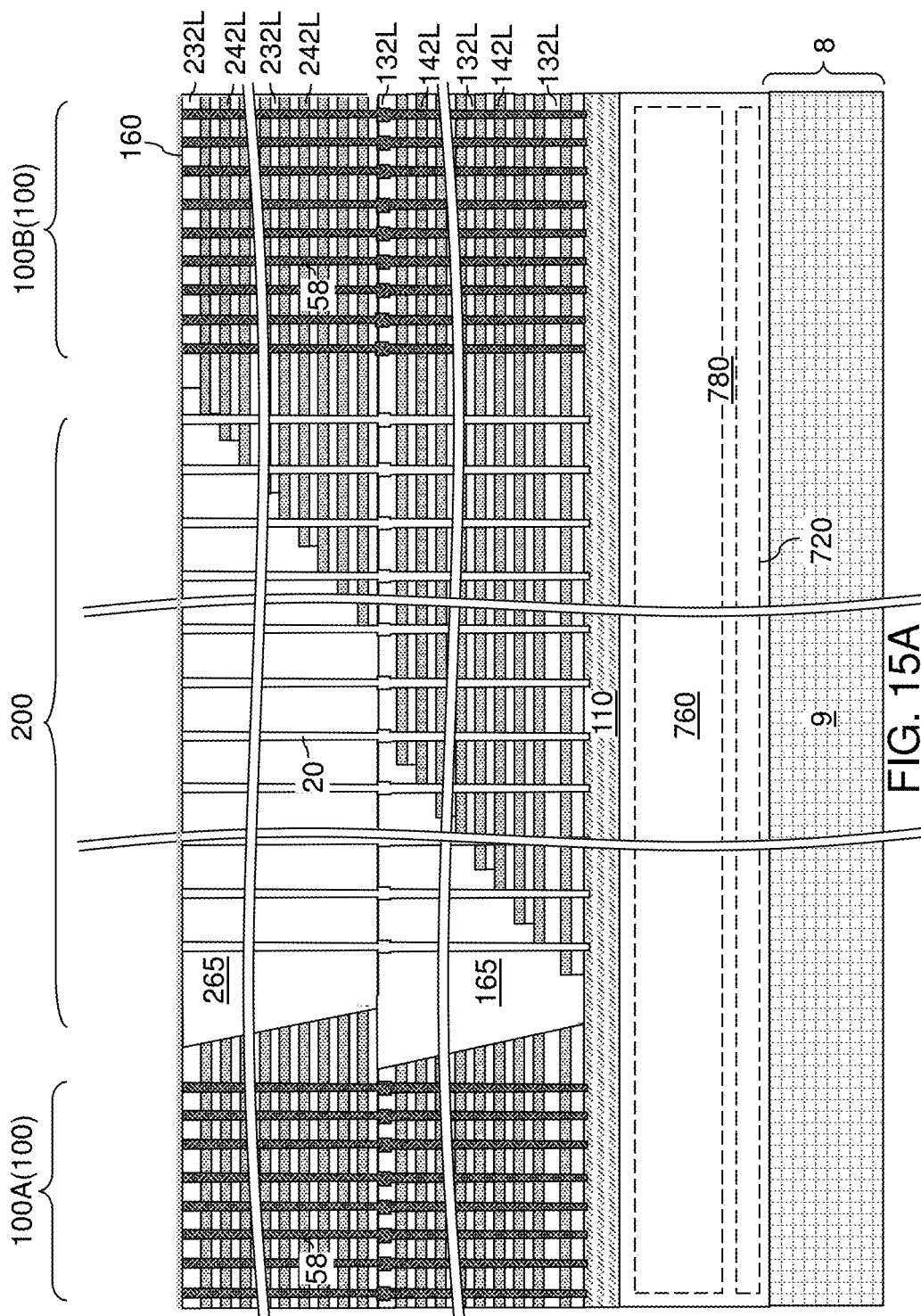
FIG. 15A is a vertical cross-sectional view of the first exemplary structure after formation of a dielectric etch mask liner according to the first embodiment of the present disclosure.
Figure 15B:
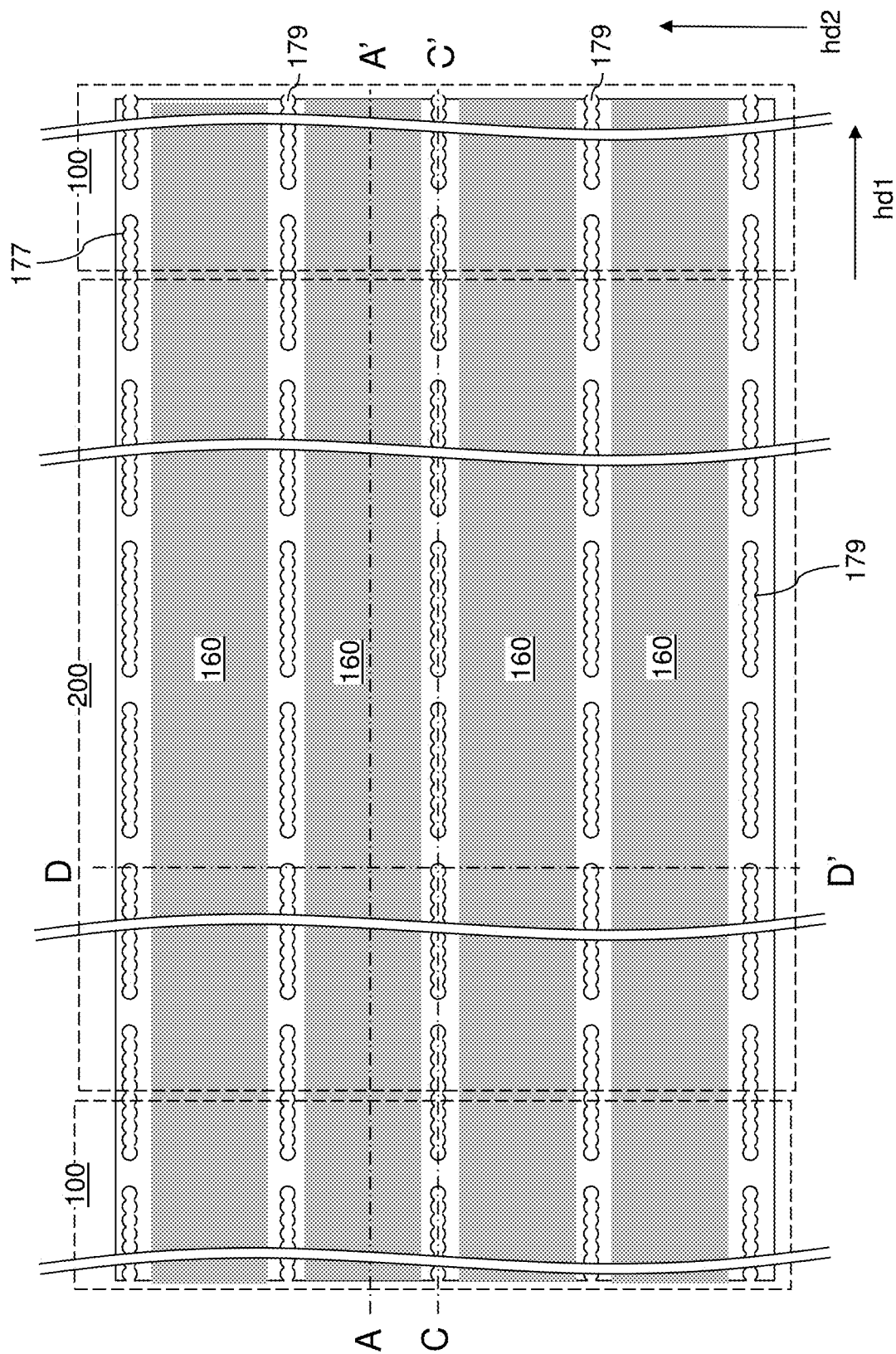
FIG. 15B is a top-down view of the first exemplary structure of FIG. 15A. The vertical plane A-A' is the plane of the vertical cross-sectional view of FIG. 15A.
Figure 15C:
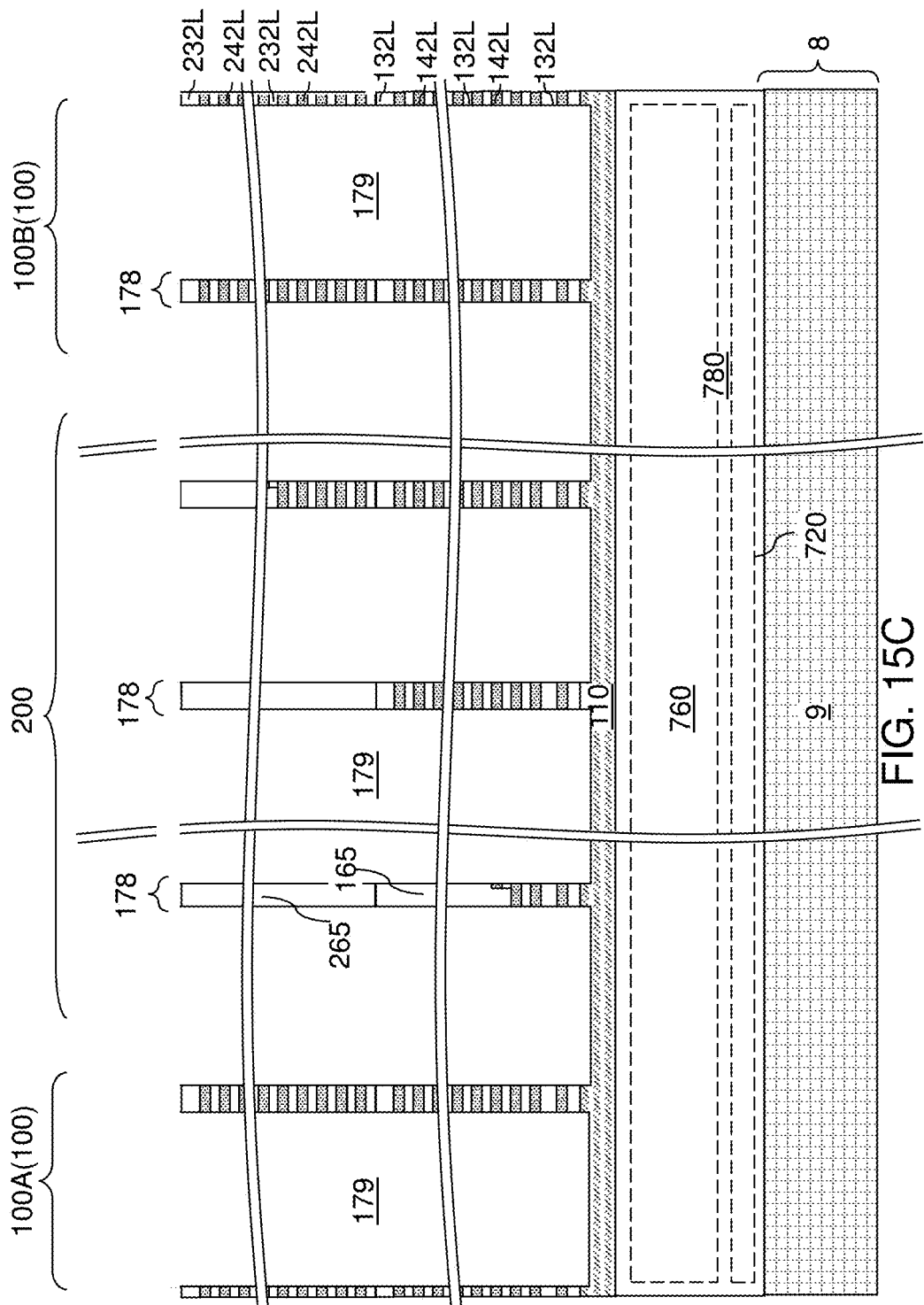
FIG. 15C is a vertical cross-sectional view of the first exemplary structure along the vertical plane C-C' of FIG. 15B.
Figure 15D:
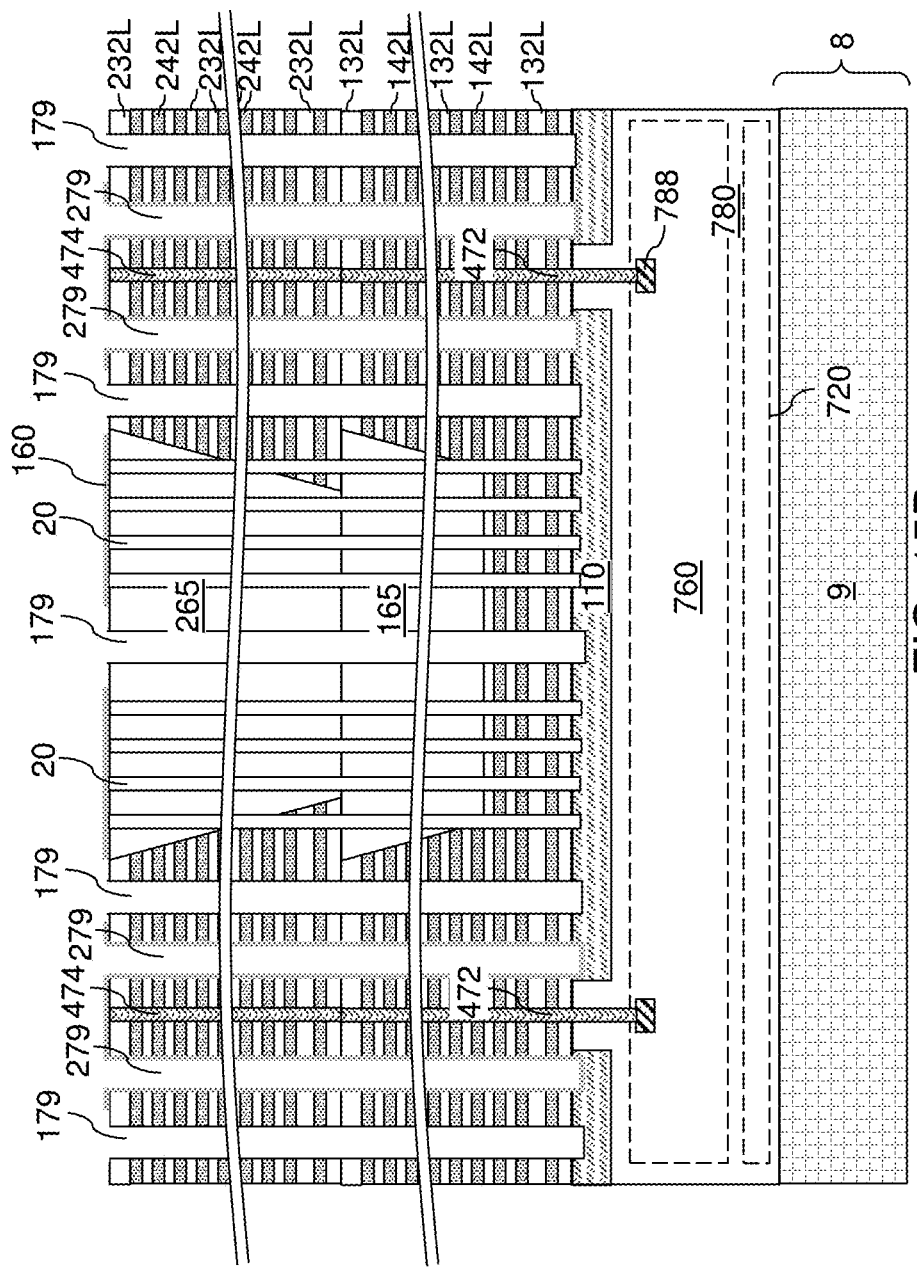
FIG. 15D is a vertical cross-sectional view of the first exemplary structure along the vertical plane D-D' of FIG. 15B.
Figure 16A:
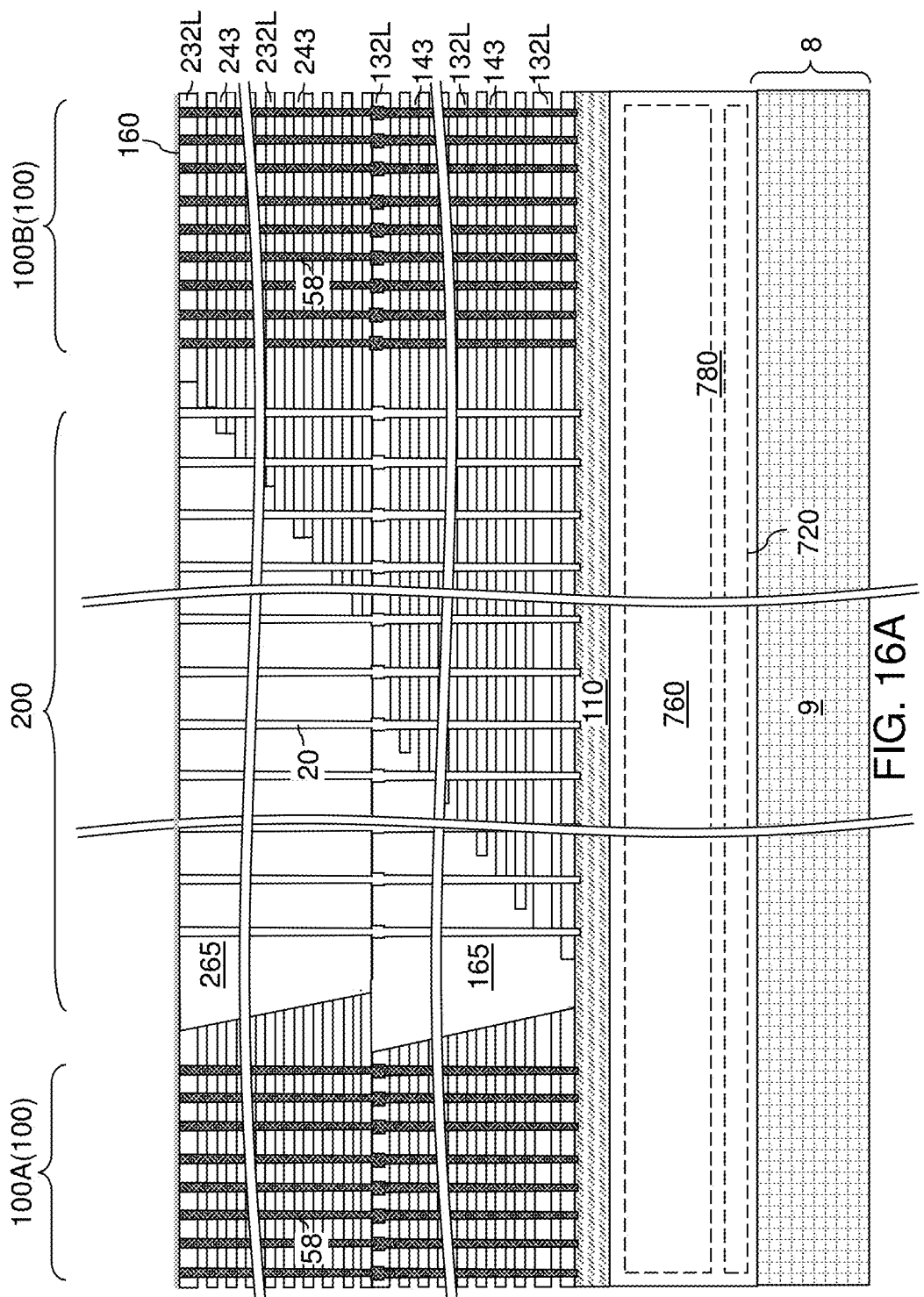
FIG. 16A is a vertical cross-sectional view of the first exemplary structure after formation of backside recesses according to the first embodiment of the present disclosure.
Figure 16B:
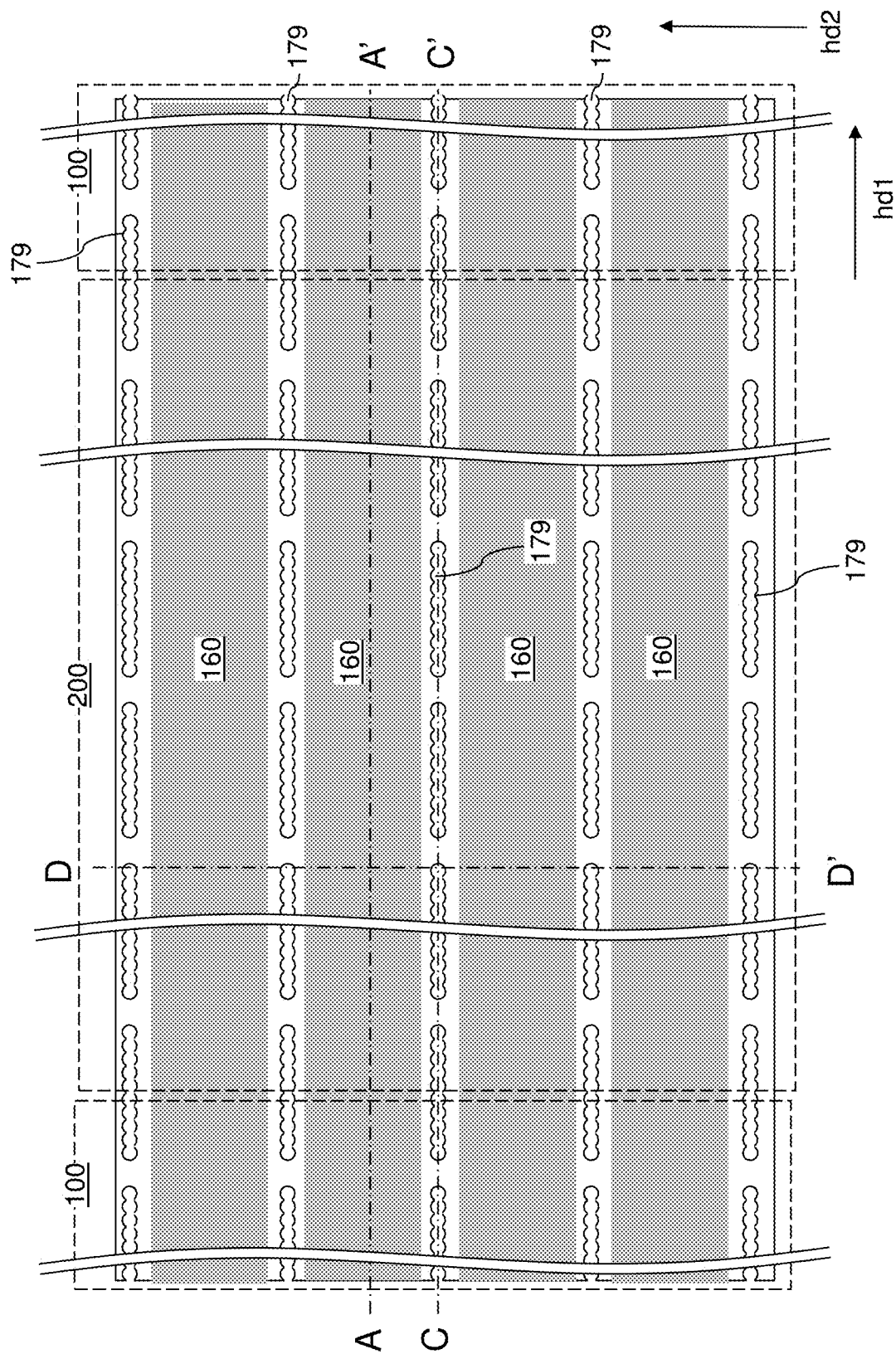
FIG. 16B is a top-down view of the first exemplary structure of FIG. 16A. The vertical plane A-A' is the plane of the vertical cross-sectional view of FIG. 16A.
Figure 16C:
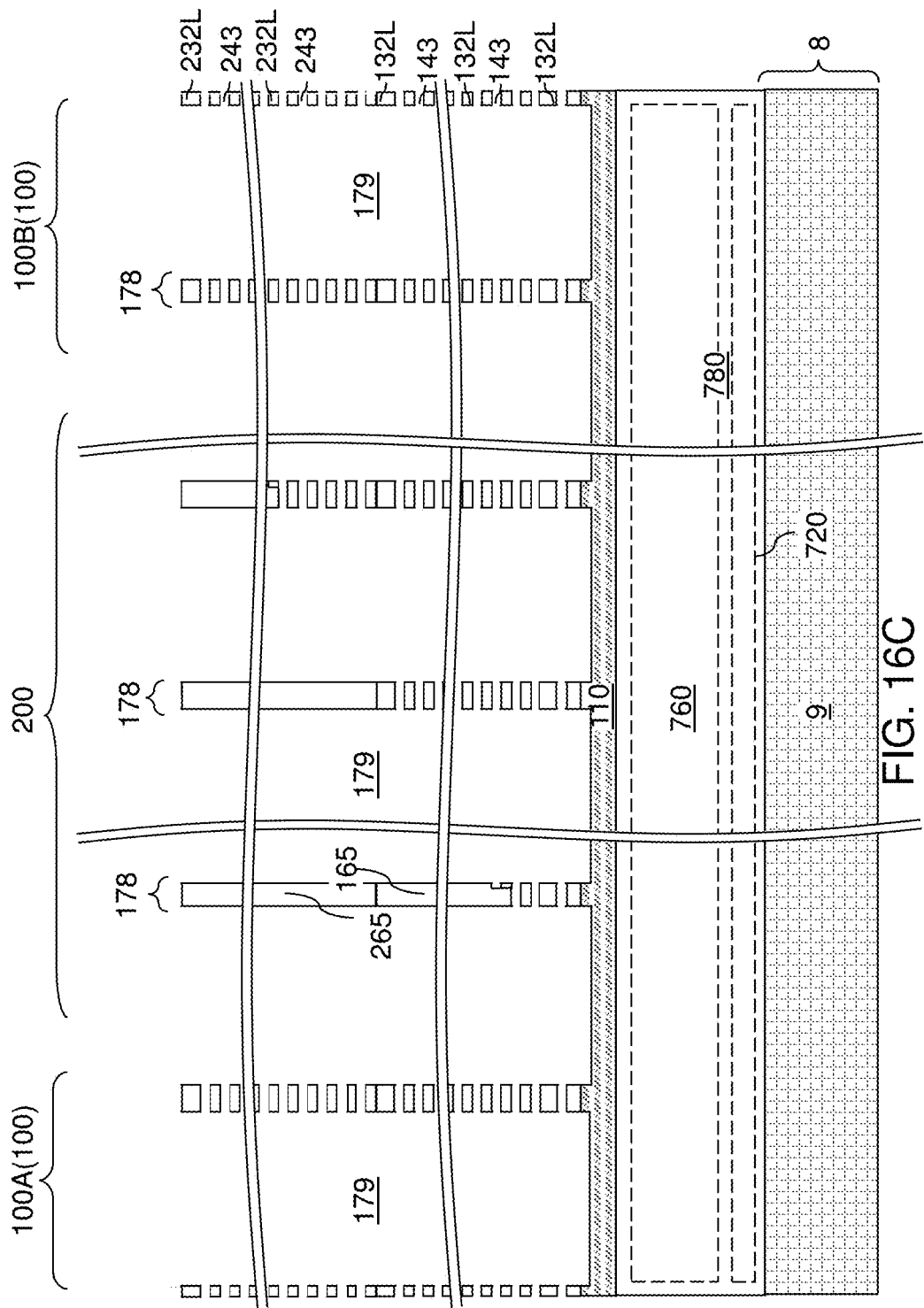
FIG. 16C is a vertical cross-sectional view of the first exemplary structure along the vertical plane C-C' of FIG. 16B.
Figure 16D:
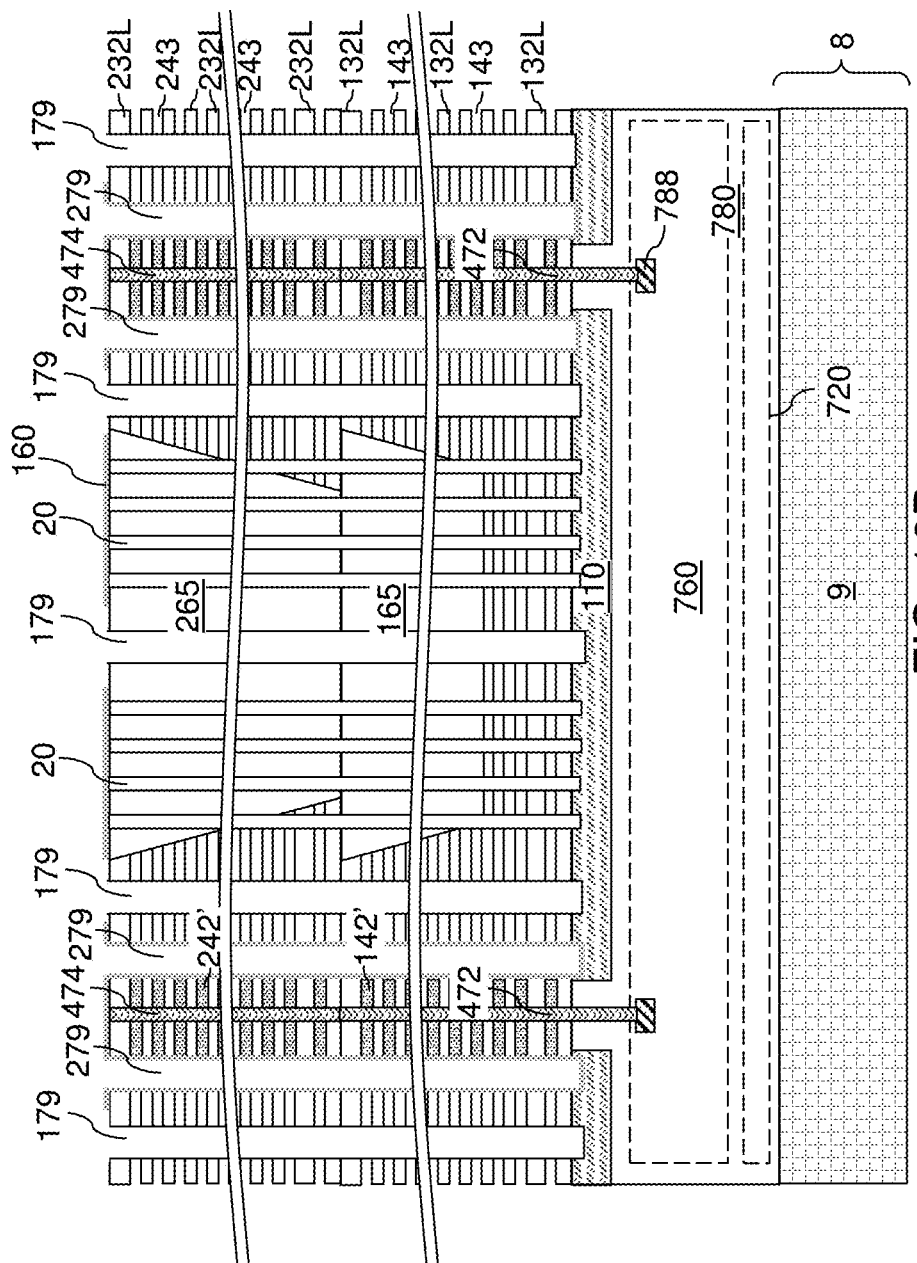
FIG. 16D is a vertical cross-sectional view of the first exemplary structure along the vertical plane D-D' of FIG. 16B.

Referring to FIG. 7, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second continuous sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second continuous sacrificial material layers 242L can have the same material composition and the same thickness as the first sacrificial material layers 142L.

Generally, at least one vertically alternating sequence of continuous insulating layers (132L, 232L) and continuous sacrificial material layers (142L, 242L) can be formed over a substrate 8. In some embodiments, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Second stepped surfaces can be formed within the inter-array region 200 simultaneously. The areas of the second stepped surfaces are laterally offset from respective proximal first stepped surfaces along the first horizontal direction hd1 so that a set of first stepped surfaces and a set of second stepped surfaces that are laterally spaced along the first horizontal direction hd1 and are not offset along the second horizontal direction hd2 can provide a continuously ascending staircase or a continuously descending staircase. For example, a hard mask layer (not shown) such as a metallic or dielectric mask material layer can be formed over the second vertically alternating sequence, and can be patterned to form multiple rectangular openings that are laterally offset from a respective first-tier retro-stepped dielectric material portion 165 along the first horizontal direction hd1 and are aligned to (i.e., not laterally offset from) the respective first-tier retro-stepped dielectric material portion 165 along the second horizontal direction hd2. The areas of openings within the hard mask layer correspond to areas in which second stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd1, and may be alternately staggered along the second horizontal direction hd2. Thus, upon sequentially numbering the rectangular openings along the second horizontal direction hd2, every odd-numbered rectangular opening through the hard mask layer can be formed as a first one-dimensional array arranged along the second horizontal direction hd2 and aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the second vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most distal from the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective second stepped surfaces that is most distal from one of the memory array regions 100.

The second stepped surfaces can be formed within the rectangular openings in the hard mask layer by iteratively performing a set of layer patterning processing steps as many times as the total number of second continuous sacrificial material layers 242L within the second vertically alternating sequence less 1. The set of layer patterning processing steps comprises an anisotropic etch process that etches unmasked portions of a pair of a second continuous insulating layer 232L and a second continuous sacrificial material layer 242L, and a mask trimming process in which the trimmable mask layer is isotropically trimmed to provide shifted sidewalls that are shifted away from the most proximal memory array region 100. A final anisotropic etch process can be performed after the last mask trimming process, and the trimmable mask layer can be removed, for example, by ashing. The hard mask layer can be removed selective to the materials of the second vertically alternating sequence (232L, 242L), for example, by an isotropic etch process (such as a wet etch process).

A second stepped cavity can be formed within each area of the rectangular opening in the hard mask layer. Each second stepped cavity can include a cliff region in which a tapered sidewall of the second vertically alternating sequence vertically extends from the bottommost layer of the second vertically alternating sequence (232L, 242L) to the topmost layer of the second vertically alternating sequence (232L, 242L). Each second stepped cavity has respective second stepped surfaces as stepped bottom surfaces. Each second stepped cavity has a pair of stepped sidewalls that laterally extend along the first horizontal direction hd1. Each stepped sidewall of the second stepped cavity adjoins the second stepped surfaces at the bottom edge, and extends to the top surface of the topmost layer of the second vertically alternating sequence (232L, 242L). Each second stepped cavity defines the lateral extent of respective second stepped surfaces.

The array of second staircase regions can be arranged along the second horizontal direction hd2 with an alternating lateral offsets along the first horizontal direction hd1 to provide a staggered configuration for the second staircase regions. In other words, upon sequentially numerically labeling the second staircase regions with positive integers starting with 1 along the second horizontal direction hd2, every even-numbered second staircase region may be closer to the first memory array region 100A than to the second memory array region 100B, and every odd-numbered second staircase region may be closer to the second memory array region 100B than to the first memory array region 100A. The second stepped cavities can extend through each layer within the second vertically alternating sequence (232L, 242L).

A second dielectric fill material (such as undoped silicate glass or a doped silicate glass) can be deposited in each second stepped cavity and in each well. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second stepped cavity constitutes a second-tier retro-stepped dielectric material portion 265. Thus, the second-tier retro-stepped dielectric material portions 265 are formed through the second vertically alternating sequence (232L, 242L).

Referring to FIGS. 8A-8D, various second-tier openings may be formed through the second vertically alternating sequence (232L, 242L). A photoresist layer (not shown) may be applied over the second vertically alternating sequence (232L, 242L), and may be lithographically patterned to form various openings therethrough. The pattern of openings in the photoresist layer may be the same as the pattern of the first-tier openings (41, 21, 171, 271, 471). The pattern of the openings in the photoresist layer can be transferred through the second vertically alternating sequence (232L, 242L) by a second anisotropic etch process to form the various second-tier openings (43, 23, 173, 273, 473) concurrently, i.e., during the second isotropic etch process.

The various second-tier openings (43, 23, 173, 273, 473) may include second-tier memory openings 43 formed in the memory array regions 100 on a respective one of the sacrificial first-tier memory opening fill structures 42, second-tier support openings 23 formed in the inter-array region 200 on a respective one of the sacrificial second-tier support opening fill structures 22, second-tier backside openings 173 that are formed on a respective one of the first-tier backside opening fill structures 172, second-tier moat-region openings 273 that are formed on a respective one of the first-tier moat opening fill structures 272, and second-tier connection openings 473 that are formed on a respective one of the sacrificial first-tier connection opening fill structures 472. Each cluster of second-tier memory openings 43 may be formed as a two-dimensional array of second-tier memory openings 43. The second-tier support openings 23 are openings that are formed in the inter-array region 200, and are subsequently employed to form support pillar structures. A subset of the second-tier support openings 23 may be formed through a respective horizontal surface of the second stepped surfaces. Second-tier backside openings 173 within each row of second-tier backside openings 173 can be arranged along the first horizontal direction hd1 between neighboring clusters of second-tier memory openings 43. In one embodiment, each row of second-tier backside openings 173 can laterally extend from a distal end of a first memory array region 100A, through an inter-array region 200, and to a distal end of a second memory array region 100B. The second-tier moat-region openings 273 can be formed in the inter-array region 200 in a manner that surrounds a respective area. The second-tier moat-region openings 273 may, or may not, vertically extend through a second retro-stepped dielectric material portion 265. The second-tier connection openings 473 are formed within a respective area that is laterally surrounded by a respective set of second-tier moat-region openings 273.

Referring to FIGS. 9A-9D, a sacrificial second-tier fill material is deposited concurrently deposited in each of the second-tier openings (43, 23, 173, 273, 473). The sacrificial second-tier fill material includes a material that may be subsequently removed selective to the materials of the second continuous insulating layers 232L and the second continuous sacrificial material layers 242L. The sacrificial second-tier fill material can include any material that may be employed for the sacrificial first-tier fill material. The sacrificial second-tier fill material may be the same as, or may be different from, the sacrificial first-tier fill material. The sacrificial second-tier fill material may be deposited by a non-conformal deposition or a conformal deposition method.

Portions of the sacrificial second-tier fill material that remain in the second-tier memory openings 43 comprise sacrificial second-tier memory opening fill structures 44. Portions of the sacrificial second-tier fill material that remain in the second-tier support openings 23 comprise sacrificial second-tier support opening fill structures 24. Portions of the sacrificial second-tier fill material that remain in the discrete second-tier backside openings 173 comprise sacrificial second-tier backside opening fill structures 174. Portions of the sacrificial second-tier fill material that remain in the second-tier moat-region openings 273 comprise sacrificial second-tier moat opening fill structures 274. Portions of the sacrificial second-tier fill material that remain in the second-tier connection openings 473 comprise sacrificial second-tier connection opening fill structures 474.

Referring to FIGS. 10A-10D, a photoresist layer 151 can be applied over the first exemplary structure, and can be lithographically patterned to cover areas of the sacrificial second-tier memory opening fill structures 44, the sacrificial second-tier backside opening fill structures 174, the sacrificial second-tier moat opening fill structures 274, and the sacrificial second-tier connection opening fill structures 474 without covering the areas of the sacrificial second-tier support opening fill structures 24. An etch process can be performed that selectively etches the sacrificial second-tier fill material relative to the materials of the second vertically alternating sequence (232L, 242L) and selectively etches the sacrificial first-tier fill material relative to the materials of the first vertically alternating sequence (132L, 142L). The sacrificial second-tier fill material can be removed from inside the second-tier support openings 23 and from inside the first-tier support openings 21. Voids are formed in the volumes of the second-tier support openings 23 and the first-tier support openings 21. Each contiguous combination of a second-tier support opening 23 and a first-tier support opening 21 constitutes an inter-tier support opening 29, which is also referred to as a support opening. The photoresist layer 151 can be subsequently removed, for example, by ashing.

Referring to FIGS. 11A-11D, a dielectric fill material can be conformally concurrently deposited in each of the support openings 29. The dielectric fill material can include, for example, undoped silicate glass or a doped silicate glass. The dielectric fill material may be formed, for example, by chemical vapor deposition.

Portions of the deposited dielectric fill material may be removed from above the topmost layer of the second vertically alternating sequence (232L, 242L), such as from above the topmost second continuous insulating layer 232L. For example, the dielectric fill material may be recessed to a top surface of the topmost second continuous insulating layer 232L using a planarization process. The planarization process may include a recess etch process, chemical mechanical planarization (CMP), or a combination thereof. The top surface of the topmost second continuous insulating layer 232L may be used as an etch stop layer or a planarization stop layer. Each remaining portion of the dielectric fill material in the support openings 29 constitutes a support pillar structure 20.

A photoresist layer 152 can be applied over the first exemplary structure, and can be lithographically patterned to cover areas of the support pillar structures 20, the sacrificial second-tier backside opening fill structures 174, the sacrificial second-tier moat opening fill structures 274, and the sacrificial second-tier connection opening fill structures 474 without covering the areas of the sacrificial second-tier memory opening fill structures 44. An etch process can be performed that selectively etches the sacrificial second-tier fill material relative to the materials of the second vertically alternating sequence (232L, 242L) and relative to the materials of the first vertically alternating sequence (132L, 142L). The sacrificial second-tier fill material can be removed from inside the second-tier memory openings 43 and from inside the first-tier memory openings 41. Voids are formed in the volumes of the second-tier memory openings 43 and the first-tier memory openings 41. Each contiguous combination of a second-tier memory opening 43 and a first-tier memory opening 41 constitutes an inter-tier memory opening, which is also referred to as a memory opening 49. The photoresist layer 152 can be subsequently removed, for example, by ashing.

Referring to FIG. 12A, an inter-tier memory opening, i.e., a memory opening 49, extending through the second vertically alternating sequence (232L, 242L) and the first vertically alternating sequence (132L, 142L) and into the semiconductor material layer 110 is illustrated.

Referring to FIG. 12B, a stack of layers including a blocking dielectric layer 52, a charge storage layer 54, and a tunneling dielectric layer 56 may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). In one embodiment, the charge storage layer 54 includes a silicon nitride layer. In one embodiment, the continuous sacrificial material layers (142L, 242L) and the continuous insulating layers (132L, 232L) may have vertically coincident sidewalls, and the charge storage layer 54 may be formed as a single continuous layer. Alternatively, the continuous sacrificial material layers (142L, 242L) may be laterally recessed with respect to the sidewalls of the continuous insulating layers (132L, 232L), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

An anisotropic etch process can be performed to remove horizontal portions of the tunneling dielectric layer 56, the charge storage layer 54, and the blocking dielectric layer 52. A surface of the semiconductor material layer 110 can be physically exposed at the bottom of each cavity 49' within each memory opening 49.

A semiconductor channel material layer 60L can be subsequently deposited. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Referring to FIG. 12C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Referring to FIG. 12D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Generally, memory stack structures 55 can be formed through the at least one vertically alternating sequence {(132L, 142L), (232L, 242L)}. Each of the memory stack structures 55 comprises a respective vertical semiconductor channel 60 and a respective vertical stack of memory elements (which may comprise portions of the charge storage layer 54 located at levels of the continuous sacrificial material layers (142L, 242L).

Referring to FIGS. 13A-13D, a photoresist layer 153 can be applied over the first exemplary structure, and can be lithographically patterned to cover areas of the support pillar structures 20, the memory opening fill structures 58, and the sacrificial second-tier connection opening fill structures 474 without covering the areas of the sacrificial second-tier backside opening fill structures 174 or the sacrificial second-tier moat opening fill structures 274. An etch process can be performed that selectively etches the sacrificial second-tier fill material relative to the materials of the second vertically alternating sequence (232L, 242L) and selectively etches the sacrificial first-tier fill material relative to the materials of the first vertically alternating sequence (132L, 142L). The sacrificial second-tier fill material can be removed from inside the second-tier backside openings 173, the first-tier backside openings 171, the second-tier moat-region openings 273, and the first-tier moat-region openings 271. Voids are formed in the volumes of the second-tier backside openings 173, the first-tier backside openings 171, the second-tier moat-region openings 273, and the first-tier moat-region openings 271. Each contiguous combination of a second-tier backside opening 173 and a first-tier backside opening 171 constitutes an inter-tier backside opening, which is also referred to as a backside opening 177. Each contiguous combination of a second-tier moat-region opening 273 and a first-tier moat-region opening 271 constitutes an inter-tier moat-region opening, which is also referred to as a moat-region opening 277. Generally, sacrificial backside opening fill structures (174, 172) are removed from the discrete backside openings (171, 173) after formation of the memory opening fill structures 58.

Referring to FIGS. 14A-14D, the backside openings 177 in each cluster are merged (i.e., connected to each other) by widening the backside openings 177, and the moat-region openings 277 in each cluster are also optionally merged (i.e., connected to each other) by widening the moat-region openings 277. In one embodiment, backside openings 177 can be arranged as clusters in which neighboring backside openings 177 are laterally spaced apart by a nearest neighbor distance. Clusters of the backside openings 177 can be laterally spaced apart by an inter-cluster distance, which is herein referred to as a first inter-opening distance. The first inter-opening distance greater than the nearest neighbor distance between the openings 177 in each cluster. Likewise, moat-region openings 277 can be arranged as clusters in which neighboring moat-region openings 277 are laterally spaced apart by the nearest neighbor distance. Clusters of the moat-region openings 277 can be laterally spaced apart by the inter-cluster distance which is greater than the nearest neighbor distance in each cluster.

The widening of the openings (177, 277) may be performed by recessing of surfaces of the continuous insulating layers (132L, 232L) and the sacrificial material layers (142L, 242L) exposed in each of the openings (177, 277) by performing an etch process. The etch process has an etch chemistry that etches the materials of the continuous insulating layers (132L, 232L) and the sacrificial material layers (142L, 242L). For example, the etch process may be wet isotropic etch process, such as a buffered hydrofluoric acid wet etch. The etching is terminated before the clusters of openings are merged with each other.

Surfaces of the continuous insulating layers (132L, 232L) and the sacrificial material layers (142L, 242L) are laterally recessed around the backside openings 177 by greater than one half of the nearest neighbor distance, but less than one half of the inter-cluster distance, i.e., the first inter-opening distance. The discrete backside openings 177 are laterally expanded and are merged with each other at levels of the continuous insulating layers (132L, 232L) and the sacrificial material layers (142L, 242L) to form a respective backside trench 179. A plurality of backside trenches 179 that are laterally spaced apart by backside bridge regions 178 along the first horizontal direction hd1 are formed from each row of discrete backside openings 177. The moat-region openings 277 are laterally expanded and are merged with each other at levels of the continuous insulating layers (132L, 232L) and the sacrificial material layers (142L, 242L) to form a respective moat trench 279. A plurality of moat trenches 279 that are laterally spaced apart by moat-region bridge regions 278 are formed from each row of moat-region openings 277.

The unetched regions of the continuous insulating layers (132L, 232L) and the sacrificial material layers (142L, 242L) located between the clusters of the backside openings 177 comprise the backside bridge regions 178. The unetched regions of the continuous insulating layers (132L, 232L) and the sacrificial material layers (142L, 242L) located between the clusters of the moat-region openings 277 comprise the moat-region bridge regions 278.

Referring to FIGS. 15A-15D, a masking layer, such as a photoresist and/or hard mask layer is formed over the alternating stacks (132L, 142L, 232L, 242L). For example, the masking layer may comprise a hard mask layer, such as a dielectric etch mask liner 160 which can be formed by conformal deposition and subsequently patterning of a dielectric etch mask material. The dielectric etch mask material may include, for example, silicon oxide or a dielectric metal oxide (such as aluminum oxide). The dielectric etch mask material may be deposited by a conformal deposition process such as a chemical vapor deposition (CVD) process or an atomic layer deposition (ALD) process. The thickness of the dielectric etch mask liner 160 may be in a range from 3 nm to 60 nm, such as from 6 nm to 30 nm, although lesser and greater thicknesses may also be employed. The patterning of the dielectric etch mask liner 160 can be performed, for example, by applying and lithographically patterning the photoresist layer to cover areas of the memory opening fill structures 58, the support pillar structures 20, the moat trenches 279, and the sacrificial second-tier connection opening fill structures 474, while not covering the areas of the backside trenches 179. The pattern in the photoresist layer can be transferred through the dielectric etch mask liner 160 by removing the portions of the dielectric etch mask liner 160 that are not covered by the patterned photoresist layer. An isotropic etch process such as a wet etch process may be employed. The photoresist layer may be subsequently removed, for example, by ashing.

Referring to FIGS. 16A-16D, an isotropic etch process can be employed to remove the continuous sacrificial material layers (142L, 242L) selective to the dielectric etch mask liner 160, the continuous insulating layers (132L, 232L), the support pillar structures 20, the outermost layer of each memory stack structure 58, and the semiconductor material layer 110. In one embodiment, an etchant that selectively etches the materials of the continuous sacrificial material layers (142L, 242L) with respect to the materials the dielectric etch mask liner 160, the continuous insulating layers (132L, 232L), the support pillar structures 20, the blocking dielectric layers 52, and the semiconductor material layer 110 may be introduced into the backside trenches 179 during the isotropic etch process. For example, the continuous sacrificial material layers (142L, 242L) may include silicon nitride, the materials of the dielectric etch mask liner 160, the continuous insulating layers (132L, 232L), the support pillar structures 20, the blocking dielectric layers 52 may include silicon oxide materials, and the isotropic etch process may employ hot phosphoric acid.

Backside recesses (143, 243) are formed in volumes from which the continuous sacrificial material layers (142L, 242L) are removed. The backside recesses (143, 243) include first backside recesses 143 that are formed in volumes from which the first continuous sacrificial material layers 142L are removed and second backside recesses 243 that are formed in volumes from which the second continuous sacrificial material layers 242L are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess.

A plurality of backside recesses (143, 243) may be formed in the volumes from which the material of the continuous sacrificial material layers (142L, 242L) is removed. Each of the backside recesses (143, 243) may extend substantially parallel to the top surface of the semiconductor material layer 10. A backside recess (143, 243) may be vertically bounded by a top surface of an underlying continuous insulating layer (132L, 232L) and a bottom surface of an overlying continuous insulating layer (132L, 232L). In one embodiment, each of the backside recesses (143, 243) may have a uniform height throughout.

Generally, the backside recesses (143, 243) can be formed by removing the patterned portions of the first continuous sacrificial material layers 142L and the second continuous sacrificial material layers 242L selective to the first continuous insulating layers 132L and the second continuous insulating layers 232L after formation of the backside trenches 179, the moat trenches 279, and the dielectric etch mask liner 160. The backside recesses (143, 243) can be formed by performing an isotropic etch process that supplies an isotropic etchant that etches the first continuous sacrificial material layers 142L and the second continuous sacrificial material layers 242L selective to the first continuous insulating layers 132L and the second continuous insulating layers 232L and selective to the support pillar structures 20. The support pillar structures 20 are physically exposed to the backside recesses (143, 243) after the isotropic etch process. The support pillar structures 20 vertically support the vertically spaced apart continuous insulating layers (132L, 232L). The bridge regions (178, 278) laterally support the remaining alternating stacks and prevent them from toppling or leaning into the respective trenches (197, 279).

Portions of the first continuous sacrificial material layers 142L that are laterally surrounded by the dielectric etch mask liner 160 are not etched by the isotropic etch process, and are herein referred to as first dielectric material plates 142'. Portions of the second continuous sacrificial material layers 242L that are laterally surrounded by the dielectric etch mask liner 160 are not etched by the isotropic etch process, and are herein referred to as second dielectric material plates 242'. A set of moat trenches 279 that laterally surround vertical stacks of a sacrificial second-tier connection opening fill structure 474 and a sacrificial first-tier connection opening fill structure 274 can be interconnected at the levels of the backside recesses (143, 243) to provide one contiguous moat trench 279 or plural moat trenches 279 that at least partially laterally surround a vertical stack of dielectric material plates (142', 242').

Referring to FIGS. 17A-17D, the dielectric etch mask liner 160 may be optionally removed. An optional backside blocking dielectric layer (not shown) may be optionally deposited in the backside recesses (143, 243), at peripheral portions of the backside trenches 179 and the moat trenches 279. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), at peripheral regions of the backside trenches 179 and the moat trenches 279. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 179. Each of the first electrically conductive layers 146 and the second electrically conductive layers 246 may include a respective conductive metallic nitride liner and a respective conductive fill material. Thus, the first and second continuous sacrificial material layers (142L, 242L) may be replaced with the first and second electrically conductive layers (146, 246), respectively. Specifically, each first continuous sacrificial material layer 142L may be replaced with an optional portion of the backside blocking dielectric layer and a first electrically conductive layer 146, and each second continuous sacrificial material layer 242L may be replaced with an optional portion of the backside blocking dielectric layer and a second electrically conductive layer 246. A backside cavity is present in the portion of each backside trench 179 that is not filled with the continuous metallic material layer.

Residual conductive material may be removed from inside the backside trenches 179 and from inside the moat trenches 279, and from above the topmost second continuous insulating layer 232L by an anisotropic process and/or an isotropic etch process. Each remaining portion of the deposited metallic material in the first backside recesses constitutes a first electrically conductive layer 146. Each remaining portion of the deposited metallic material in the second backside recesses constitutes a second electrically conductive layer 246.

According to an aspect of the present disclosure, sidewalls of the first electrically conductive layers 146 and the second electrically conductive layers 246 can be isotropically recessed from around the backside trenches 179 selective to the materials of the first continuous insulating layers 132L and the second continuous insulating layers 232L. The lateral recess distance of the isotropic recess process that laterally recesses the sidewalls of the first electrically conductive layers 146 and the second electrically conductive layers 246 can be selected such that the first electrically conductive layers 146 and the second electrically conductive layers 256 are laterally disjoined from each other along the second horizontal direction hd2 at each row of backside trenches 179 that are arranged along the first horizontal direction hd1. In other words, the lateral recess distance of the isotropic etch process is at least one half of the nearest neighbor distance among the backside trenches 179 that are arranged in a row along the first horizontal direction hd1. Thus, the lateral extent of each of the first electrically conductive layers 146 and the second electrically conductive layers 246 along the second horizontal direction hd2 is not greater than the pitch of the rows of the backside trenches 179 along the second horizontal direction hd2.

Figure 17A:
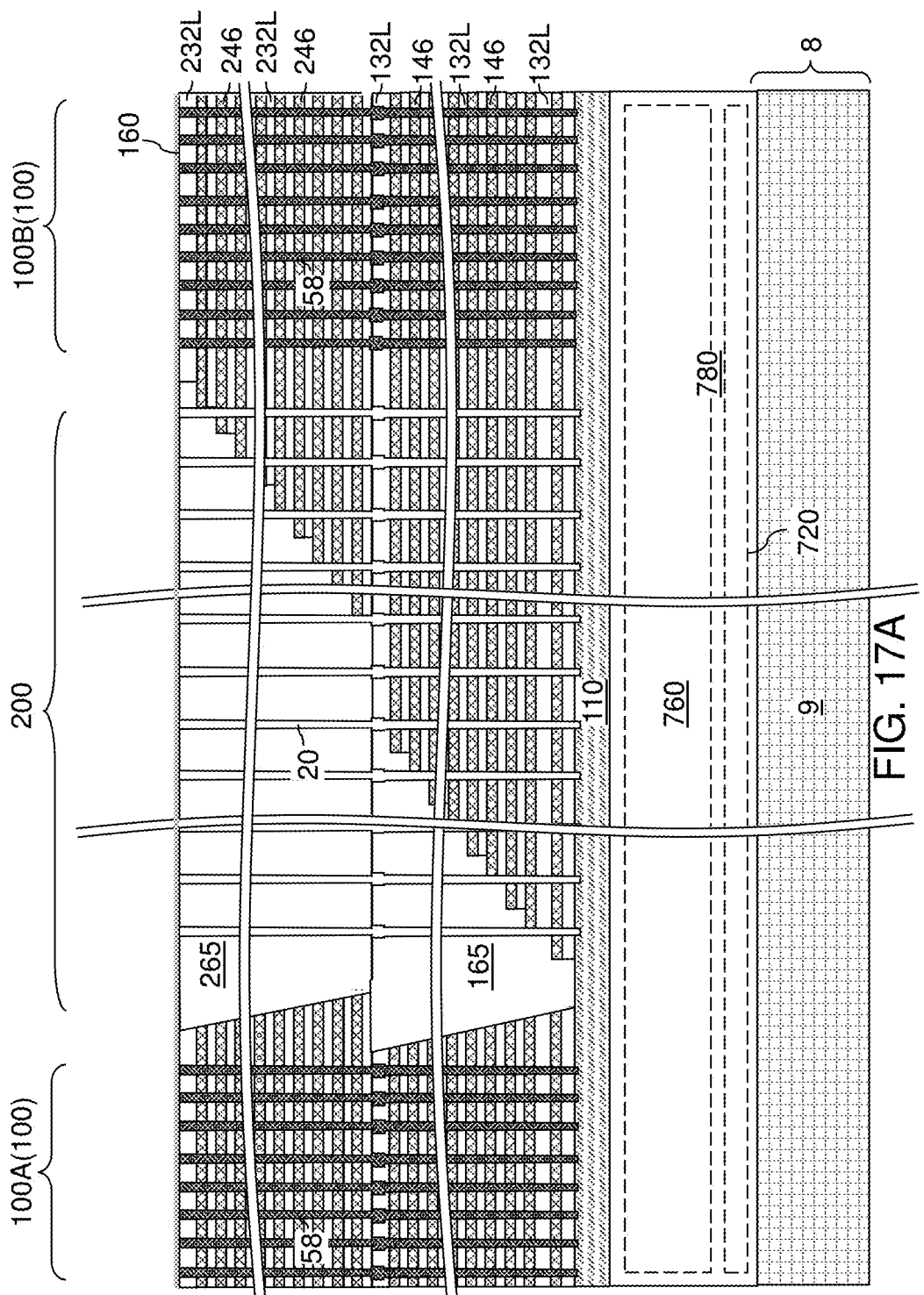
FIG. 17A is a vertical cross-sectional view of the first exemplary structure after formation of electrically conductive layers according to the first embodiment of the present disclosure.
Figure 17B:
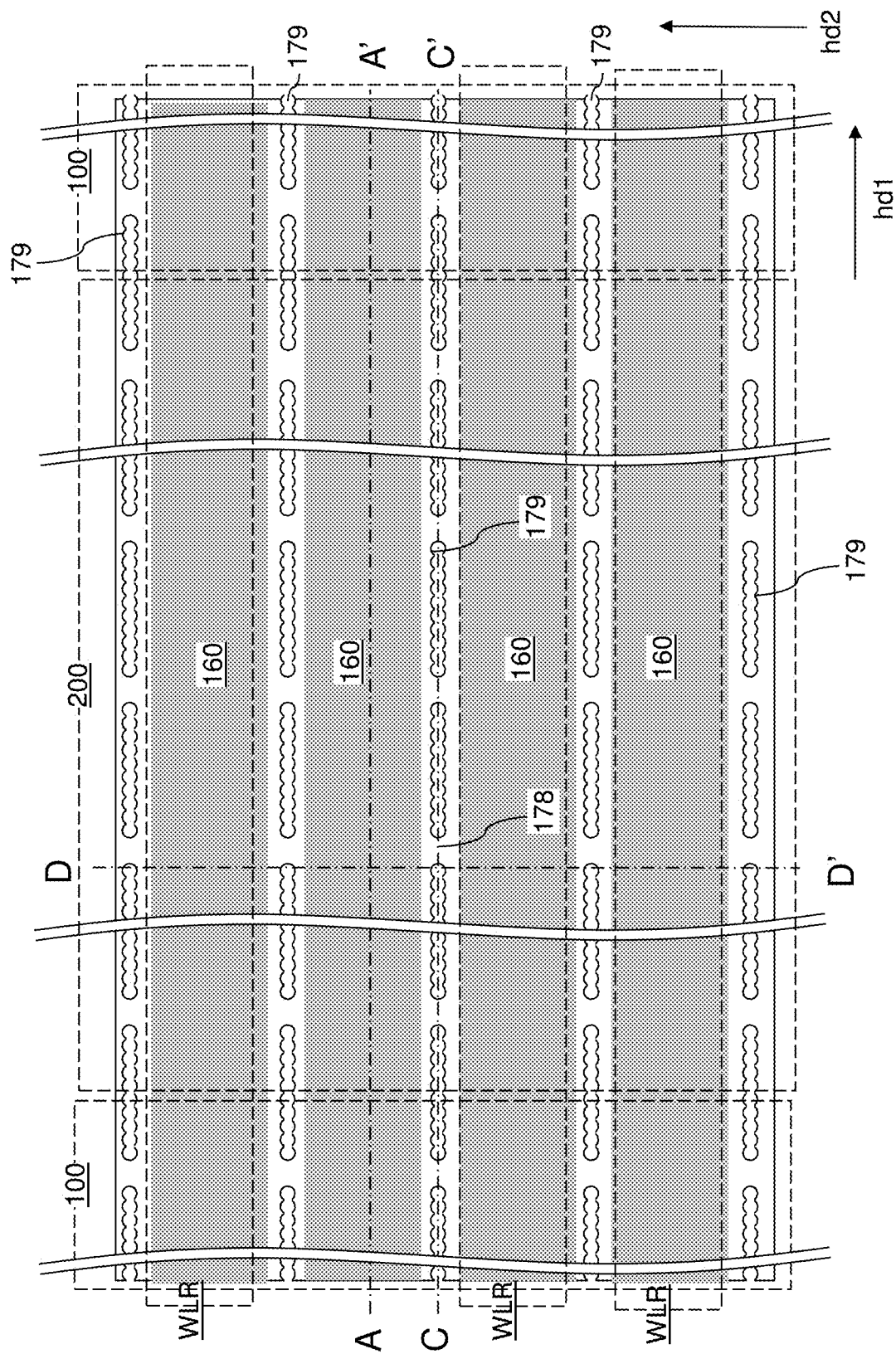
FIG. 17B is a top-down view of the first exemplary structure of FIG. 17A. The vertical plane A-A' is the plane of the vertical cross-sectional view of FIG. 17A.
Figure 17D:
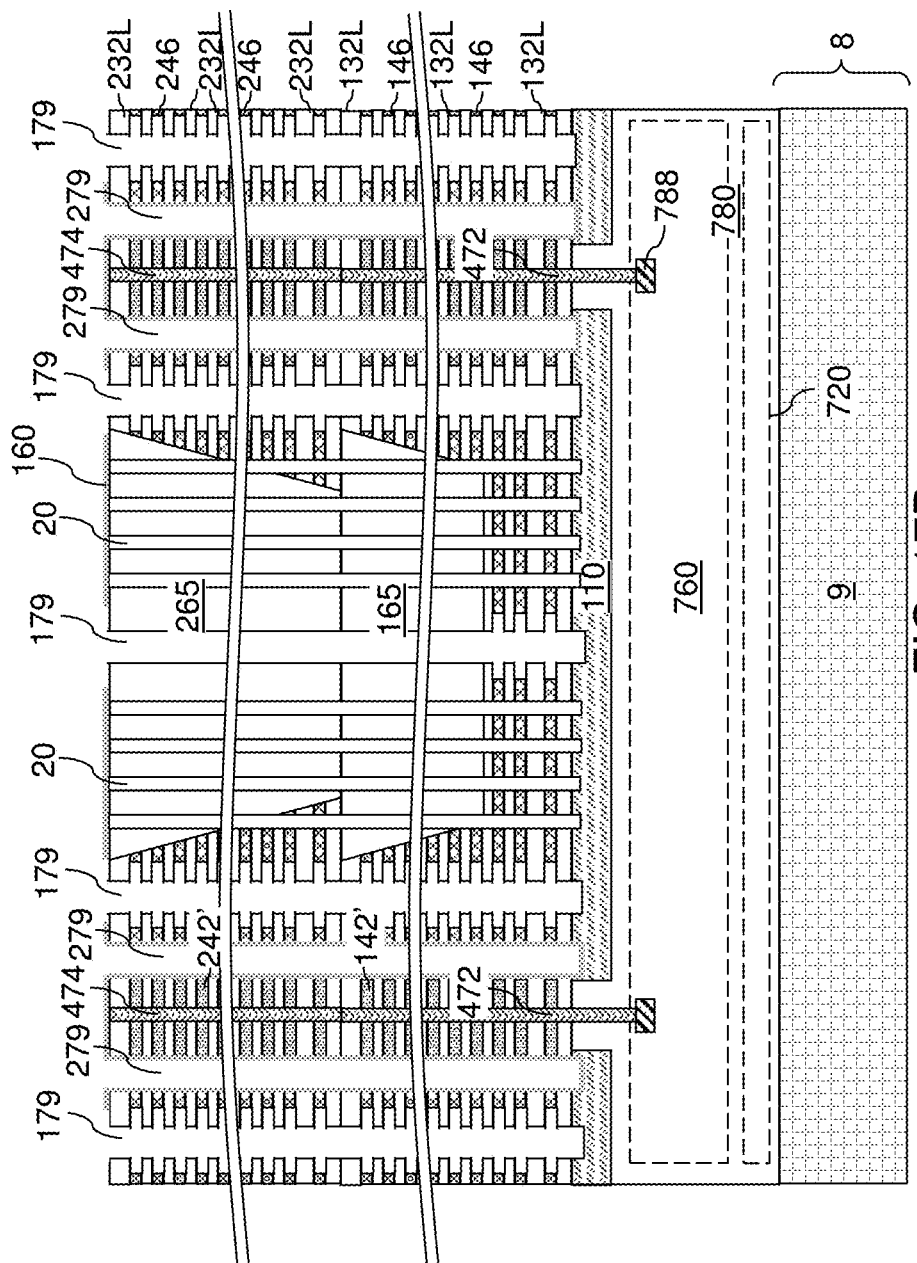
FIG. 17D is a vertical cross-sectional view of the first exemplary structure along the vertical plane D-D' of FIG. 17B.

Therefore, the electrically conductive layers (146, 246) are removed from the bridge regions 178 and the recesses (143, 243) are reformed between the insulating material layers (132L, 232L) in the bridge regions 178, as shown in FIG. 17C. There are no short circuits in the backside bridge regions 178 between the electrically conductive layers (146, 246) (e.g., word lines) of adjacent word line regions WLR (e.g., memory blocks) which are separated by the laterally alternating backside trenches 179 and backside bridge regions 178, as shown in FIG. 17B. In other words, the continuous insulating material layers (132L, 232L) are located in the backside bridge regions 178, but the electrically conductive layers (e.g., word lines) are not present in the backside bridge regions 178. The continuous insulating material layers are vertically separated from each other by air gaps (i.e., the backside recesses 143, 243) at this step in the process. The backside bridge regions 178 (shown in FIG. 17C) which are located between two backside trenches 179 along the first horizontal direction (e.g., word line direction) hd1 and between two staircase regions along the second horizontal direction (e.g., bit line direction) hd2 prevent the alternating stacks from collapsing into or tilting away from the backside trenches 179, as shown in FIG. 17D.

A subset of the electrically conductive layers (146, 246) may comprise word lines for the memory elements. One or more topmost and bottommost electrically conductive layers may comprise select gate electrodes. The semiconductor devices in the underlying semiconductor devices 720 may comprise word line switch devices configured to control a bias voltage to respective word lines, and/or bit line driver devices, such as sense amplifiers.

Generally, at least one electrically conductive material can be deposited in the backside recesses (143, 243) to form electrically conductive layers (146, 246) in the backside recesses (143, 243). The at least one electrically conductive material of the electrically conductive layers (146, 246) can be laterally recessed from around the backside trenches 179 by a lateral recess distance employing an isotropic etch back process. The electrically conductive layers (146, 246) comprise remaining portions of the at least one electrically conductive material after the isotropic etch back process, and each subset of electrically conductive layers (146, 246) located at a same vertical distance from the substrate 8 comprise a respective plurality of electrically conductive layers (146, 246) that are disjoined (i.e., not in direct contact with) among one another and laterally spaced apart along a second horizontal direction hd2 that is perpendicular to the first horizontal direction hd1. In one embodiment, each of the electrically conductive layers (146, 246) comprises a respective set of vertically straight and laterally concave sidewall segments that are adjoined to each other at vertical edges.

Each region in which electrically conductive layers (146, 246) are present in a top-down view (i.e., a plan view of FIG. 17B) is herein referred to as a word-line region WLR. The word-line regions WLR are located between each neighboring pair of rows of backside trenches 179. An alternating stack of a subset of the electrically conductive layers (146, 246) and portions of the continuous insulating layers (132L, 232L) is present within each of the word-line regions WLR. The memory stack structures 55 vertically extending through a respective vertical stack of electrically conductive layers (146, 246) within a respective one of the word-line regions WLR. Each of the continuous insulating layers (132L, 232L) laterally extend over each of the word-line regions WLR as a continuous material layer with discrete openings between the word-line regions WLR. The backside trenches 179 located within a same row of backside trenches 179 arranged along the first horizontal direction hd1 are interconnected among one another due to the lateral recesses (143, 243) that are reformed at the levels of the electrically conductive layers (146, 246), and thus, form a single contiguous interconnected air gap volume by laterally-extending cavities located at the levels of the electrically conductive layers (146, 246). The contiguous volume including multiple backside trenches 179 vertically extends between laterally neighboring pairs of electrically conductive layers (146 or 246) located between a neighboring pair of word-line regions WLR (and thus, laterally spaced apart along the second horizontal direction (e.g., bit line direction) hd2) and through a respective subset of the discrete openings in the continuous insulating layers (132L, 232L) (thereby interconnecting sets of discrete openings within each of the continuous insulating layers (132L, 232L) that are located within the area of a row of backside trenches 179). The discrete openings in the continuous insulating layers comprise first discrete openings (such as the backside trenches 179), each of which comprises a pair of laterally undulating sidewalls that generally extend along the first horizontal direction hd1 and having a lateral undulation along a second horizontal direction hd2 that is perpendicular to the first horizontal direction hd1 and comprising multiple vertically straight and laterally convex sidewall segments that are adjoined to each other.

Each of the continuous insulating layers (132L, 232L) comprises connection portions located in the backside bridge regions 178 between a respective neighboring pair of backside trenches 179 that are laterally spaced apart along the first horizontal direction hd1. The connection portions function as bridges between neighboring pairs of backside trenches 179 and provide structural support during replacement of the continuous sacrificial material layers (142L, 242L) with electrically conductive layers (146, 246). Generally, the lateral recess distance of the isotropic recess etch process that laterally recesses the sidewalls of the electrically conductive layers (146, 246) is greater than one half of a minimum width of the connections portions along the first horizontal direction hd1, which ensures that the electrically conductive layers (146, 246) are physically disconnected between each neighboring pair of word-line regions WLR.

Referring to FIGS. 18A-18D, a dielectric fill material can be deposited in the backside trenches 179 and the moat trenches 279. Excess portions of the dielectric fill material can be removed from above the horizontal plane including the top surface of the topmost layer among the second continuous insulating layers 232L. Backside trench fill structures comprising a dielectric material can be formed in each of the backside trenches. The backside trench fill structures are herein referred to as continuous dielectric wall structures 176. Dielectric moat trench fill structures 276 are formed in the moat trenches 279. The continuous dielectric wall structures 176 alternate along the first horizontal direction hd1 with the backside bridge regions 178.

Figure 18A:
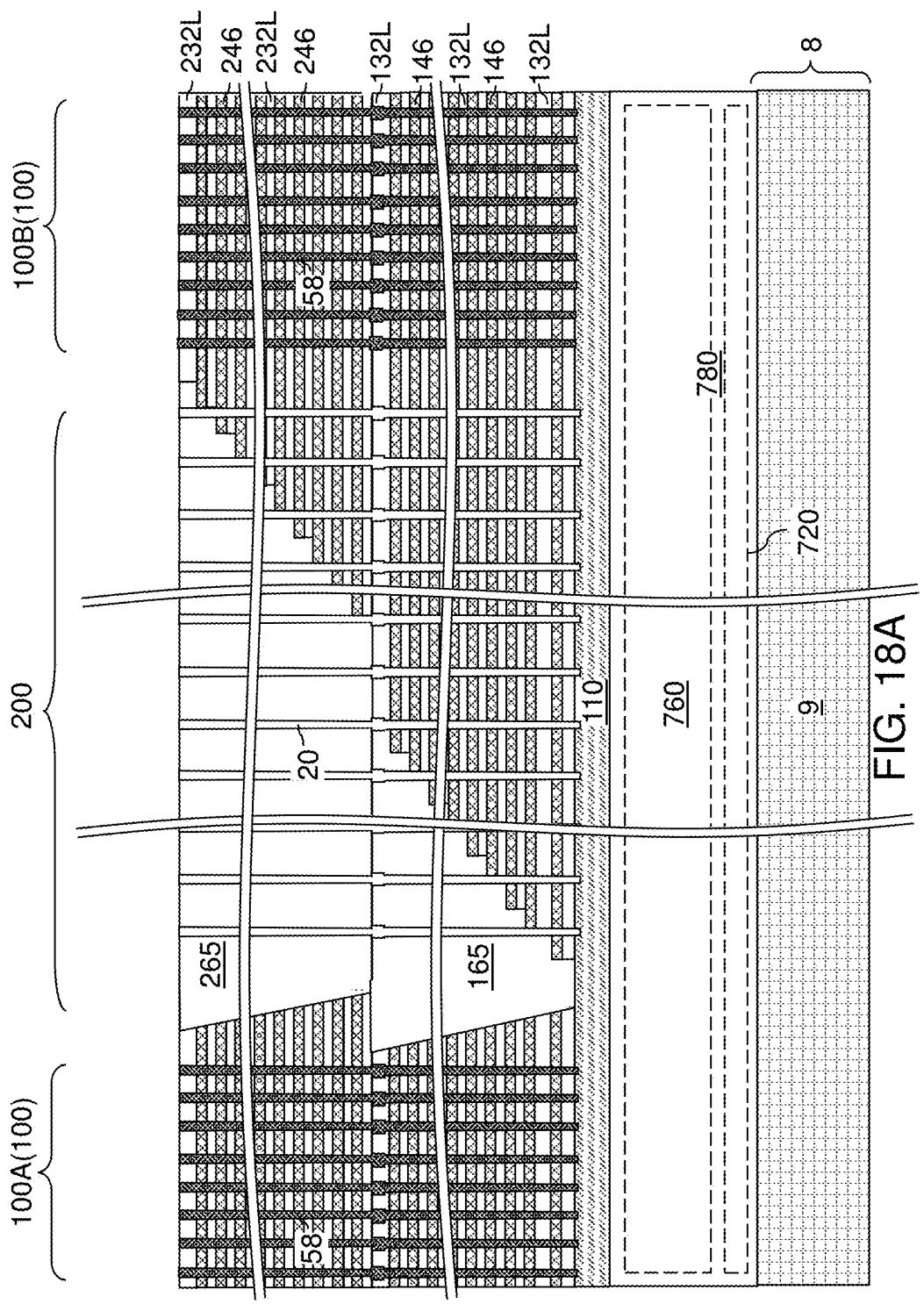
FIG. 18A is a vertical cross-sectional view of the first exemplary structure after formation of backside trench fill structures and moat trench fill structures according to the first embodiment of the present disclosure.
Figure 18B:
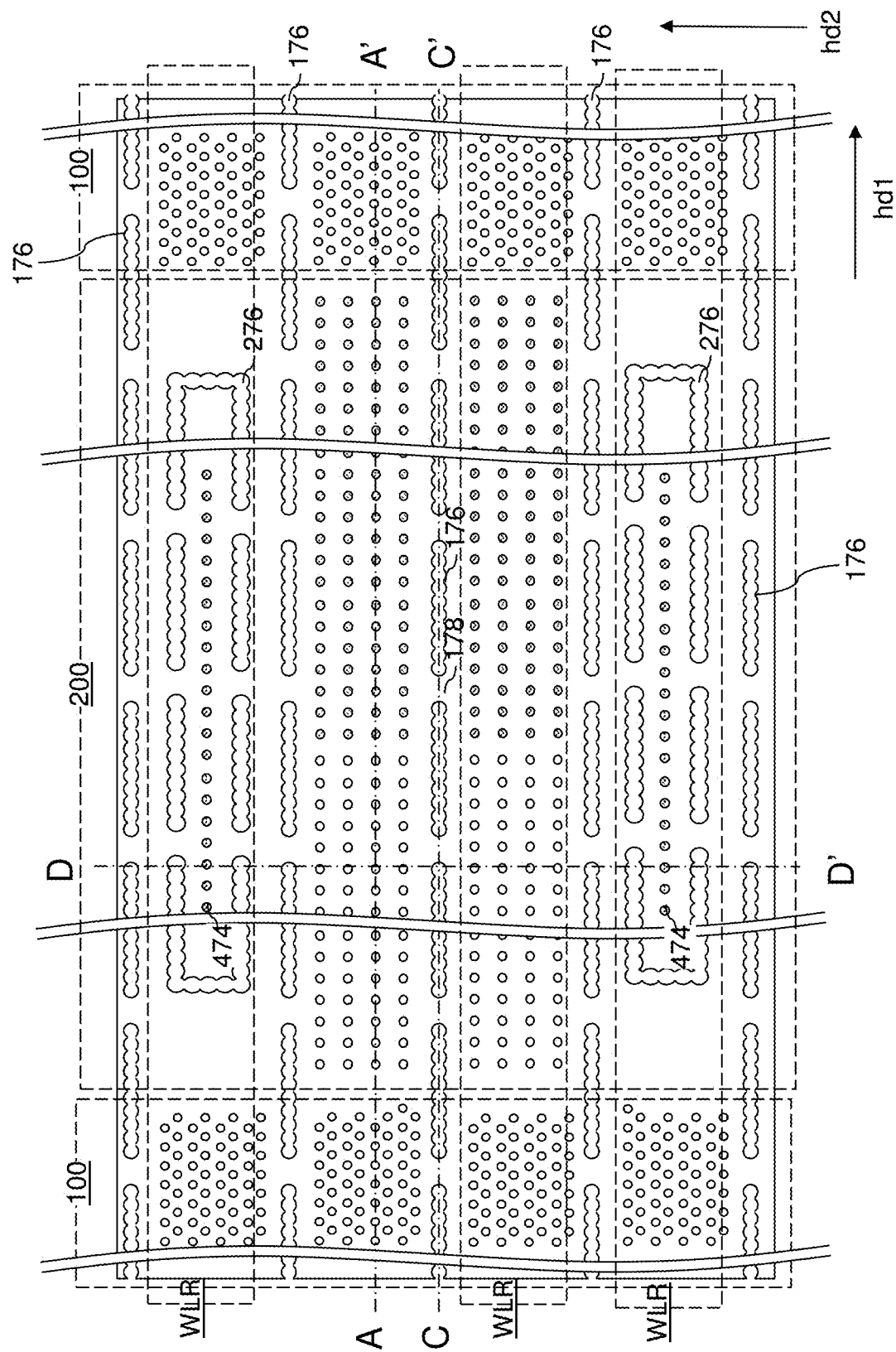
FIG. 18B is a top-down view of the first exemplary structure of FIG. 18A. The vertical plane A-A' is the plane of the vertical cross-sectional view of FIG. 18A.
Figure 18C:
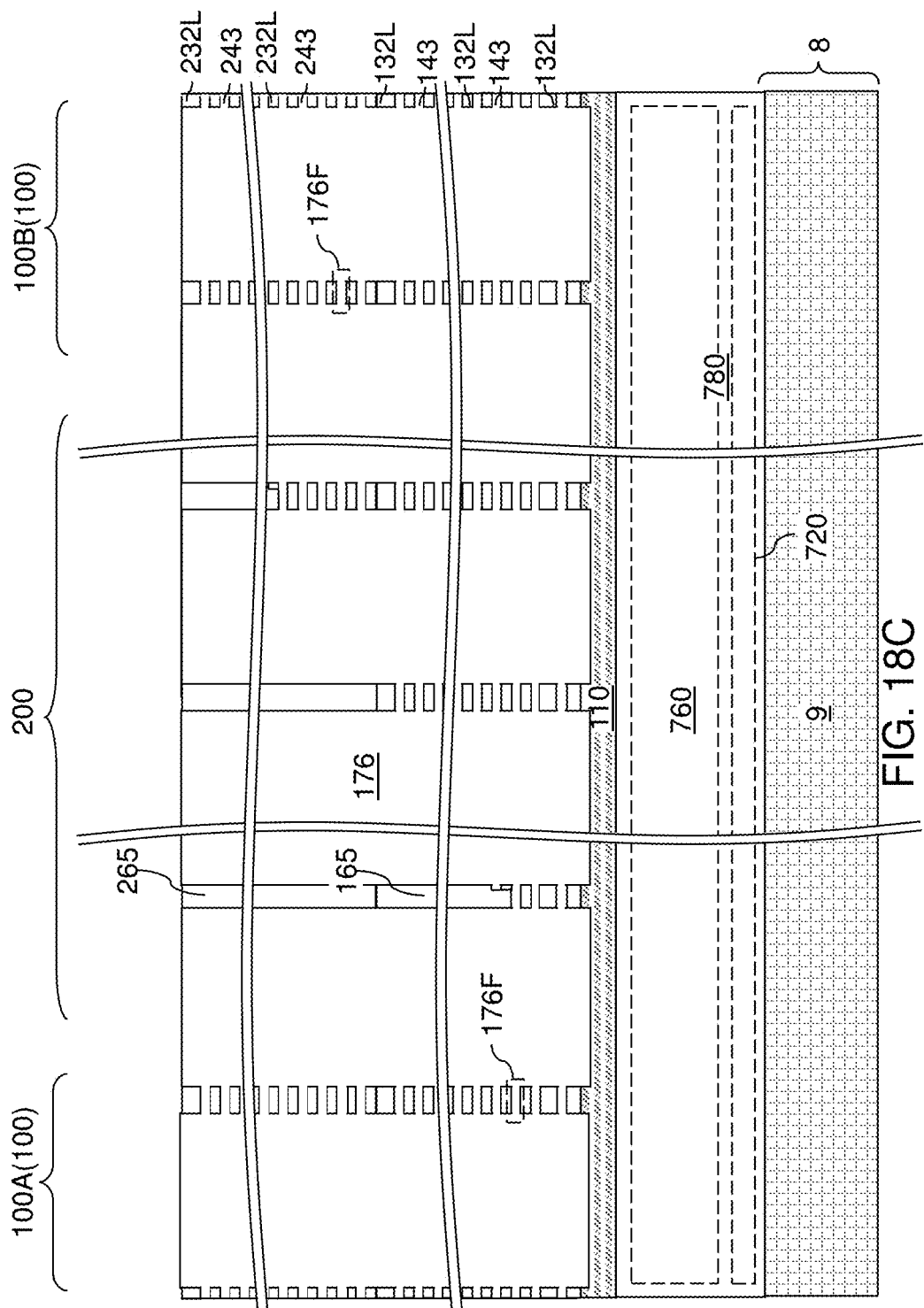
FIG. 18C is a vertical cross-sectional view of the first exemplary structure along the vertical plane C-C' of FIG. 18B.
Figure 18D:
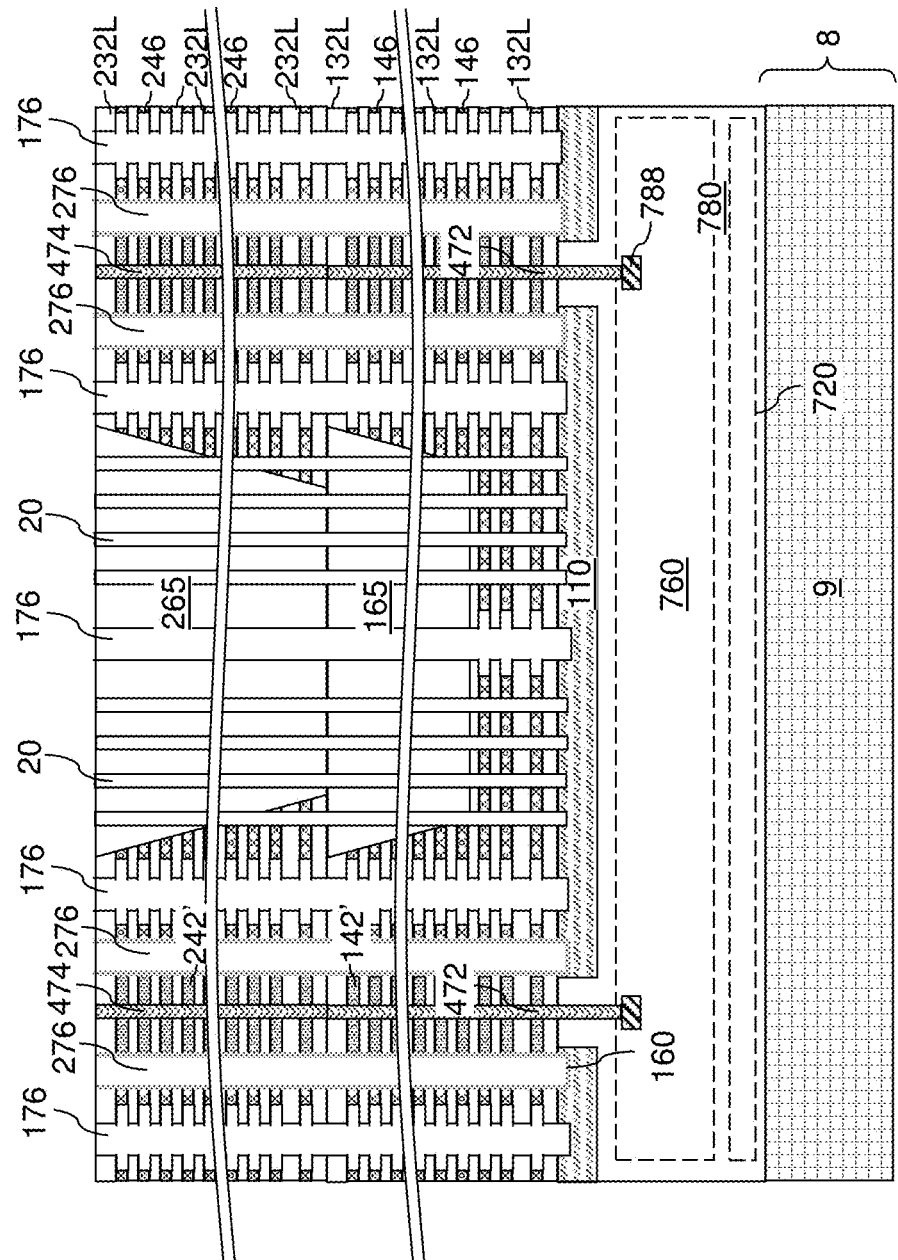
FIG. 18D is a vertical cross-sectional view of the first exemplary structure along the vertical plane D-D' of FIG. 18B.

In one embodiment, each of the continuous dielectric wall structures 176 comprises dielectric fin portions 176F at each level of the electrically conductive layers (146, 246) that laterally protrude outward relative to a respective overlying continuous insulating layer (132L or 232L) and relative to a respective underlying continuous insulating layer (132L or 232L), as shown in FIG. 18C. The dielectric fin portions 176F may be formed by filling the backside recesses (i.e., air gaps) (142, 242) with the dielectric material of the continuous dielectric wall structures 176. In this embodiment, the backside bridge regions 178 comprise an alternating stack of vertically alternating insulating layers (132L, 232L) and dielectric fin portions 176F, as shown in FIG. 18C.

Referring to FIGS. 19A-19D, contact via cavities vertically extending to a top surface of a respective one of the electrically conductive layers (146, 246) can be formed through the retro-stepped dielectric material portions (165, 265), for example, by applying a photoresist layer over the first exemplary structure, lithographically patterning the photoresist layer, and by transferring the pattern in the photoresist layer through the retro-stepped dielectric material portions (165, 265). The photoresist layer can be subsequently removed, for example, by ashing. The sacrificial through-memory-level opening fill structures (472, 274) can be removed selective to the materials of the continuous insulating layers (132L, 232L), the dielectric material plates (142', 242'), and the landing-pad-level metal interconnect structures 788. Through-memory-level connection via structures 488 can be formed by depositing at least one conductive material in the voids formed by removal of the sacrificial through-memory-level opening fill structures (472, 274). Layer contact via structures 86 can be formed by depositing the at least one conductive material in the contact via cavities. Bit lines (not shown for clarity) may then be formed in electrical contact with the drain regions 63. The bit lines may extend along the second horizontal direction hd2 which is perpendicular to the word line direction hd1.

Figure 19A:
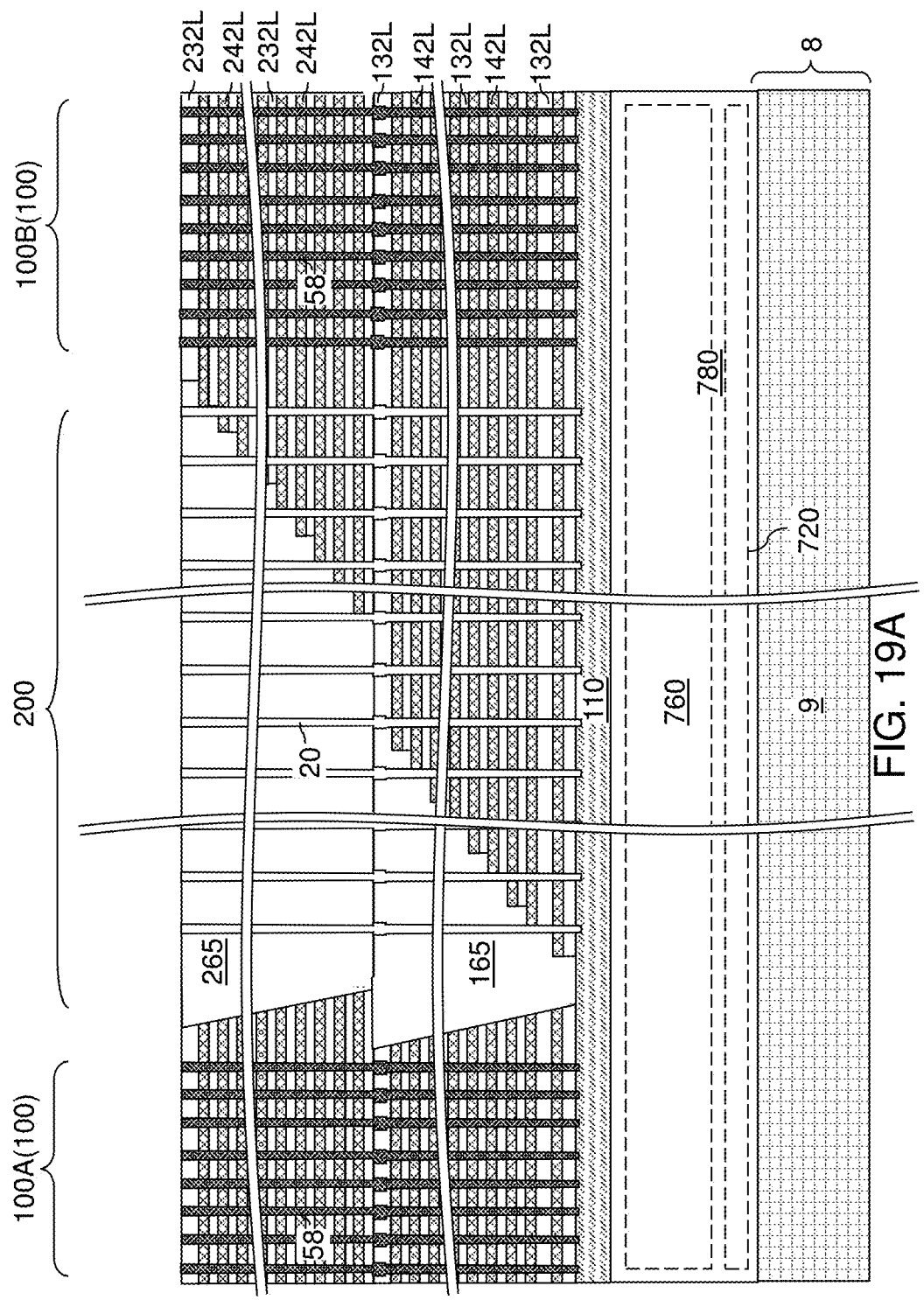
FIG. 19A is a vertical cross-sectional view of the first exemplary structure after replacement of sacrificial through-memory-level opening fill structures with through-memory-level connection via structures according to the first embodiment of the present disclosure.
Figure 19B:
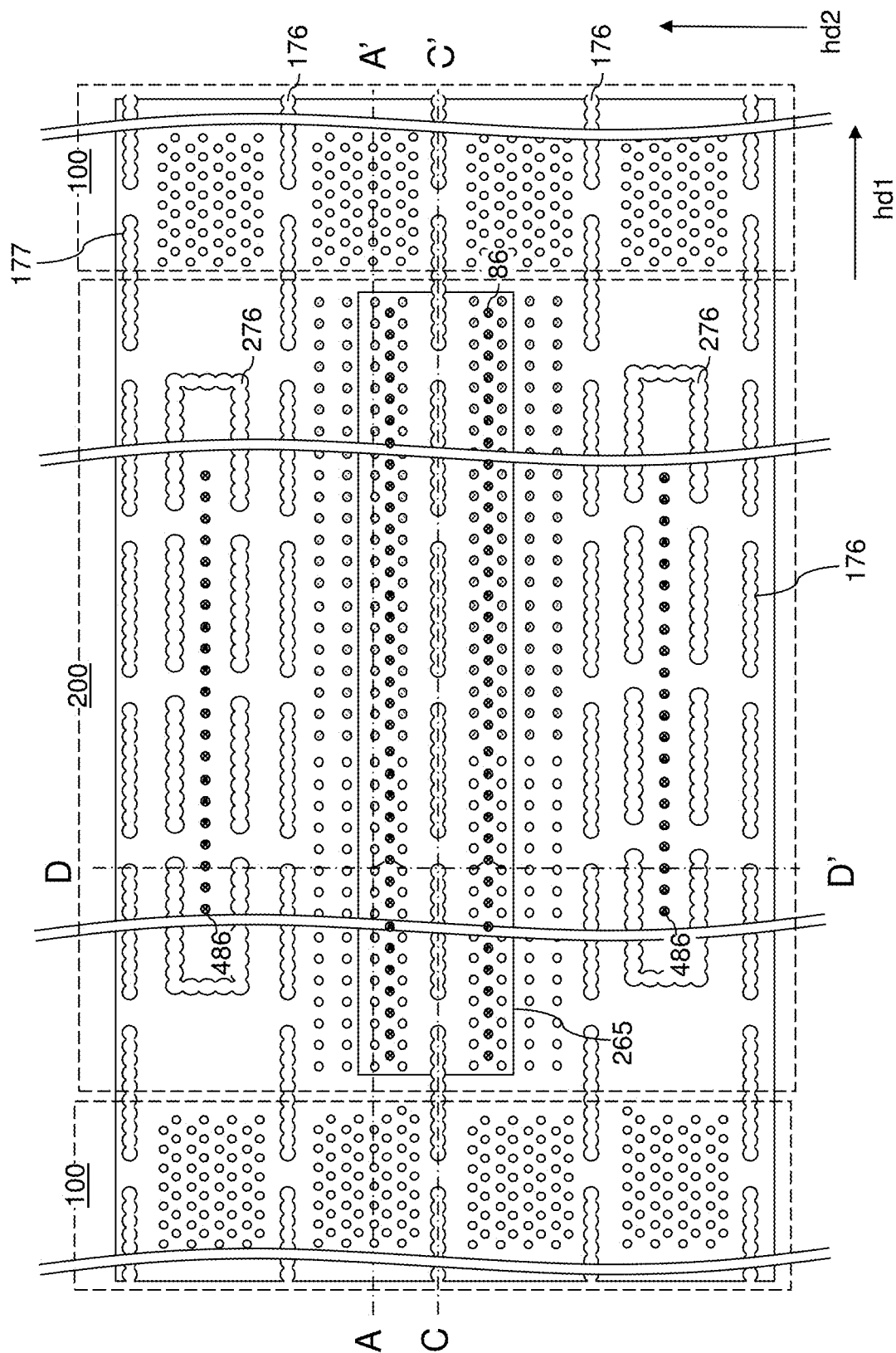
FIG. 19B is a top-down view of the first exemplary structure of FIG. 19A. The vertical plane A-A' is the plane of the vertical cross-sectional view of FIG. 19A.
Figure 19C:
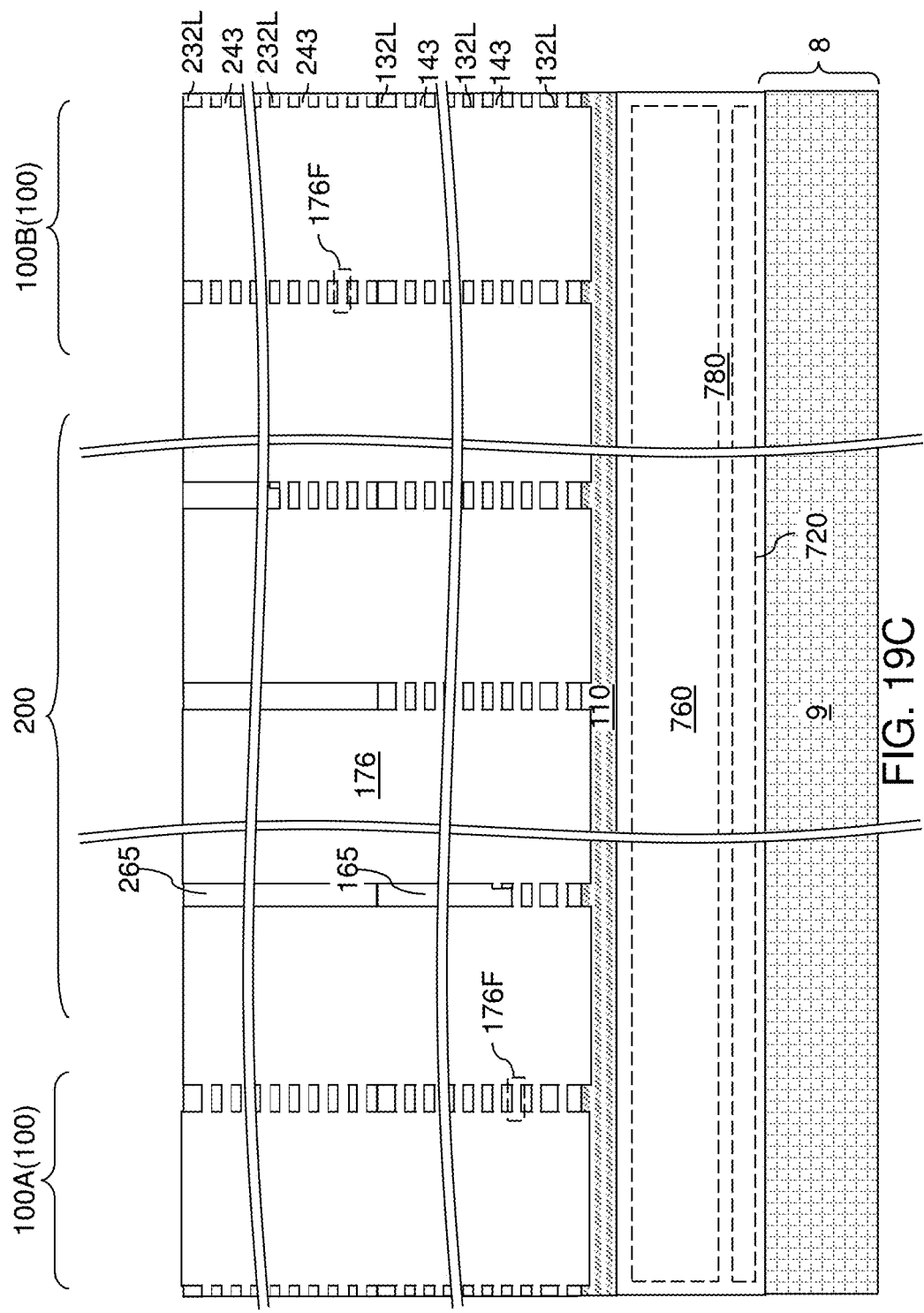
FIG. 19C is a vertical cross-sectional view of the first exemplary structure along the vertical plane C-C' of FIG. 19B.
Figure 19D:
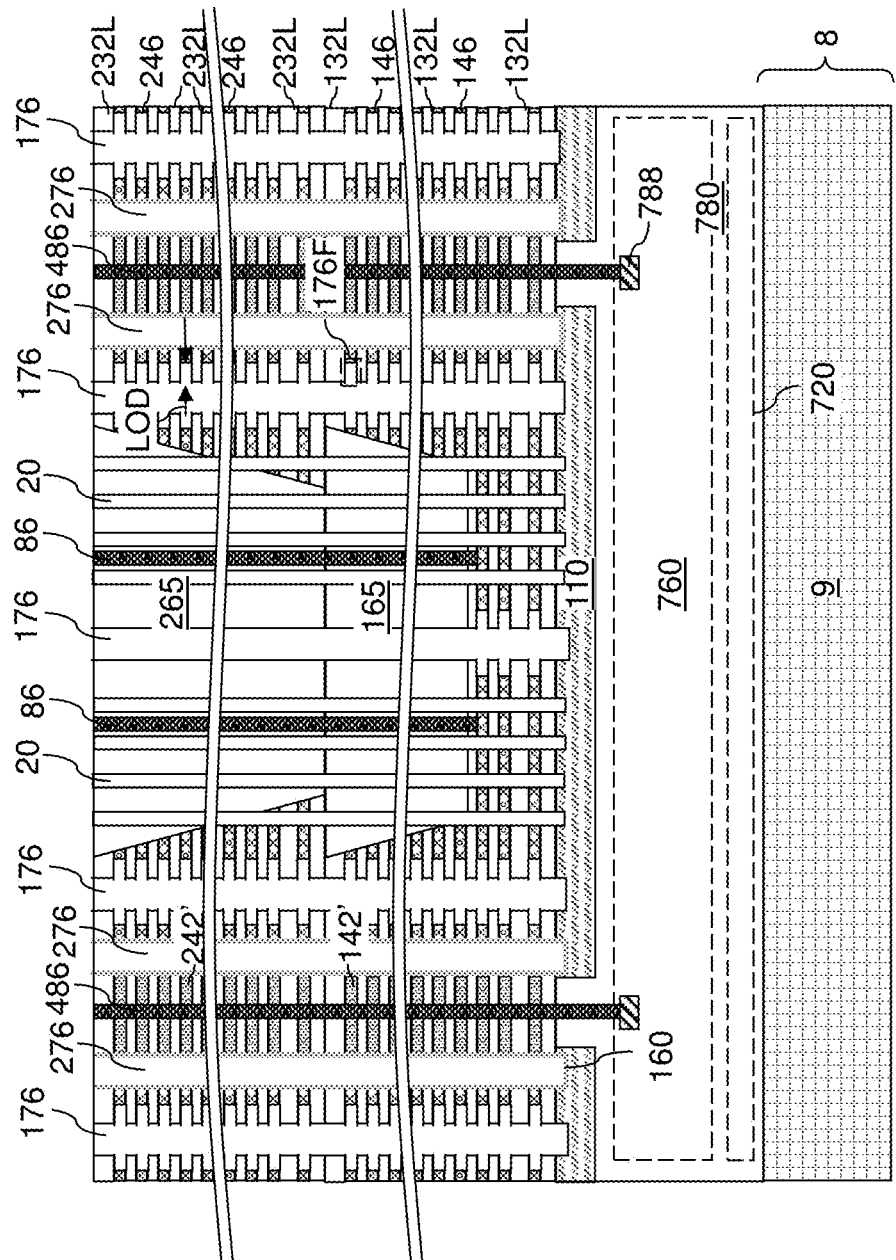
FIG. 19D is a vertical cross-sectional view of the first exemplary structure along the vertical plane D-D' of FIG. 19B.

In one embodiment shown in FIG. 19D, sidewalls of the dielectric fin portions 176F are laterally offset from sidewalls of the continuous insulating material layers (132L, 232L) by a same lateral offset distance LOD.

Figure 20:
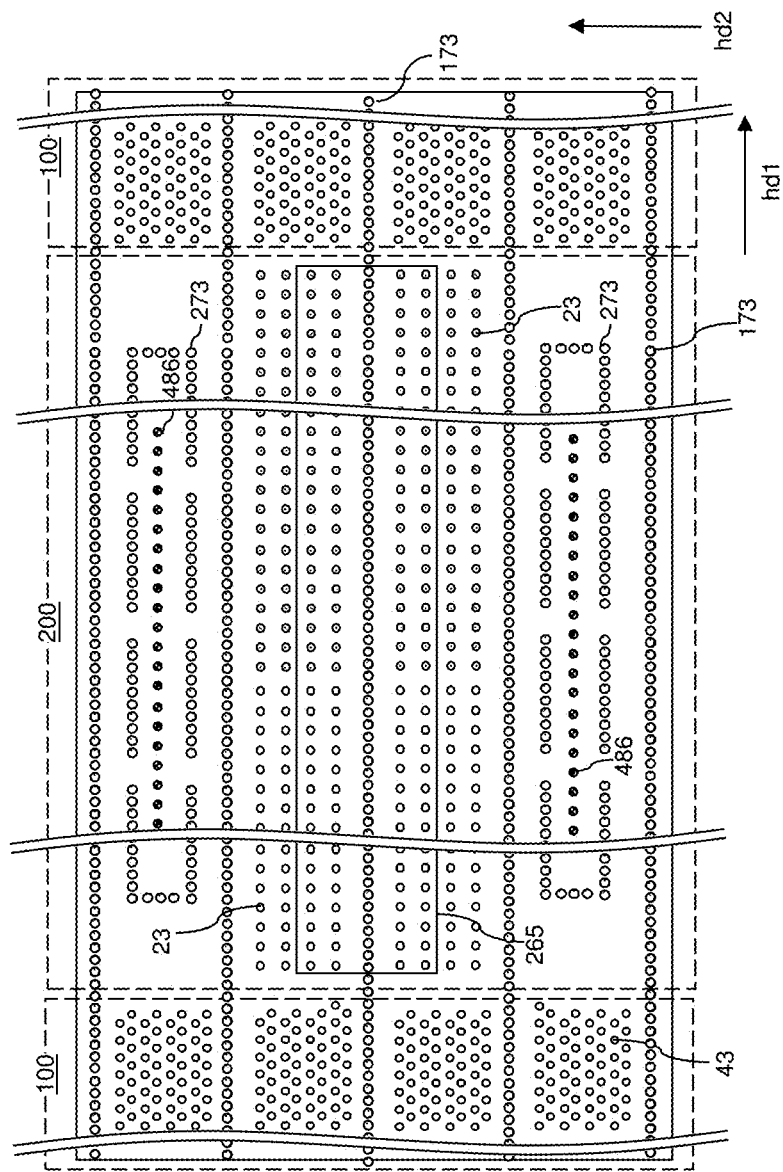
FIGS. 20, 21, 22 and 23 are top-down views of a second exemplary structure during the steps of forming the second exemplary structure according to the second embodiment of the present disclosure.

Referring to FIG. 20, a second exemplary structure according to second embodiment of the present disclosure is illustrated after formation of second-tier openings (43, 23, 173, 273, 473). The second exemplary structure may be derived from the first exemplary structure of FIGS. 8A-8D of the first embodiment by changing the spacing of the first and second tier backside openings (171, 173) such that these openings are formed with the same nearest neighbor distance (i.e., same pitch) from each other along the first horizontal direction (e.g., word line direction) hd1, rather than in clusters which are spaced apart by the larger inter-cluster distance along the first horizontal direction (in contrast to the first exemplary structure).

In the second embodiment, the first and second tier moat-region openings (271, 273) may be formed in clusters as in the first embodiment, such that these openings in each cluster have the same nearest neighbor distance (i.e., same pitch) from each other along the first horizontal direction (e.g., word line direction) hd1, and the clusters are spaced apart in the first horizontal direction hd1 by the larger inter-cluster distance, as in the first exemplary structure. Alternatively, the first and second tier moat-region openings (271, 273) may be formed with the same nearest neighbor distance (i.e., same pitch) from each other along the first horizontal direction (e.g., word line direction) hd1, rather than in clusters which are spaced apart by the larger inter-cluster distance along the first horizontal direction. Furthermore, in one aspect of the second embodiment, the through-memory-level connection via structures 486 may be formed earlier in the process or at the step of FIG. 20, such that they are present at the completion of the step shown in FIG. 20.

Figure 21:
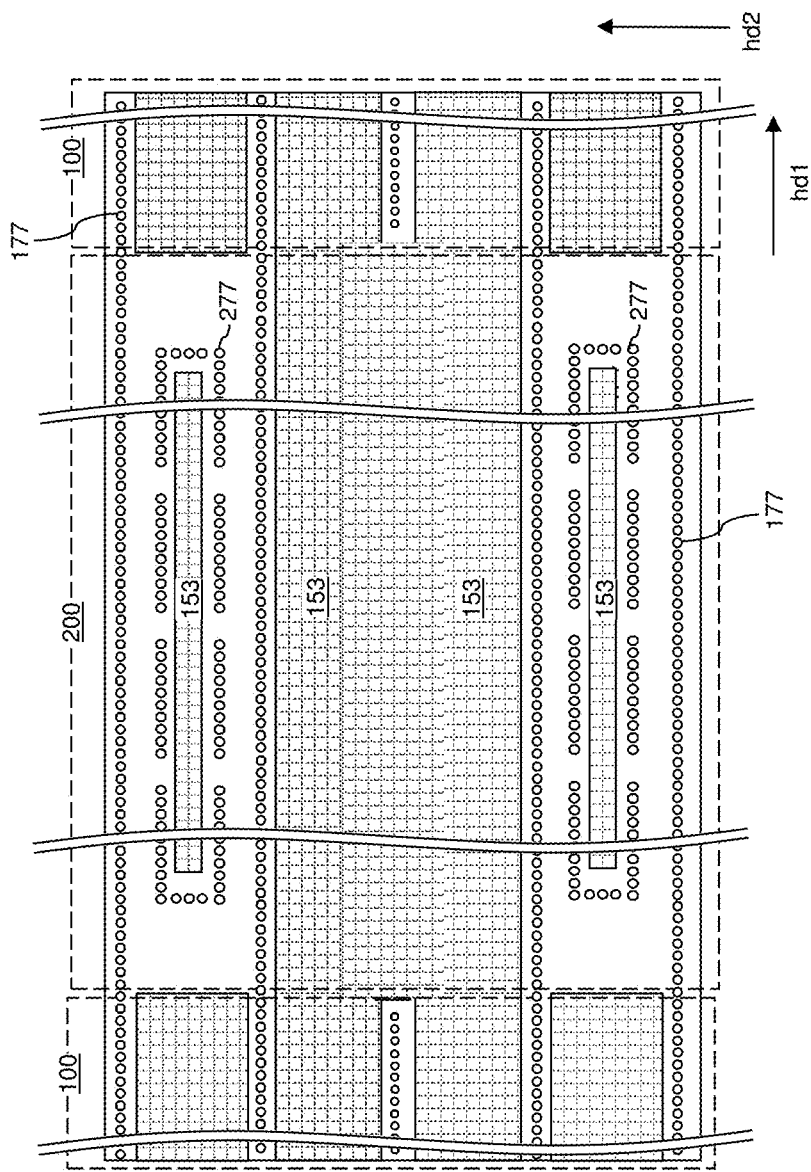

Referring to FIG. 21, the processing steps of FIGS. 9A-13D can be performed with any needed changes to accommodate changes in the patterns of the various openings through the continuous insulating layers (132L, 232L) and the continuous sacrificial material layers (142L, 242L). Support pillar structures 20, memory opening fill structures 58, backside openings 177, and the moat-region openings 277 can be formed.

In the second embodiment, the backside openings 177 are formed with the same nearest neighbor distance (i.e., same pitch) from each other along the first horizontal direction (e.g., word line direction) hd1, rather than in clusters which are spaced apart by the larger inter-cluster distance along the first horizontal direction (in contrast to the first exemplary structure).

In the second embodiment, the moat-region openings 277 may be formed in clusters as in the first embodiment, such that these openings in each cluster have the same nearest neighbor distance (i.e., same pitch) from each other along the first horizontal direction (e.g., word line direction) hd1, and the clusters are spaced apart in the first horizontal direction hd1 by the larger inter-cluster distance, as in the first exemplary structure. Alternatively, the moat-region openings 277 may be formed with the same nearest neighbor distance (i.e., same pitch) from each other along the first horizontal direction (e.g., word line direction) hd1, rather than in clusters which are spaced apart by the larger inter-cluster distance along the first horizontal direction.

In the second embodiment, the pattern of an etch mask layer (such as the third photoresist layer 153) can be modified such that the third photoresist layer 153 does not cover a first subset of the backside openings 177 which is located in the inter-array region 200 between two staircase regions (e.g., between the steps and the retro-stepped dielectric regions (165, 265)) along the second horizontal direction (e.g., bit line direction) hd2. However, the third photoresist layer 153 does not cover the rest of the backside openings 177 and the moat-region openings 277. Thus, all backside openings 177 located in the memory array regions 100 (including those openings 177 located in the same row along the first horizontal direction hd1 as the covered backside openings 177) are not covered by the third photoresist layer 153. Likewise, the remaining backside openings 177 located in the inter-array region 200 that are not located between two staircase regions along the second horizontal direction hd2 (e.g., located adjacent to the moat-region openings 277) are not covered by the third photoresist layer 153. The third photoresist layer 153 also covers the support pillar structures 20, memory opening fill structures 58, and the through-memory-level connection via structures 486.

Figure 22:
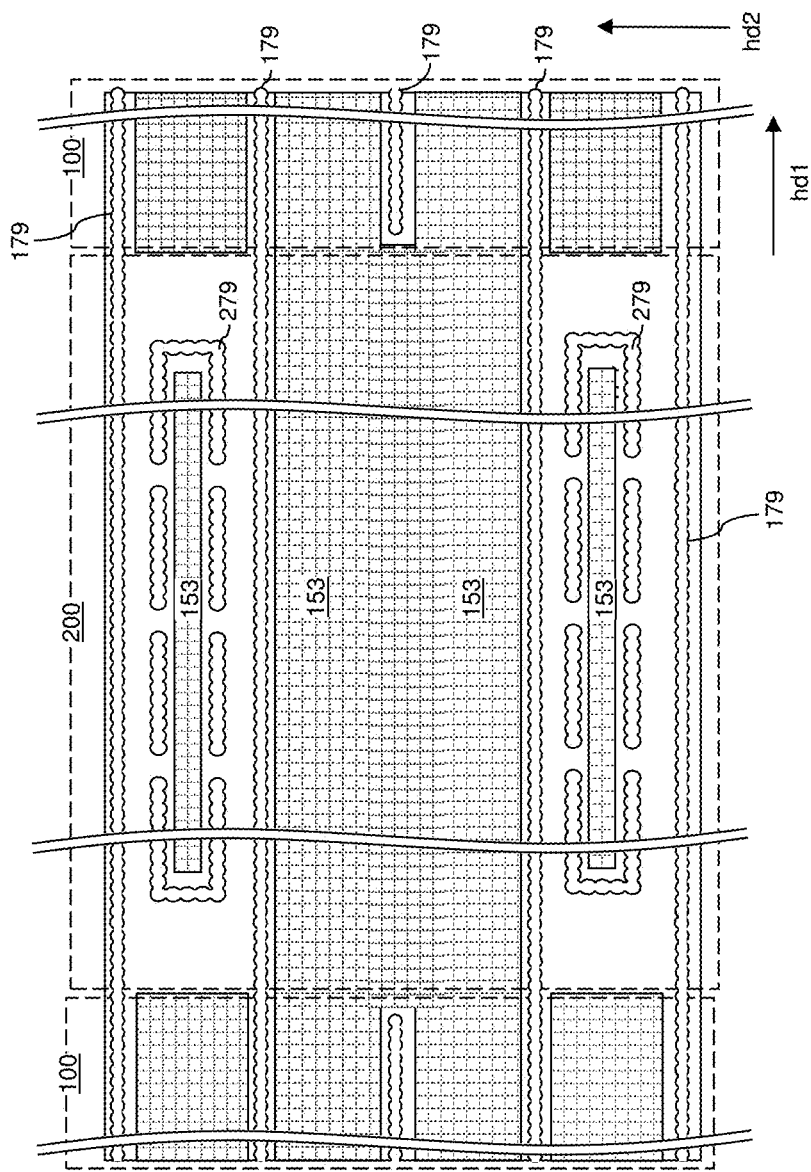

Referring to FIG. 22, the processing steps of FIGS. 14A-14D can be performed to merge the uncovered backside openings 177 by widening the uncovered backside openings 177 to form respective backside trenches 179. The backside trenches 179 are formed in the memory array regions 100 and in the inter-array region 200 in rows that are not located between two staircase regions along the second horizontal direction hd2. The uncovered moat-region openings are also optionally merged (i.e., connected to each other) by widening the moat-region openings 277. The moat-region trenches 279 may also be formed as in the first embodiment. The backside openings 177 that are covered by the third photoresist layer 153 are not merged into backside trenches 179. The third photoresist layer 153 can be removed, for example, by ashing.

Figure 23:
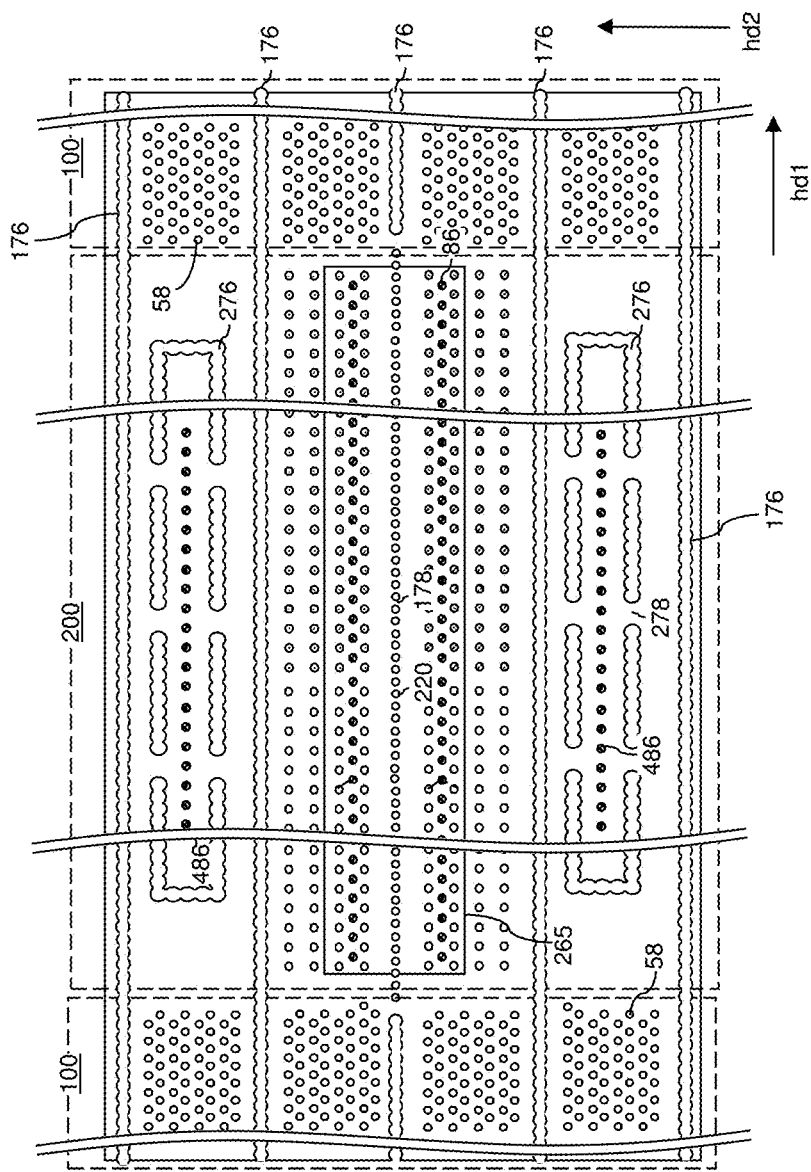

Referring to FIG. 23, the processing steps of FIGS. 15A-19D can be performed as described above with respect to the first embodiment. The continuous dielectric wall structures 176 are formed in the backside trenches 179 and dielectric moat trench fill structures 276 are formed in the moat trenches 279, as in the first embodiment. Dielectric pillar structures 220 are formed in the discrete backside openings 177 which are located in the inter-array region 200 between two staircase regions along the second horizontal direction hd2 as the same time as the continuous dielectric wall structures 176 by filling the discrete backside openings 177 with the same insulating material as the backside trenches 179 during the same deposition step.

The backside bridge regions 178 are located between the dielectric pillar structures 220 separated in the first horizontal direction hd1 in the inter-array region 200 between two staircase regions along the second horizontal direction hd2. The backside bridge regions 178 may be omitted in the memory array regions 100 and in the inter-array region 200 where the continuous dielectric wall structures 176 are not located between two staircase regions along the second horizontal direction hd2. The moat-region bridge regions 278 may either be present between the moat trenches 279 as in the first embodiment or may be omitted.

Figure 24:
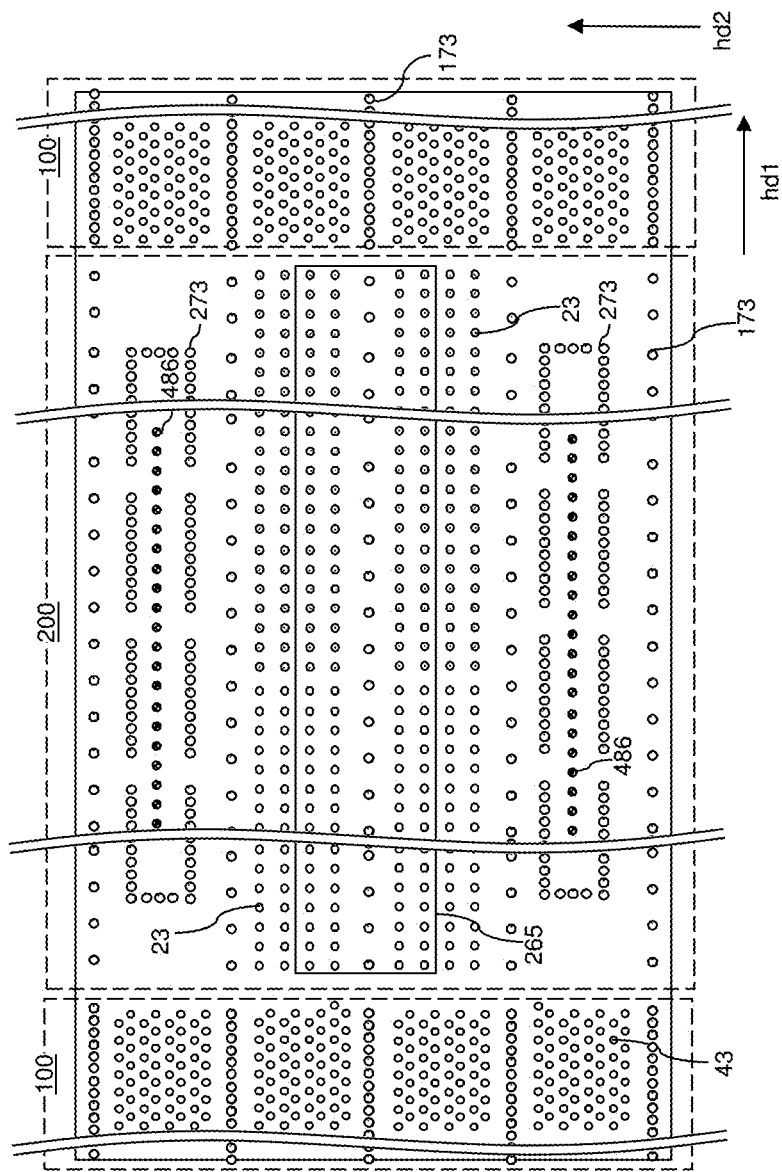
FIGS. 24, 25, and 27 are top-down views

Referring to FIG. 24, a third exemplary structure according to a third embodiment of the present disclosure is illustrated after formation of second-tier openings (43, 23, 173, 273, 473). The third exemplary structure may be derived from the first exemplary structure of FIGS. 8A-8D of the first embodiment by changing the spacing of the first and second tier backside openings (171, 173) such that these openings are formed with the first nearest neighbor distance (i.e., same first pitch) from each other along the first horizontal direction (e.g., word line direction) hd1 in the memory array regions 100, and with the second nearest neighbor distance (i.e., same second pitch) from each other along the first horizontal direction (e.g., word line direction) hd1 in the inter-array region 200. The second nearest neighbor distance is greater than the first nearest neighbor distance.

In the third embodiment, the first and second tier moat-region openings (271, 273) may be formed in clusters as in the first embodiment, such that these openings in each cluster have the same nearest neighbor distance (i.e., same pitch) from each other along the first horizontal direction (e.g., word line direction) hd1, and the clusters are spaced apart in the first horizontal direction hd1 by the larger inter-cluster distance, as in the first exemplary structure. Alternatively, the first and second tier moat-region openings (271, 273) may be formed with the same second nearest neighbor distance from each other along the first horizontal direction (e.g., word line direction) hd1 as the backside openings (171, 173) in region 200, rather than in clusters which are spaced apart by the larger inter-cluster distance along the first horizontal direction. Furthermore, in one aspect of the second embodiment, the through-memory-level connection via structures 486 may be formed earlier in the process or at the step of FIG. 24, such that they are present at the completion of the step shown in FIG. 24.

Figure 25:
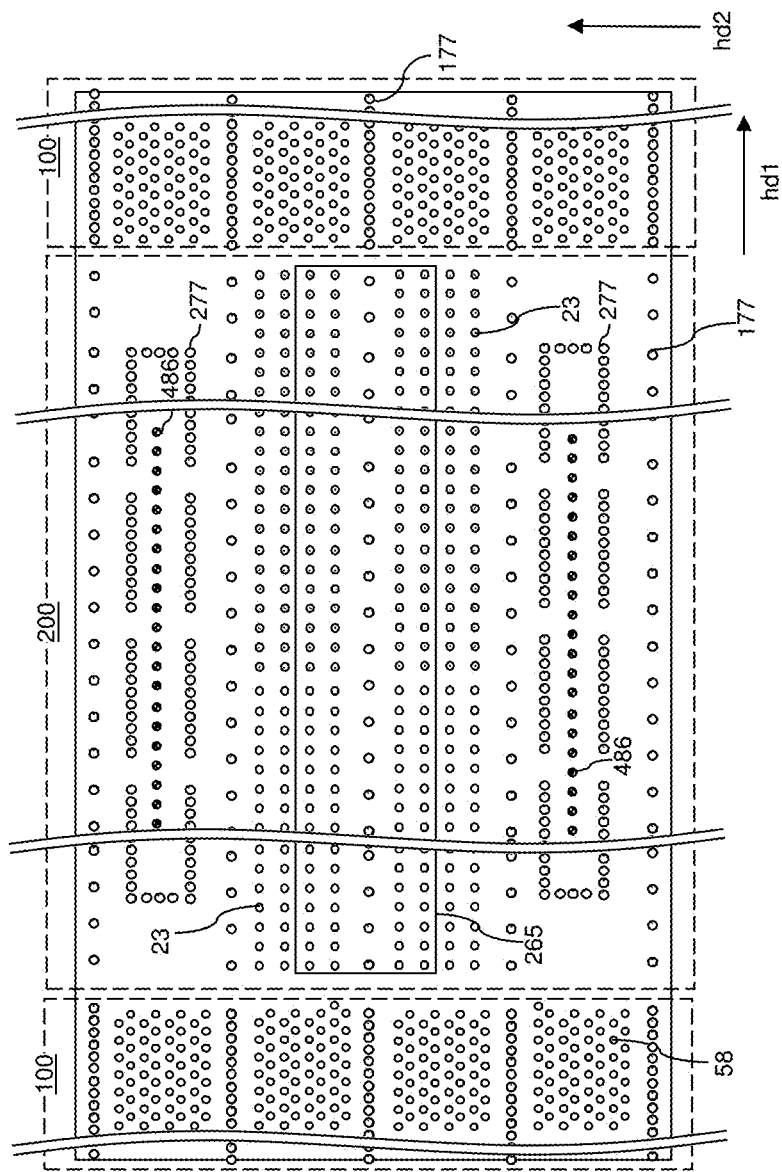

Referring to FIG. 25, the processing steps of FIGS. 9A-13D can be performed with any needed changes to accommodate changes in the patterns of the various openings through the continuous insulating layers (132L, 232L) and the continuous sacrificial material layers (142L, 242L). Support pillar structures 20, memory opening fill structures 58, backside openings 177, and the moat-region openings 277 can be formed.

In the third embodiment, the backside openings 177 are formed with the first nearest neighbor distance (i.e., same first pitch) from each other along the first horizontal direction (e.g., word line direction) hd1 in the memory array regions 100, and with the second nearest neighbor distance (i.e., same second pitch) from each other along the first horizontal direction (e.g., word line direction) hd1 in the inter-array region 200. The second nearest neighbor distance is greater than the first nearest neighbor distance.

In the third embodiment, the moat-region openings 277 may be formed in clusters as in the first embodiment, such that these openings in each cluster have the same nearest neighbor distance (i.e., same pitch) from each other along the first horizontal direction (e.g., word line direction) hd1, and the clusters are spaced apart in the first horizontal direction hd1 by the larger inter-cluster distance, as in the first exemplary structure. Alternatively, the moat-region openings 277 may be formed with the same second nearest neighbor distance (i.e., same pitch) from each other along the first horizontal direction (e.g., word line direction) hd1, rather than in clusters which are spaced apart by the larger inter-cluster distance along the first horizontal direction.

Referring to FIG. 26A, surfaces of the continuous insulating layers (132L, 232L) laterally recessed around the backside openings 177 and optionally around the moat-trench openings 277 relative to the sacrificial material layers (142L, 242L). This step is performed instead of the etching step described above with respect to FIGS. 14A to 14D of the first embodiment. Surfaces of the continuous insulating layers (132L, 232L) are laterally recessed around the backside openings 177 by greater than one half of the first nearest neighbor distance, but less than one half of the second nearest neighbor distance.

Referring to FIG. 26B, the sacrificial material layers (142L, 242L) are selectively removed by selective etching to form the backside recesses (143, 243), as described above with respect to FIGS. 16A-16D of the first embodiment. The backside openings 177 in the memory array regions 100 are merged into the backside trenches 179 since the backside openings 177 are widened by greater than one half of the first nearest neighbor distance of such backside openings 177 in the step of FIG. 26A. However, the backside openings 177 in the inter-array region 200 remain a discrete widened openings separated by the backside bridge regions 178, and are not are merged into the backside trenches 179 since the backside openings 177 are widened by less than one half of the second nearest neighbor distance of such backside openings in the step of FIG. 26A.

Thus, in the third embodiment, only the continuous insulating layers (132L, 232L) are laterally recessed selectively to the sacrificial material layers (142L, 242L) followed by removal of the sacrificial material layers to expand the backside openings 177. This method of expanding the backside openings and forming the backside trenches 179 may also be used in the alternative configurations of the first and second embodiments.

Figure 27:
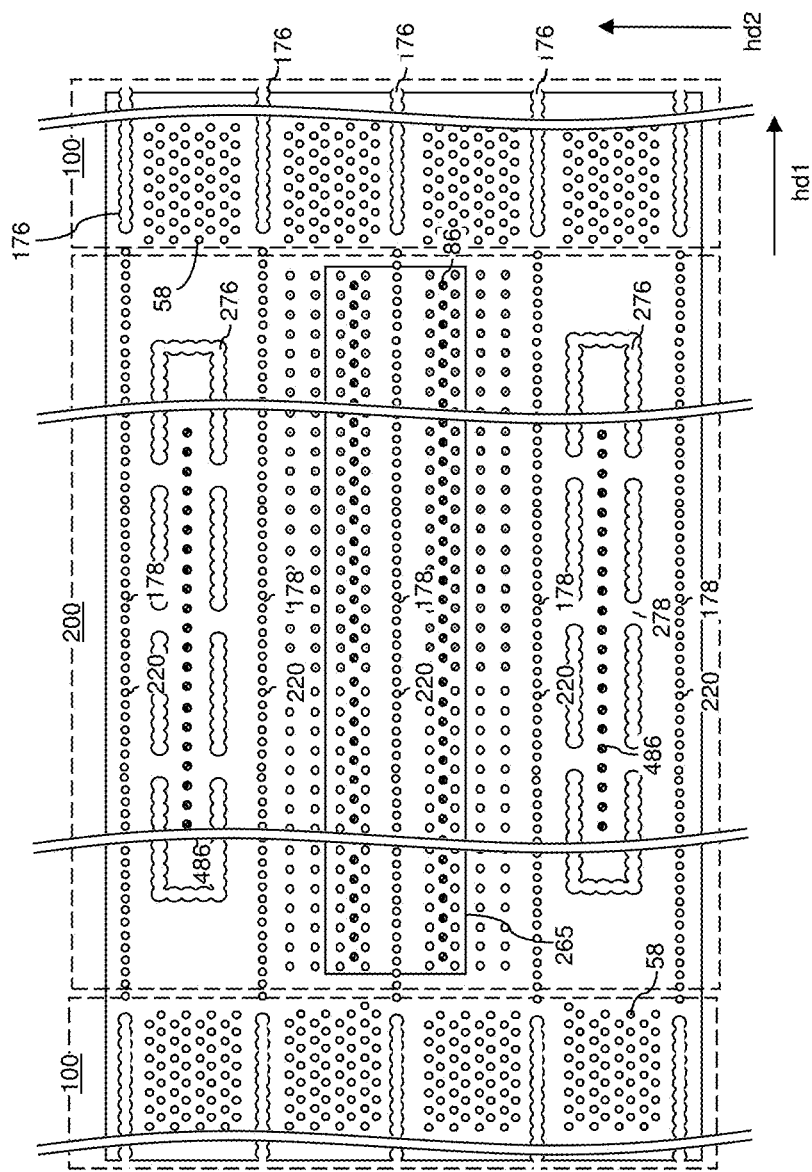

Referring to FIG. 27, the processing steps of FIGS. 16A-19D can be performed as described above with respect to the first embodiment. The continuous dielectric wall structures 176 are formed in the backside trenches 179 in the memory array regions 100, and dielectric moat trench fill structures 276 are formed in the moat trenches 279, as in the first embodiment. Dielectric pillar structures 220 are formed in the discrete backside openings 177 which are located in the inter-array region 200 as the same time as the continuous dielectric wall structures 176 by filling the discrete backside openings 177 with the same insulating material as the backside trenches 179 during the same deposition step.

The backside bridge regions 178 are located between the dielectric pillar structures 220 separated in the first horizontal direction hd1 in the inter-array region 200. The backside bridge regions 178 may be omitted in the memory array regions 100. The moat-region bridge regions 278 may either be present between the moat trenches 279 as in the first embodiment or may be omitted.

Figure 28:
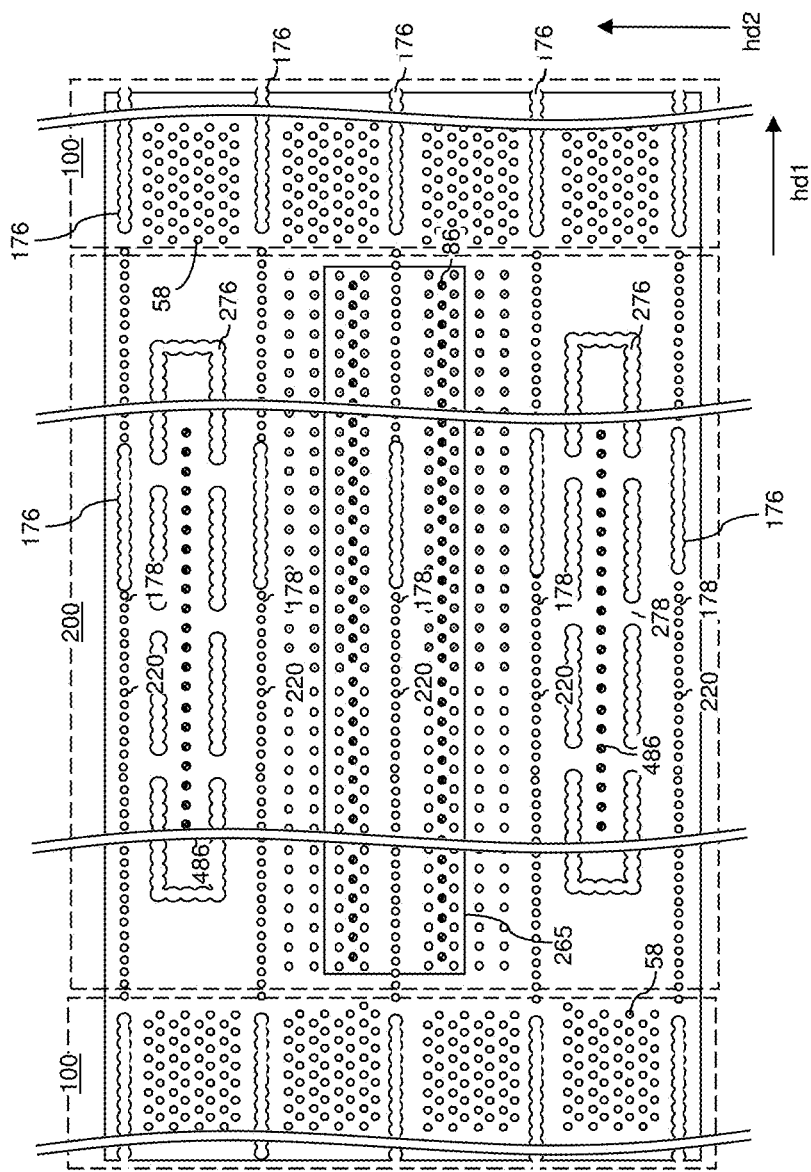
FIG. 28 is a top-down view of an alternative configuration of the third exemplary structure according to the third embodiment of the present disclosure.

FIG. 28 illustrates an alternative configuration of the third exemplary structure of the third embodiment. In this configuration, a first set of the backside openings 177 in the inter-array region 200 are spaced apart by the first nearest neighbor distance, while a second set of the backside openings in the inter-array region 200 are spaced apart by the second nearest neighbor distance at the step of FIG. 25. During the etching steps of FIGS. 26A and 26B, the first set of the backside openings 177 in the inter-array region 200 are merged into backside trenches 179, while the second set of the backside openings 177 in the inter-array region 200 remain as discrete openings separated by the backside bridge structures 178.

Figure 29:
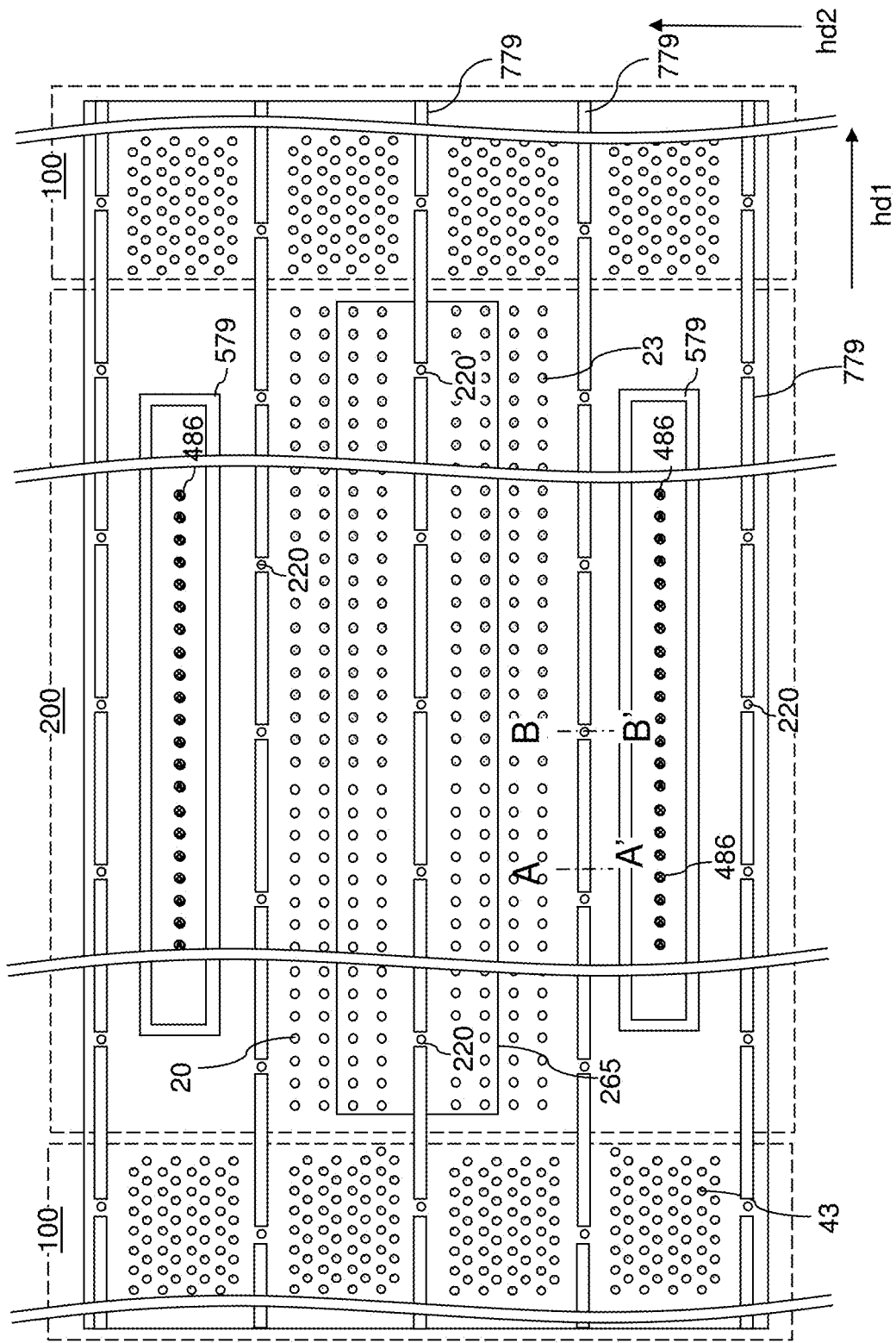
FIG. 29 is a top-down view of the in-process fourth exemplary structure according to the fourth embodiment of the present disclosure.

Referring to FIG. 29, a fourth exemplary structure according to the fourth embodiment of the present disclosure is illustrated at a processing step that corresponds to a processing step in FIGS. 15A-15D. The fourth exemplary structure can be derived from the first exemplary structure by forming elongated openings as a first subset of the first-tier backside openings and discrete openings as a second subset of the backside openings. The discrete openings may have circular, rectangular or elliptical horizontal cross-section shape. The discrete openings are located in the inter-array region 200 and may optionally be located in the memory array regions 100. The elongated openings comprise backside trenches 779 having a respective pair of lengthwise sidewalls that laterally extend along the first horizontal direction hd1. The backside trenches 779 may have a respective horizontal cross-sectional shape of a rectangle or a rounded rectangle. In one embodiment, the elongated openings (i.e., backside trenches) 779 and the discrete openings may laterally alternate along the first horizontal direction hd1. Each discrete opening can be laterally spaced from an adjacent one of the elongated openings. Alternatively, the first and second tier backside openings may have the same shape as in the first embodiment to form the backside trenches 179 with convex sidewalls of the first embodiment.

Optionally, moat-region openings may be replaced with moat trenches 579 having straight inner sidewalls. Alternatively, the moat trenches 279 of the first embodiment may be formed instead.

In the fourth embodiment, the support pillar structures 20 are formed in the memory openings 49 and the dielectric pillar structures 220 of the second embodiment are formed in the discrete openings at the step of FIG. 29. The dielectric pillar structures 220 are located in the inter-array region 200 and may optionally be located in the memory array regions 100. Alternatively, the dielectric pillar structures 220 may be omitted from the memory array regions 100. Furthermore, in one aspect of the fourth embodiment, the through-memory-level connection via structures 486 may be formed earlier in the process or at the step of FIG. 29, such that they are present at the completion of the step shown in FIG. 29.

FIGS. 30A and 30B show vertical cross-sectional views along respective planes A-A' and B-B' of FIG. 29. As shown in FIG. 30B, the dielectric pillar structures 220 are located between adjacent backside trenches 779 spaced apart along the first horizontal direction hd1. Thus, the dielectric pillar structures 220 are located in the regions which will subsequently form the backside bridge regions 178.

Referring to FIGS. 31A and 31B, the steps of FIGS. 16A-16D are performed to form the backside recesses (143, 243) by removing the sacrificial material layers (142L, 242L) through the backside trenches 779. Then, the steps of FIGS. 17A-17D are performed by forming an electrically conductive layer 46 in the backside recesses (143, 243) and in the backside trenches 779.

Referring to FIGS. 32A and 32B, the electrically conductive layers 46 are moved from the backside trenches 779 by etching. The electrically conductive layers 46 are then recessed in the backside trenches 779 relative to the insulating material layers (132L, 232L). This forms additional recesses 343 at the levels of the electrically conductive layers 46 in the backside trenches 779. The recessing may be performed by a selective isotropic etching process. As shown in FIG. 32B, the additional recesses 343 surround the dielectric pillar structures 220.

Referring to FIGS. 33A and 33B, metal portions 46A are selectively grown in the additional recesses 343 to form the electrically conductive layers (146, 246) described in the previous embodiments. The metal portions 46A may be grown by a selective deposition process, such as selective metal ALD or MOCVD from sidewalls of the electrically conductive layers 46 exposed in the additional recesses 343. The metal may comprise tungsten or another suitable metal. The additional recesses remain in the backside bridge regions 178 surrounding the dielectric pillar structures 220.

Referring to FIGS. 34A and 34B, a dielectric liner 176L is formed in the backside trenches 779. The dielectric liner 176L may comprise a silicon oxide layer or another dielectric layer. The dielectric liner 176L fills the additional recesses 343 through the backside trenches 779 to form the dielectric fin portions 176F in the backside bridge regions 178. The dielectric fin portions 176F are located on the sidewall(s) of the dielectric pillar structures 220 in the backside bridge regions 178.

Figure 35:
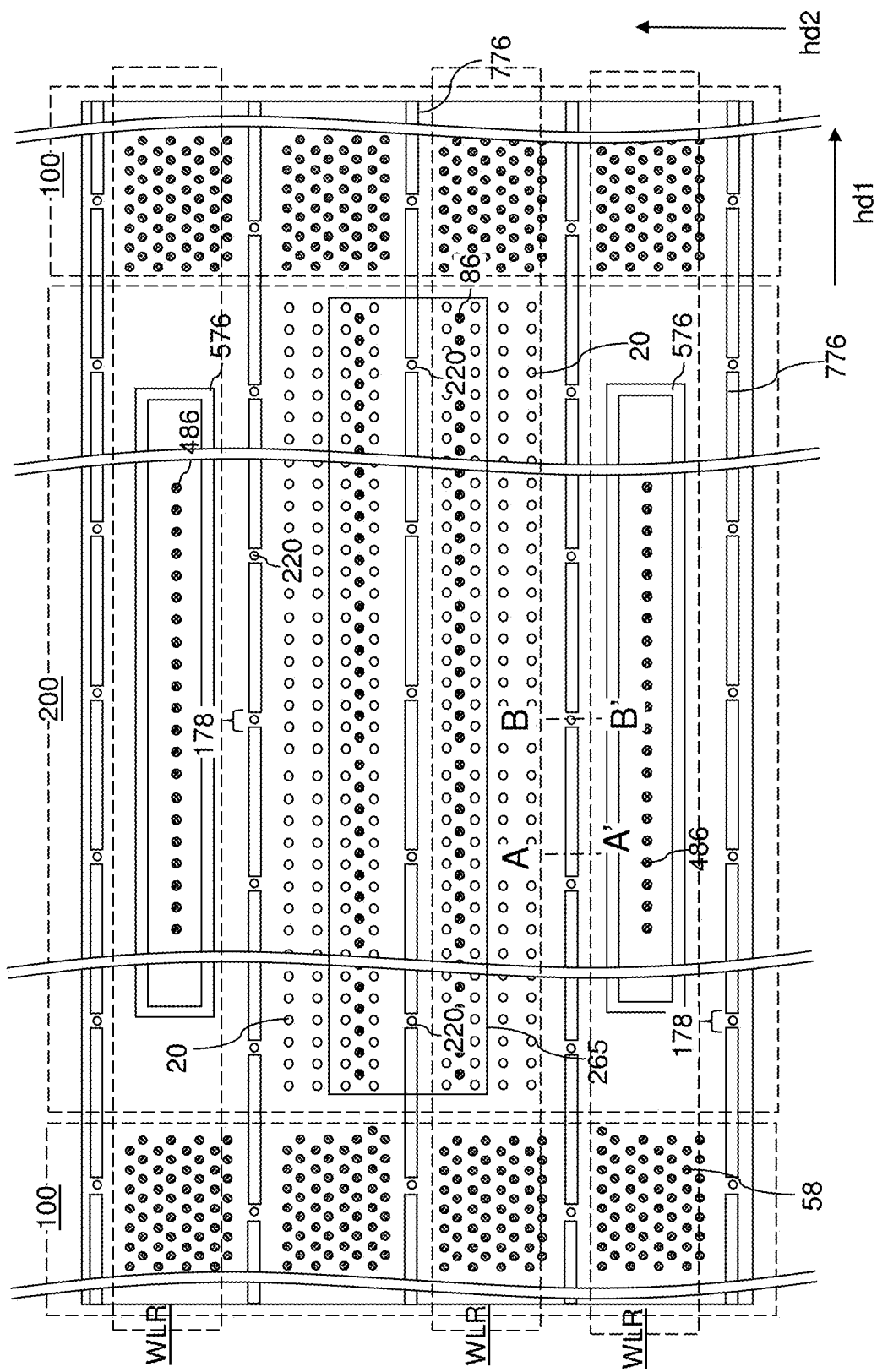
FIG. 35 is a top-down view of the fourth exemplary structure according to the fourth embodiment of the present disclosure.

FIG. 35 shows the top down view of the structure after the continuous dielectric wall structures 776 are formed in the backside trenches 779 of FIGS. 34A and 34B. The structure of FIGS. 34A and 34B is located along the planes A-A' and B-B' in FIG. 35 respectively. Dielectric moat trench fill structures 576 are also formed in the moat trenches 579.

Figure 37:
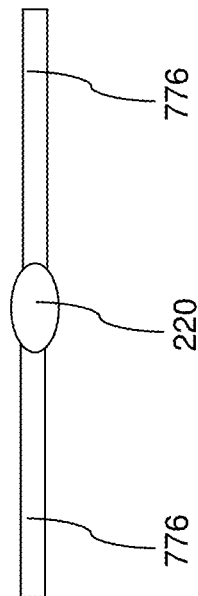
FIGS. 36 and 37 are top-down views of alternative configurations of a portion of the fourth exemplary structure according to the fourth embodiment of the present disclosure.
Figure 36:
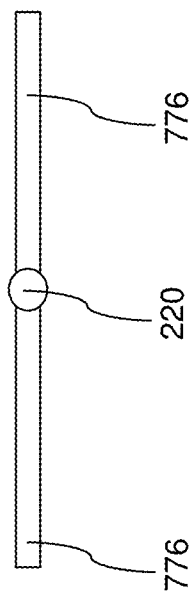

In one alternative configuration of the fourth embodiment shown in FIG. 36, the backside trenches 779 may be located closer together than in FIG. 35, such that the dielectric pillar structure 220 contacts the dielectric wall structures 776. In another alternative configuration of the fourth embodiment shown in FIG. 37, the dielectric pillar structure 220 may be laterally extended along the first horizontal direction hd1 such that it contacts the dielectric wall structures 776.

Figure 38:
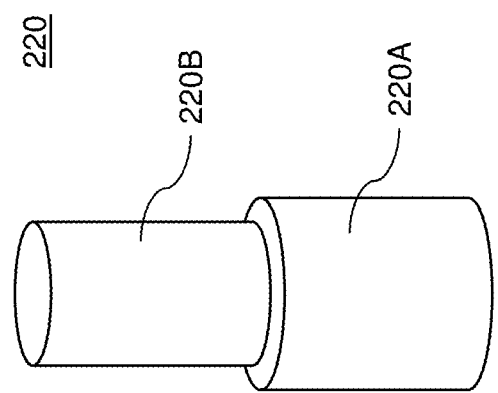
FIG. 38 is a perspective view of an alternative configuration of a dielectric pillar structure of the fourth exemplary structure according to the fourth embodiment of the present disclosure.

In another alternative configuration of the fourth embodiment shown in FIG. 38, the lower portion 220A of the dielectric pillar structure 220 may have a larger horizontal width (e.g., diameter) than the upper portion 220A of the same dielectric pillar structure. The lower portion 220A of the dielectric pillar structure 220 may extend through the first alternating stack (132L, 146), while the upper portion 220B of the dielectric pillar structure 220 may extend through the second alternating stack (232L, 246).

Referring to various drawings of the present disclosure and according to various embodiments of the present disclosure, a three-dimensional memory device includes a first word-line region WLR including a first alternating stack of first word lines (146, 246) and continuous insulating layers (132L, 232L), first memory stack structures 55 vertically extending through the first alternating stack, a second word-line region WLR comprising a second alternating stack of second word lines (146, 246) and the continuous insulating layers (132L, 232L), second memory stack structures 55 vertically extending through the second alternating stack, plural dielectric separator structures (176, 220, 776) located between the first word-line region and the second word-line region, and at least one bridge region 178 located between the plural dielectric separator structures and between the between the first word-line region and the second word-line region. The continuous insulating layers (132L, 232L) extend through the at least one bridge region 178 between the first alternating stack in the first word-line region and the second alternating stack in the second word-line region.

In some embodiments, the first word lines in the first alternating stack do not electrically contact the second word lines in the second alternating stack. In some embodiments, the device also includes dielectric fin portions 176F of the plural dielectric separator structures (176, 776), wherein the dielectric fin portions are located at levels of the first and second word lines (146, 246) between the continuous insulating layers in the at least one bridge region 178. In some embodiments, the at least one bridge region 178 comprises a third alternating stack of the continuous insulating layers (132L, 232L) and the dielectric fin portions 176F, and no word lines (146, 246) are located between the continuous insulating layers in the at least one bridge region.

In the fourth embodiment, a dielectric pillar structure 220 extends through the at least one bridge region 178. The dielectric fin portions 176F contact the dielectric pillar structure 220.

In some embodiments, the first word-line region WLR comprises a first memory block and the second word-line region WLR comprises a second memory block different from the first memory block.

In some embodiments, the first alternating stack extends along a word line direction hd1, the second alternating stack extends along the word line direction hd1, the first alternating stack is spaced apart from the second alternating stack along a bit line direction hd2 which is perpendicular to the word line direction, the plural dielectric separator structures are located in a row extending in the word line direction between the first and the second alternating stacks, and the at least one bridge region 178 is located between the plural dielectric separator structures in the row which extends in the word line direction and between the first and the second alternating stacks in the bit line direction.

In some embodiments, the plural dielectric separator structures comprise plural continuous dielectric wall structures (176, 776) which extend in the word line direction hd1.

In the first through third embodiments, each of the plural continuous dielectric wall structures 176 comprises a pair of laterally undulating sidewalls that generally extend along the word line direction hd1 and having a lateral undulation along the bit line direction hd2, and comprising multiple vertically straight and laterally convex sidewall segments that are adjoined to each other and that extend from a first horizontal plane including top surfaces of the first and the second alternating stack to a second horizontal plane including a bottom surfaces of the first and the second alternating stack.

In the first through third embodiments, each of the first word lines (146, 246) is located between a respective pair of the continuous dielectric wall structures 176 of the plurality continuous dielectric wall structures that are spaced apart along the bit line direction hd2, and contacts each of the respective pair of continuous dielectric wall structures at the plurality of vertically straight and laterally convex sidewall segments.

In the second and third embodiments, the at least one bridge region 178 comprises a plurality of bridge regions 178 which are spaced apart along the word line direction hd1, and the plural dielectric separator structures comprise plural dielectric pillar structures 220 spaced apart by the plurality of bridge regions along the word line direction.

In the second and third embodiments, the plural dielectric separator structures comprise the plural dielectric pillar structures 220 and plural continuous dielectric wall structures 176 spaced apart by the plurality of bridge regions 178 along the word line direction.

In some embodiments, the device includes first and second memory array regions 100 separated by a first inter-array region 200 in the first word-line region WLR, wherein the first memory stack structures 55 are located in the first and the second memory array regions, third and fourth memory array regions 100 separated by a second inter-array region 200 in the second word-line region WLR, wherein the second memory stack structures 55 are located in the third and the fourth memory array regions, a first staircase region of the first alternating stack located in the first inter-array region 200, first word line contact via structures 86 contacting the first word lines (146, 246) in the first staircase region, a second staircase region of the second alternating stack located in the second inter-array region 200, and second word line contact via structures 86 contacting the second word lines (146, 246) in the second staircase region.

In the second and third embodiments, the plurality of continuous dielectric wall structures 176 are located between the first memory array region and the third memory array region in the bit line direction hd2, and between the second memory array region and the fourth memory array region in the bit line direction, and the plurality of dielectric pillar structures 220 and the plurality of bridge regions 178 are located between the first staircase region and the second staircase region.

In the second and third embodiments, no bridge regions 178 are located between the memory array regions 100 of adjacent word-line regions WLR.

In one embodiment, the device also includes a first alternating dielectric material plate stack (132L, 142', 232L, 242') laterally surrounded by a first dielectric moat trench fill structure (276, 576), and first conductive via structures 486 extending through the first alternating dielectric material plate stack to peripheral circuitry 720 located below the first alternating dielectric material plate stack, and a second alternating dielectric material plate stack (132L, 142', 232L, 242') laterally surrounded by a second dielectric moat trench fill structure (276, 576), and second conductive via structures 486 extending through the second alternating dielectric material plate stack to the peripheral circuitry 720 located below the second alternating dielectric material plate stack.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
a first word-line region comprising a first alternating stack of first word lines and continuous insulating layers;
first memory stack structures vertically extending through the first alternating stack;
a second word-line region comprising a second alternating stack of second word lines and the continuous insulating layers;
second memory stack structures vertically extending through the second alternating stack;
plural dielectric separator structures located between the first word-line region and the second word-line region;
at least one bridge region located between the plural dielectric separator structures and between the between the first word-line region and the second word-line region;
a first alternating dielectric material plate stack laterally surrounded by a first dielectric moat trench fill structure, and first conductive via structures extending through the first alternating dielectric material plate stack to peripheral circuitry located below the first alternating dielectric material plate stack; and
a second alternating dielectric material plate stack laterally surrounded by a second dielectric moat trench fill structure, and second conductive via structures extending through the second alternating dielectric material plate stack to the peripheral circuitry located below the second alternating dielectric material plate stack,
wherein the continuous insulating layers extend through the at least one bridge region between the first alternating stack in the first word-line region and the second alternating stack in the second word-line region.

2. The three-dimensional memory device of claim 1, wherein the first word lines in the first alternating stack do not electrically contact the second word lines in the second alternating stack.

3. The three-dimensional memory device of claim 2, further comprising dielectric fin portions of the plural dielectric separator structures, wherein the dielectric fin portions are located at levels of the first and second word lines between the continuous insulating layers in the at least one bridge region.

4. The three-dimensional memory device of claim 3, wherein:
the at least one bridge region comprises a third alternating stack of the continuous insulating layers and the dielectric fin portions; and
no word lines are located between the continuous insulating layers in the at least one bridge region.

5. The three-dimensional memory device of claim 3, further comprising a dielectric pillar structure extending through the at least one bridge region.

6. The three-dimensional memory device of claim 1, wherein the first word-line region comprises a first memory block and the second word-line region comprises a second memory block different from the first memory block.

7. The three-dimensional memory device of claim 1, wherein:

the first alternating stack extends along a word line direction;
the second alternating stack extends along the word line direction;
the first alternating stack is spaced apart from the second alternating stack along a bit line direction which is perpendicular to the word line direction;
the plural dielectric separator structures are located in a row extending in the word line direction between the first and the second alternating stacks; and
the at least one bridge region is located between the plural dielectric separator structures in the row which extends in the word line direction and between the first and the second alternating stacks in the bit line direction.

8. The three-dimensional memory device of claim 7, wherein the plural dielectric separator structures comprise plural continuous dielectric wall structures which extend in the word line direction.

9. The three-dimensional memory device of claim 8, wherein each of the plural continuous dielectric wall structures comprises a pair of laterally undulating sidewalls that generally extend along the word line direction and having a lateral undulation along the bit line direction, and comprising multiple vertically straight and laterally convex sidewall segments that are adjoined to each other and that extend from a first horizontal plane including top surfaces of the first and the second alternating stack to a second horizontal plane including a bottom surfaces of the first and the second alternating stack.

10. The three-dimensional memory device of claim 9, wherein each of the first word lines is located between a respective pair of the continuous dielectric wall structures of the plurality continuous dielectric wall structures that are spaced apart along the bit line direction, and contacts each of the respective pair of continuous dielectric wall structures at the plurality of vertically straight and laterally convex sidewall segments.

11. The three-dimensional memory device of claim 7, wherein:
the at least one bridge region comprises a plurality of bridge regions which are spaced apart along the word line direction; and
the plural dielectric separator structures comprise plural dielectric pillar structures spaced apart by the plurality of bridge regions along the word line direction.

12. The three-dimensional memory device of claim 11, wherein the plural dielectric separator structures comprise the plural dielectric pillar structures and plural continuous dielectric wall structures spaced apart by the plurality of bridge regions along the word line direction.

13. The three-dimensional memory device of claim 12, further comprising:
first and second memory array regions separated by a first inter-array region in the first word-line region, wherein the first memory stack structures are located in the first and the second memory array regions;
third and fourth memory array regions separated by a second inter-array region in the second word-line region, wherein the second memory stack structures are located in the third and the fourth memory array regions;
a first staircase region of the first alternating stack located in the first inter-array region;
first word line contact via structures contacting the first word lines in the first staircase region;
a second staircase region of the second alternating stack located in the second inter-array region; and second word line contact via structures contacting the second word lines in the second staircase region.

14. The three-dimensional memory device of claim 13, wherein:
the plurality of continuous dielectric wall structures are located between the first memory array region and the third memory array region in the bit line direction, and between the second memory array region and the fourth memory array region in the bit line direction; and
the plurality of dielectric pillar structures and the plurality of bridge regions are located between the first staircase region and the second staircase region.

15. The three-dimensional memory device of claim 14, wherein no bridge regions are located between the memory array regions of adjacent word-line regions.

16. A three-dimensional memory device, comprising:
a first word-line region comprising a first alternating stack of first word lines and continuous insulating layers;
first memory stack structures vertically extending through the first alternating stack;
a second word-line region comprising a second alternating stack of second word lines and the continuous insulating layers;
second memory stack structures vertically extending through the second alternating stack;
plural dielectric separator structures located between the first word-line region and the second word-line region; and
at least one bridge region located between the plural dielectric separator structures and between the between the first word-line region and the second word-line region,
wherein:
the continuous insulating layers extend through the at least one bridge region between the first alternating stack in the first word-line region and the second alternating stack in the second word-line region;
the first alternating stack extends along a word line direction;
the second alternating stack extends along the word line direction;
the first alternating stack is spaced apart from the second alternating stack along a bit line direction which is perpendicular to the word line direction;
the plural dielectric separator structures are located in a row extending in the word line direction between the first and the second alternating stacks;
the at least one bridge region is located between the plural dielectric separator structures in the row which extends in the word line direction and between the first and the second alternating stacks in the bit line direction;
the plural dielectric separator structures comprise plural continuous dielectric wall structures which extend in the word line direction; and
each of the plural continuous dielectric wall structures comprises a pair of laterally undulating sidewalls that generally extend along the word line direction and having a lateral undulation along the bit line direction, and comprising multiple vertically straight and laterally convex sidewall segments that are adjoined to each other and that extend from a first horizontal plane including top surfaces of the first and the second alternating stack to a second horizontal plane including a bottom surfaces of the first and the second alternating stack.

* * * * *